United States Patent [19]

Kimura

[11] Patent Number: 5,481,224

[45] Date of Patent: Jan. 2, 1996

[54] DIFFERENTIAL AMPLIFIER CIRCUIT HAVING A DRIVER WITH SQUARE-LAW CHARACTERISTIC

[75] Inventor: Katsuji Kimura, Tokyo, Japan

[73] Assignee: NEC Corporation, Tokyo, Japan

[21] Appl. No.: 187,387

[22] Filed: Jan. 27, 1994

[30] Foreign Application Priority Data

Jan. 27, 1993 [JP] Japan ................................. 5-011849
Dec. 15, 1993 [JP] Japan ................................. 5-315460

[51] Int. Cl.$^6$ ......................................................... H03F 3/45
[52] U.S. Cl. ............................................ 330/253; 330/261
[58] Field of Search .............................. 330/69, 149, 253, 330/261

[56] References Cited

U.S. PATENT DOCUMENTS 5,079,515  1/1992  Tanimoto ............................. 330/256

FOREIGN PATENT DOCUMENTS 3409470  9/1984  Germany.
4109893  10/1992  Germany.
1469546  3/1989  U.S.S.R. ............................. 330/253
2254211  9/1992  United Kingdom.

OTHER PUBLICATIONS

Peter Harz, "A Linearized Differential Amplifier", Frequenz Journal for Telecommunication, vol. 42, No. 4, Feb./Mar. 1988, pp. 117–120.
C. Toumazou et al., "Analogue I.D. design: the current–mode approach", pp. 182–185, Copyright 1990, Peter Peregrinus LTD.
A. Nedungadi et al., "Design of Linear CMOS Transconductance Elements", IEEE Transactions on Circuits and systems, vol. CAS–31, No. 10, Oct. 1984, pp. 891–894.
Katsuji Kimura, "Some Circuit Design Techniques . . . Rectifiers Operable on Low Supply Voltage", IEEE Trans. on Circuits and Systems–I: Fund. Theory & Applns., vol. 39, No. 9, Sep. 1992, pp. 771–777.
J. C. Schmoock, "An Input Stage Transconductance Reduction Technique . . . Amplifiers", IEEE Journal of Solid–State Circuits, vol. SC–10, No. 6, Dec. 1975. pp. 407–411.
K. Kimura, "An MOS Operational Transconductance Amplifier . . . Using the Quadritail Cell", IEICE Trans. Fundamentals, vol. E75–A, No. 12, Dec. 1992, pp. 1774–1776.
Wang et al., "A voltage–Controllable Linear MOS Transconductor Using Bias Offest Technique", IEEE Journal of Solid–State Circuits, vol. 25, No. 1, Feb. 1990, pp. 315–317.
Kimura, "Low Voltage Four–Quadrant Analog Multipliers", IEICE Trans. Electron., vol. E76–C, No. 5, May 1993, pp. 734–735.

Primary Examiner—James B. Mullins
Attorney, Agent, or Firm—Sughrue, Mion, Zinn, Macpeak & Seas

[57] ABSTRACT

A differential amplifier circuit having a superior transconductance linearity within a wider input voltage range, which includes a first differential pair of transistors and a driver circuit for driving the differential pair by its output current. This output current has a square-law characteristic to compensate in nonlinearity the transconductance of the differential pair. The driver circuit is a squarer or a quadritail circuit. A signal to be amplified is applied to a pair of input terminals. Input ends of the differential pair are connected to a pair of input terminals to be applied with a first input signal. Input ends of the driver circuit is connected to the pair of input terminals to be applied with a second input signal. The first and second input signals are proportional in amplitude to the signal to be amplified.

20 Claims, 39 Drawing Sheets

DIFFERENTIAL AMPLIFIER CIRCUIT HAVING A DRIVER WITH SQUARE-LAW CHARACTERISTIC

BACKGROUND OF THE INVENTION

1. Field of the Invention

The present invention relates to a differential amplifier circuit comprised of a differential pair of transistors and a driver circuit with the square-law characteristic for driving the pair and more particularly, to a differential amplifier circuit to be formed on semiconductor integrated circuits, which has a transconductance linearity within a wide input voltage range.

2. Description of the Prior Art

A differential amplifier circuit having a superior transconductance linearity within a comparatively wide input voltage range is known as an "Operational Transconductance Amplifier (OTA)".

A first example of the conventional OTAs was disclosed by Schmook in the IEEE Journal of Solid-State Circuits, Vol. SC-10, No. 6, PP. 407–411, December 1975, in which there is a disadvantage that its transconductance becomes low in value. The example contains two unbalanced differential pairs of bipolar transistors in which a relative emitter area ratio of the transistors of each pair are four (4), and input ends of the transistors of each pair are cross-coupled. The linearization of the example is known as the "Multitanh" technique, and the number of the transistor pairs has been increased to enlarge its input voltage range.

A second example of the conventional OTAs was disclosed by A. Nedungadi and T. R. Viswanathan in IEEE TRANSACTIONS ON CIRCUITS AND SYSTEMS, Vol. CAS-31, No. 10, pp. 891–894, October 1984. The example is of a Complementary Metal Oxide Semiconductor (CMOS) structure and contains a first differential pair of MOS transistors and a squarer for driving the first differential pair. The first differential pair is driven by the output current of the squarer to compensate its nonlinear term in its output characteristic. The squarer includes second and third unbalanced differential pairs of MOS transistors in which a relative ratio of a gate-width W to a gate-length L ratio (W/L) of the transistors of each pair are 2.155, and input ends of the transistors of each pair are cross-coupled and output ends thereof are parallel-coupled.

In the paper, they made mistakes in circuit analysis, and in their analysis model the relative ratios of a gate-width W to a gate-length L ratio (W/L) of the transistors of the second and third pairs were made equal in value to each other and constant current sources for driving the respective differential pairs were also made equal in current value to each other, so that the analysis was extremely difficult to understand. In addition, since it is very difficult that the relative ratio of (W/L) of each pair of the squarer is made to be 2.155 exactly, nobody has utilized the example of Nedungadi and Viswanathani yet.

For example, to realize the relative ratio of (W/L) of two MOS transistors 2.155 exactly in LSIs, one of the transistor is required to be formed of 200 in number of unit transistors connected in parallel and the other thereof is required to be formed of 431 in number of the unit transistors connected in parallel.

A third example of the conventional CMOS OTAs was disclosed by the inventor Katsuji Kimura in IEICE TRANSACTIONS ON FUNDAMENTALS, Vol. E75-A, No. 12, PP. 1774–1776, December 1992. The example was made based on the fact that a quadritail circuit or a quadritail cell comprised of two pairs of MOS transistors and one constant current source for driving the two pairs could be employed as a squarer. The MOS transistor pairs are driven by an output current of the quadritail cell to compensate its nonlinear term in its output characteristic.

In the example, there is an advantage that a current mirror ratio is only required to be made at most 2 and this example of the OTA is easy to be integrated. Additionally, there is another advantage that the example is easy enough in circuit analysis for any LSI designers to understand.

A fourth example of the conventional differential amplifiers was developed for realizing a gyrator filter by Krummenachet and Joehl in 1988. In the example, there is a differential pair of first and second MOS transistors and a third MOS transistor is provided between the sources of the first and second transistors. The transconductance of the differential pair can be improved in linearity due to the fact that the electric resistance of the third MOS transistor varies in accordance with its input voltage.

A fifth example of the conventional OTAs was disclosed by Wang and Guggenbuhl in IEEE Journal of Solid-State Circuits, Vol. 25, No. 1, PP. 315–317, February 1990, in which a quadritail cell is used.

The OTA is an essential functional element in analog signal processing and its superior transconductance linearity is very important. However, with the above-identified examples of the conventional OTAs, it is difficult to ensure superior transconductance linearity within a wide input voltage range without enlarging its circuit scale.

SUMMARY OF THE INVENTION

Accordingly, an object of the present invention is to provide a differential amplifier circuit in which a transconductance linearity can be obtained within a wide input voltage range without increase in circuit scale.

A differential amplifier circuit according to the present invention includes a pair of input terminals to which a signal to be amplified is applied, a first differential pair formed of first and second transistors, and a driver circuit for driving the first differential pair by its output current. The output current of the driver circuit has a square-law characteristic. The first differential pair is applied with a first input signal and the driver circuit is applied with a second input signal. The first and second input signals are proportional in amplitude to the signal to be amplified.

Preferably, at least one of the first differential pair and the driver circuit contains a divider circuit through which the first or second input signal is produced.

As the driver circuit, a squarer or a quadritail circuit may be used preferably.

In a preferred embodiment, the driver circuit is comprised of a second differential pair of third and fourth transistors whose capacities are different from each other, and a third differential pair of fifth and sixth transistors whose capacities are different from each other. Input ends of the second and third differential pairs are cross-coupled and output ends thereof are parallel-coupled.

The "capacitor" means an emitter area in a bipolar transistor and a gate-width to gate-length ratio in an MOS transistor.

In another preferred embodiment, the driver circuit is comprised of a second differential pair of third and fourth transistors whose capacities are equal to each other, and a third differential pair of fifth and sixth transistors whose capacities are equal to each other. Input ends of the second and third differential pairs are cross-coupled and output ends thereof are parallel-coupled. The input ends of the second and third differential pairs are respectively applied with offset voltages which are equal in value to each other.

In still another preferred embodiment, the driver circuit is comprised of a quadritail circuit. The quadritail circuit is formed of a second pair of third and fourth transistors whose capacities are equal to each other, and a third pair of fifth and sixth transistors whose capacities are equal to each other. The third, fourth, fifth and sixth transistors are driven by one constant current source. Output ends of the second and third pairs are parallel-coupled. Input ends of the second pair are applied with the second input signal and input ends of the third pair are coupled together to be applied with the middle point voltage of the second input signal.

The first to sixth transistors may be formed of bipolar transistors or MOS transistors.

In the case that bipolar transistors are employed as the third to sixth transistors of the driver circuit, the third and fourth transistors are different in emitter area from each other and the fifth and sixth transistors are also different in emitter area from each other.

The bipolar transistors of the second and third differential pairs may be provided with resistors connected to the respective emitters. In each pair, the emitter resistors have resistances inversely proportional in value to the relative emitter area ratio of the corresponding transistors.

The bipolar transistors of the second and third differential pairs having smaller emitter areas may be provided with resistors connected to the respective emitters.

The bipolar transistors of the second and third differential pairs whose emitter areas are equal to each other respectively may be provided with resistors connected to the respective emitters.

The second differential pair may be provided with a seventh bipolar transistor which is in the Darlington connection with the third transistors and a resistor connected to the emitter of the fourth bipolar transistor. The third differential pair may be also provided with an eighth bipolar transistor which is in the Darlington connection with the sixth transistors and a resistor connected to the emitter of the fifth bipolar transistor.

In the case that MOS transistors are employed as the third to sixth transistors of the squarer, the third and fourth transistors are different from or equal to in gate-width to gate-length ratio each other and the fifth and sixth transistors are also the same.

The first and second input signals may be different from or equal to each other in level or amplitude.

With the differential amplifier circuit of the present invention, there are provided with a first differential pair and a driver circuit having a square-law characteristic for driving the differential pair by its output current to compensate nonlinearity in the transconductance of the first differential pair. As a result, an actual OTA having a superior transconductance linearity within a wide input voltage range can be realized without increase in circuit scale.

Different from the conventional OTA disclosed by Nedungadi and Viswanathan, the differential amplifier circuit of the present invention is realized easily, and the transconductance linearity of the circuit can be sufficiently improved even if the theoretical values are rounded or approximated to those which are easy to be realized.

The divider through which the first or second input signal is applied may be formed of a resistor in general. In this case, the resistor having a desired resistance value occupies a comparatively small area on semiconductor integrated circuits, so that there arises no problem about the chip occupation area.

In addition, the resistor which is extremely smaller in resistance dependency on its applied voltage than that formed by a diffusion or ion-implantation process can be realized by using a polysilicon film through popular semiconductor processes, so that distortion in the first and/or second input signals due to the dividing resistor can be ignored.

DETAILED DESCRIPTION OF THE PREFERRED EMBODIMENTS

Figure 1:
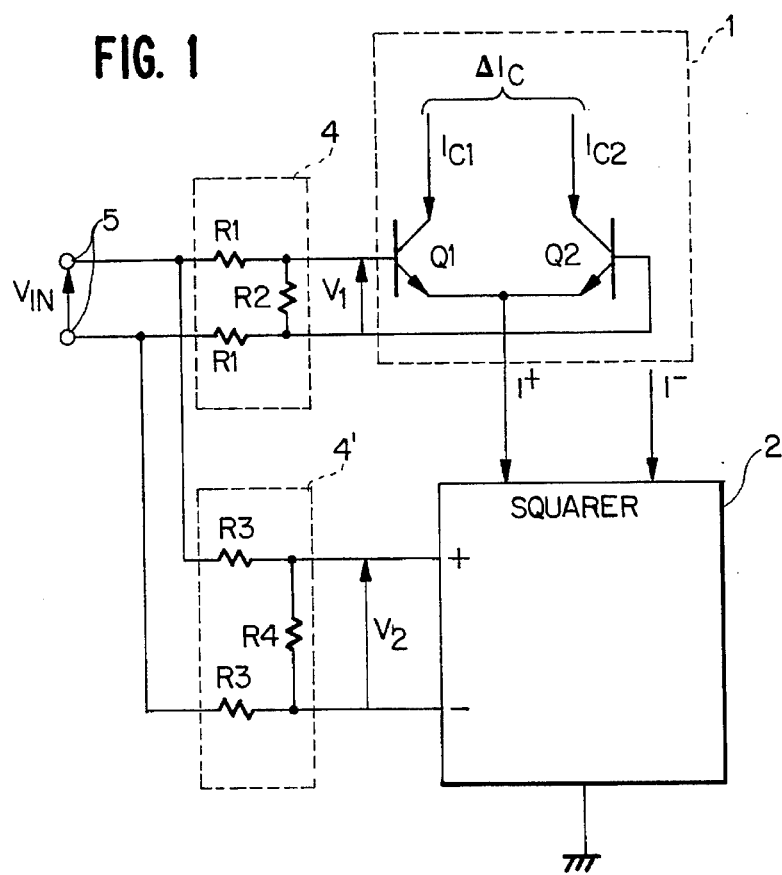
FIG. 1 is a circuit diagram of a differential amplifier circuit according to a first embodiment of the present invention, in which bipolar transistors are employed.

Preferred embodiments of the present invention will be described below referring to the drawing figures attached.

[First embodiment]

FIG. 1 shows a differential amplifier circuit as an OTA of a first embodiment. In FIG. 1, a balanced differential pair 1 formed of first and second bipolar transistors Q1 and Q2 whose emitter areas are equal to each other, and a squarer 2 as a driver circuit for driving the differential pair 1 by its output current. In the first differential pair 1, a first input signal (voltage: $V_1$) is applied to input ends or bases of the NPN transistors Q1 and Q2. In the squarer 2, a second input signal (voltage: $V_2$) is applied to input ends thereof. Emitters of the transistors Q1 and Q2 are connected in common to one of output ends of the squarer 2. The differential pair 1 is driven by an output current $I^+$ of the squarer 2. An output current $I^-$ thereof is not used therefor.

The differential pair 1 and the squarer 2 contain divider circuits 4 and 4', respectively. The divider circuit 4 is composed of two first resistors (resistance: R1) connected respectively to the bases of the transistors Q1 and Q2 and a second resistor (resistance: R2) connected between the bases of the transistors Q1 and Q2. The first resistors are connected to a pair of input terminals 5, respectively.

Similarly, the divider circuit 4' is composed of two third resistors (resistance: R3) connected respectively to the input ends of the squarer 2 and a fourth resistor (resistance: R4) connected between the input ends thereof. The third resistors are connected to the pair of the input terminals 5, respectively.

A signal (voltage: $V_{IN}$) to be amplified is applied to the pair of the input terminals 5. The first input signal $V_1$ is generated by voltage division from the input signal $V_{IN}$ through the divider circuit 4 to be applied to the bases of the transistors Q1 and Q2 of the differential pair 1. The second input signal $V_2$ is generated by voltage division from the input signal $V_{IN}$ through the divider circuit 4' to be applied to the input ends of the squarer 2.

Next, the operation of the differential amplifier circuit of the first embodiment is described below.

The transconductance of the differential pair 1 formed of the transistors Q1 and Q2 can be obtained as follows:

We suppose that the characteristics of the transistors Q1 and Q2 are matched with each other, the base-width modulation can be ignored, and the differential pair 1 which is applied with the first input signal $V_1$ is driven by a constant current $I_{EE}$. Additionally, the differential output current $\Delta I_C$ is defined as $\Delta I_C = I_{C1} - I_{C2}$ where $I_{C1}$ and $I_{C2}$ are collector currents of the transistors Q1 and Q2, respectively. Then, a differential output current $\Delta I_C$ of the differential pair 1 can be given as the following equation (1).

$$\Delta I_C = I_{C1} - I_{C2} = \alpha_F \cdot I_{EE} \cdot \tanh\{(V_1)/(2V_T)\} \quad (1)$$

In the equation (1), $\alpha_F$ is the dc common-base current gain factor, and $V_T$ is the thermal voltage expressed as $V_T = (kT/q)$ where k is the Boltzmann's constant, T is absolute temperature in degrees Kelvin and q is the charge of an electron.

It is seen from the equation (1) that the differential output current $\Delta I_C$ is required to be satisfy the following relationship (2) to make the transconductance of the differential pair 1 linear.

$$\Delta I_C = aV_1 \quad (2)$$

where a is a constant.

Therefore, the driving current $I_{EE}$ is required to be inversely proportional to $(1/V_1) \tanh[V_1/(2V_T)]$.

When $|x| < 1$, $\tanh x$ can be expanded as the following equation (3):

$$\tanh x = x - (x^3/3) \quad (3)$$

Then, when $|x| < 1$, the following equations are derived from the equation (3).

$$(\tanh x)/X = 1 - (x^2/3)$$

$$x/(\tanh x) = 1 + (x^2/3)$$

Accordingly, when the amplitude of the first input signal $V_1$ is small, it is seen that the linearity of the transconductance can be improved if the driving current $I_{EE}$ has the square-law characteristic. This means that the differential pair 1 formed of the transistors Q1 and Q2 which are driven by the output current $I^+$ of the squarer 2 can be improved in transconductance linearity.

The transconductance of the differential pair 1 is obtained by differentiating the differential output current $\Delta I_C$ by the input signal voltage $V_1$ as the following equation (4).

$$[d(\Delta I_C)/dV_1] = [(\alpha_F I_{EE})/(2V_T)] \cdot \mathrm{sech}^2[V_1/(2 V_T)] \quad (4)$$

Figure 2:
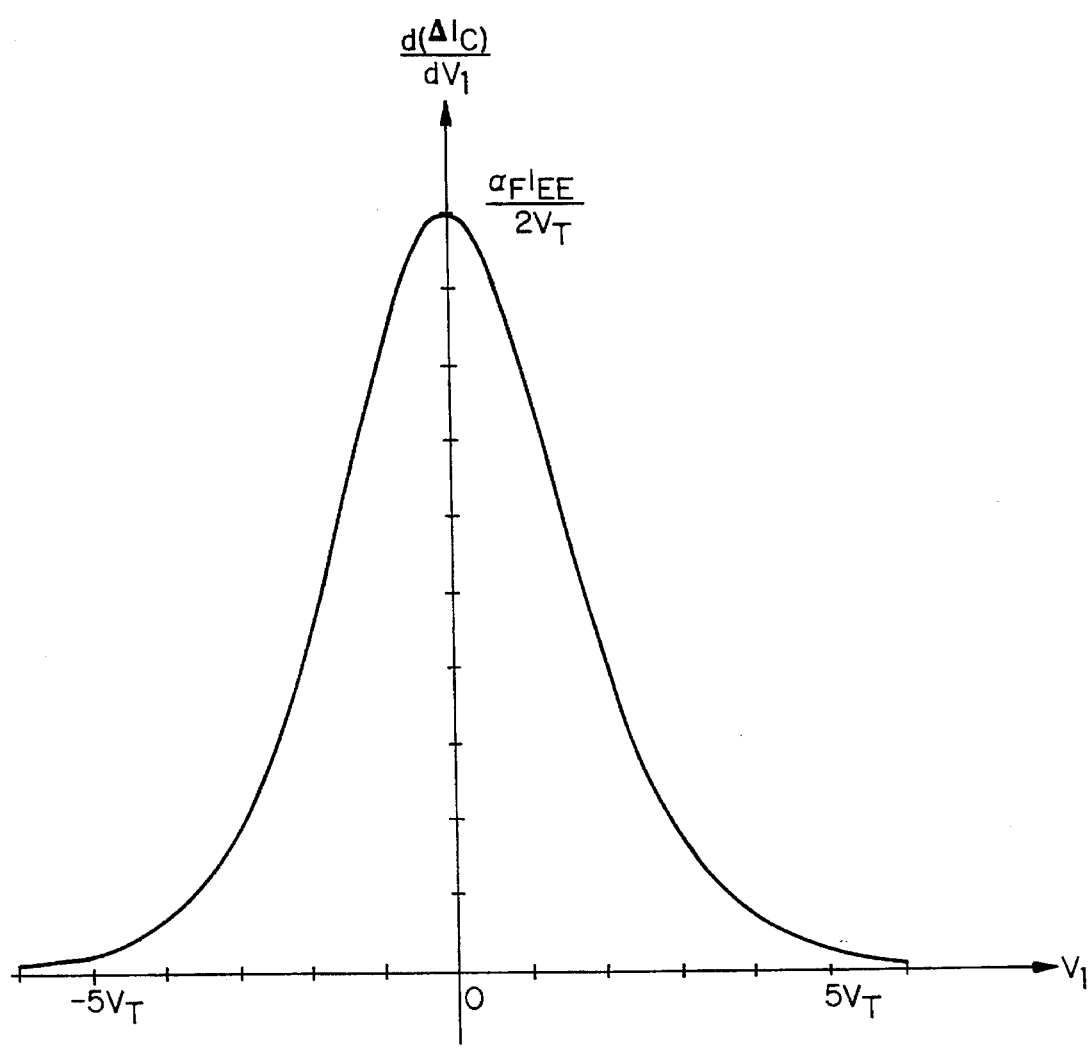
FIG. 2 shows a transconductance characteristic of the transistor pair in the differential amplifier circuit indicated in FIG. 1.

FIG. 2 shows the transconductance of the differential pair 1 obtained from the equation (4). From FIG. 2, it is seen that the transconductance of the differential pair 1 decreases in accordance with increase in amplitude of the input voltage $V_1$. It is also seen that the transconductance curve of the differential pair 1 is similar in shape to a hanging bell, in other words, it describes a parabola approximately.

It is intuitively understood from FIG. 2 that the differential pair 1 can be compensated in transconductance linearity by the driving current $I^+$ having the square-law characteristic.

As described above, the differential pair 1 can be compensated in transconductance linearity by the driving current $I^+$ having the square-law characteristic. In addition, it is seen from the equation (4) that the transconductance of the differential pair 1 is in proportion to its driving current $I_{EE}$ or $I^+$.

With the differential amplifier circuit of the first embodiment, the input voltage range can be expanded without increase of device or element number.

[Second Embodiment]

Figure 3:
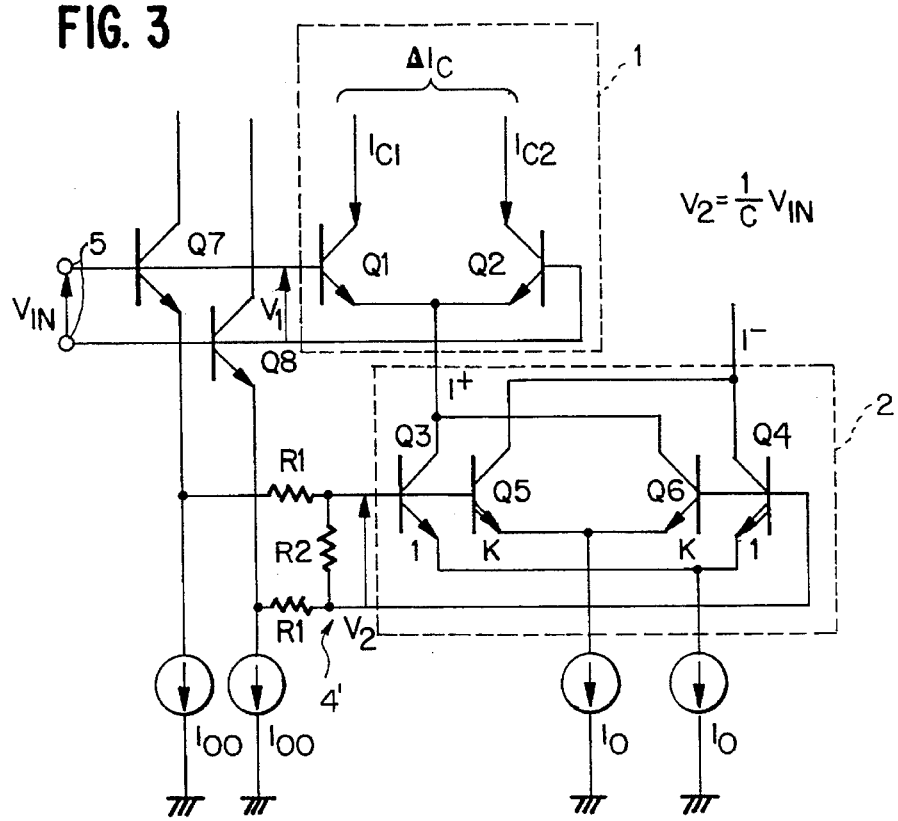
FIG. 3 is a circuit diagram of a differential amplifier circuit or an OTA according to a second embodiment of the present invention.

FIG. 3 shows a differential amplifier circuit as an OTA of a second embodiment. In FIG. 3, a first balanced differential pair 1 is formed of NPN bipolar transistors Q1 and Q2 similar to that of the first embodiment. A divider circuit 4' for a squarer 2 is formed of two first resistors (resistance: R1) and a second resistor (resistance: R2). No divider circuit 4 for the differential pair 1 is provided. Therefore, a first input signal $V_1$ for the differential pair 1 is equal to a signal $V_{IN}$, and a second input signal $V_2$ for the squarer is generated by dividing the signal $V_{IN}$ through the divider circuit 4'.

The squarer 2 is comprised of a second unbalanced differential pair of NPN bipolar transistors Q3 and Q4 whose capacities or emitter areas are different from each other, and a third unbalanced differential pair of NPN bipolar transistors Q5 and Q6 whose capacities or emitter areas are different from each other. The transistor Q4 is K times in emitter area as large as the transistor Q3, and the transistor Q5 is K times in emitter area as large as the transistor Q6, where $K \neq 1$.

Emitters of the transistors Q3 and Q4 of the second differential pair are connected in common to a first constant current source (current: $I_0$) for driving them, and emitters of the transistors Q5 and Q6 of the third differential pair are connected in common to a second constant current source (current: $I_0$) for driving them.

Bases of the transistors Q3 and Q5 are connected in common and those of the transistors Q4 and Q6 are connected in common.

Collectors of the transistors Q3 and Q6 are connected in common to form one of output ends of the squarer 2, from which an output current $I^+$ is derived. The collectors thus common-connected are connected to emitters of the transistors Q1 and Q2 of the differential pair 1 to drive the pair 1 by the current $I^+$. The collectors of the transistors Q4 and Q5 are connected in common to form the other of the output ends thereof, from which an output current $I^-$ is derived.

In other words, input ends or the bases of the second and third differential pairs are cross-coupled and output ends or collectors thereof are parallel-coupled.

There are provided with NPN bipolar transistors Q7 and Q8. Bases of the transistors Q7 and Q8 are respectively connected to input terminals 5 to be applied with the signal $V_{IN}$ to be amplified. Emitters of the transistors Q7 and Q8 are respectively connected to third and fourth constant current sources (current: $I_{00}$), respectively.

One of the first resistors (resistance: R1) of the division circuit 4' is connected between the common-connected bases of the transistors Q3 and Q5 and the emitter of the transistor Q7. The other of the first resistors (resistance: R1) thereof is connected between the common-connected bases of the transistors Q4 and Q6 and the emitter of the transistor Q8. The second resistor (resistance: R2) of the divider circuit 4' is connected between the common-connected bases of the transistors Q3 and Q5 and those of the transistors Q4 and Q6.

Next, the operation of the differential amplifier circuit of the second embodiment is described below.

The output current $I^+$ of the squarer 2 is expressed as the following equation (5).

$$I^+ = \alpha_F \cdot I_0 \cdot \{1 - (\tfrac{1}{2})[\tanh((V_1 + V_K)/(2V_T)) - \tanh((V_1 - V_K)/(2V_T))]\} \quad (5a)$$

$$I^+ = \alpha_F \cdot I_0 \cdot \{1 - [(K - (1/K))/(2\cosh(V_1/V_T) + K + (1/K))]\} \quad (5b)$$

In the equation (5a), the reference $V_K$ indicates an offset voltage generated in the first unbalanced differential pair 1, which is expressed as $V_K = V_T \ln K$.

Though not shown, the output current $I^-$ of the squarer 2 can be expressed as equations opposite in phase to the equations (5a) and (5b).

This circuit analysis was disclosed in detail by the inventor K. Kimura in IEEE Transactions, CAS-I, Vol. 39, No. 9, PP. 771–777, September 1992.

Figure 4:
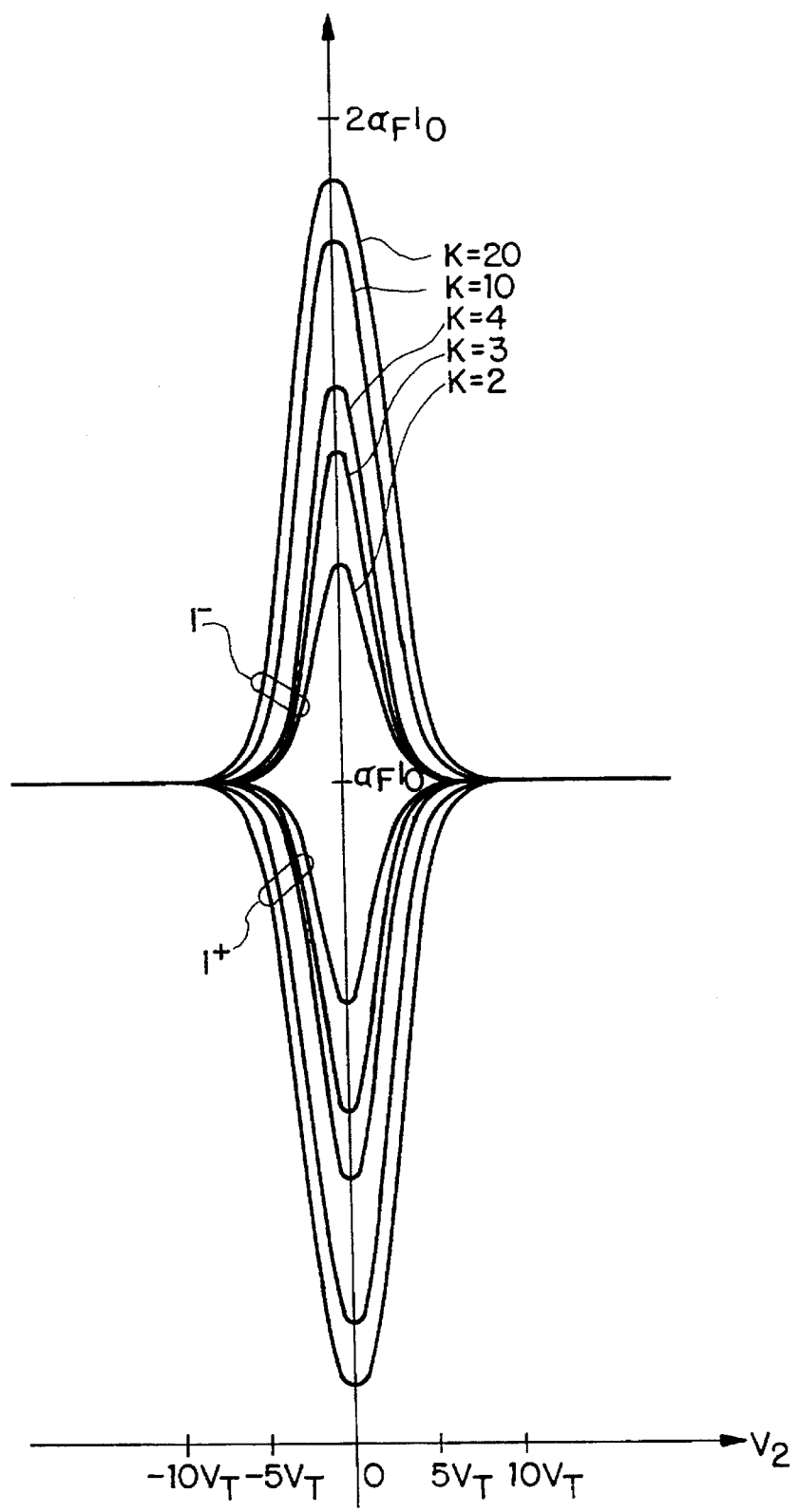
FIG. 4 shows output characteristics of the squarer in the differential amplifier circuit shown in FIG. 3 with the parameter K.

The differential output current characteristics of $I^+$ and $I^-$ of the squarer 2 in FIG. 3 are shown in FIG. 4. The input voltage range of the squarer 2 is the maximum when K=10.5, and a superior square-law characteristic can be obtained when the input voltage range is $|V_2| \leq 2V_T$.

The differential pair 2 is driven by the output current $I^+$, so that $I_{EE}$ is replaced by $I^+$ in the equation (1), resulting in the following equation (6).

$$\Delta I_C = \alpha_F^2 \cdot I_0 \cdot \{1 - [(K-(1/K))/(2\cosh(V_{IN}/CV_T) + K + (1/K))]\} \cdot \tanh(V_{IN}/2V_T) \quad (6)$$

In the equation (6), $V_1 = V_{IN}$ and $V_2 = V_{IN}/C$ are established where C is a constant.

Figure 5:
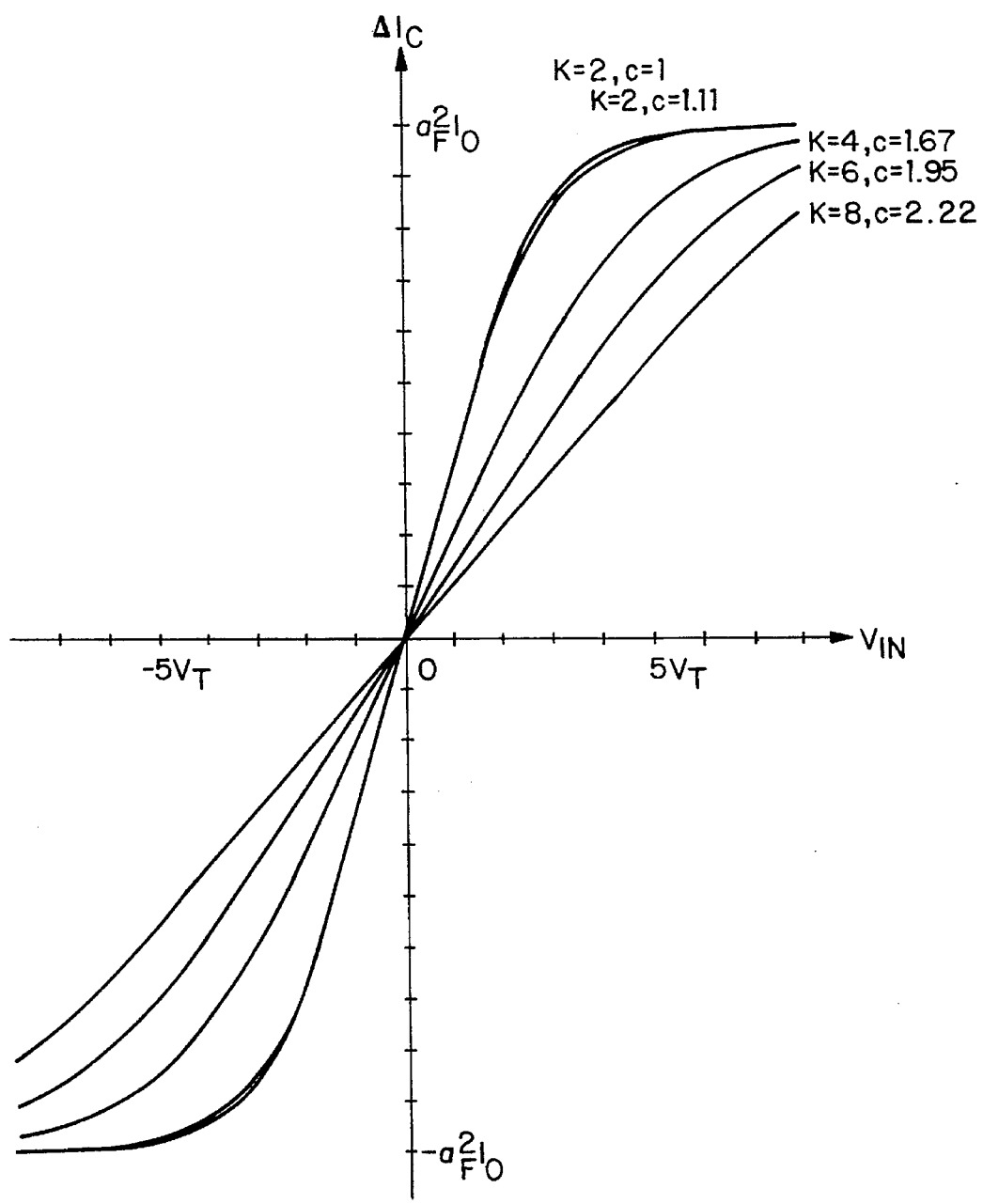
FIG. 5 shows transfer characteristics of the differential amplifier circuit shown in FIG. 4 with the parameters K and C.

FIG. 5 shows transfer characteristics of the differential amplifier (OTA) of the second embodiment with the parameters K and C.

The transconductance of the differential amplifier of the second embodiment can be obtained by differentiating the equation (6) by the voltage $V_{IN}$ to be amplified as the following equation (7).

$$[d(\Delta I_C)/dV_{IN}] = [(\alpha_F^2 I_0)/(2V_T)] \cdot \{(1/\cosh^2(V_{IN}/2V_T)) - \\ [1 - (1/(2\cosh^2(V_{IN}/CV_T) + K + (1/K))] + \\ (4/C) \cdot [((K - (1/K)) \cdot \tanh(V_{IN}/2V_T) \cdot \\ \sinh(V_{IN}/CV_T))/[2\cosh(V_{IN}/CV_T) + K + (1/K)]^2 \cdot \\ \tanh(V_{IN}/2V_T)\} \quad (7)$$

Figure 6:
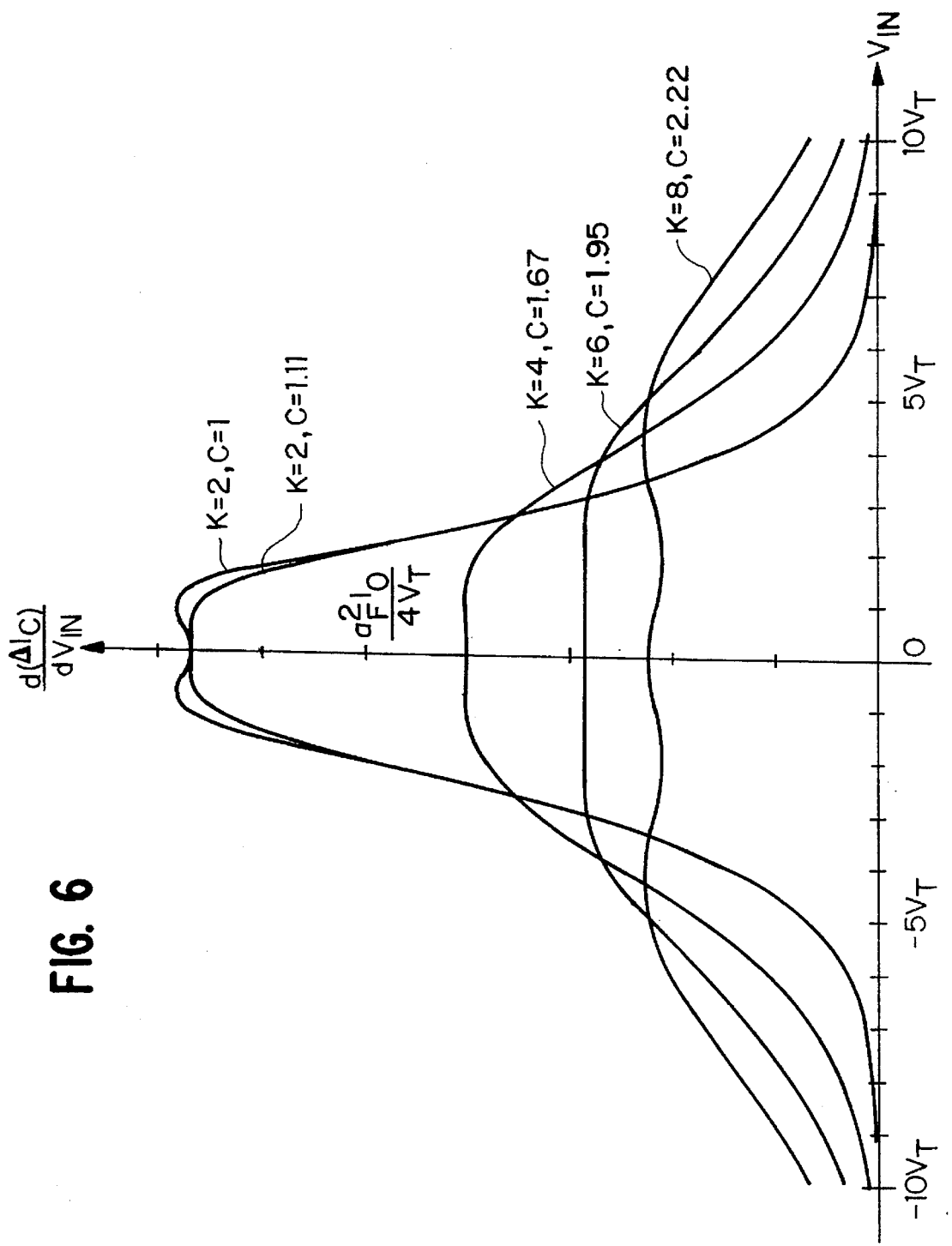
FIG. 6 shows transconductance characteristics of the differential amplifier circuit shown in FIG. 4 with the parameters K and C.

FIG. 6 shows the transconductance characteristics of the differential amplifier of the second embodiment with the parameters K and C, which is obtained from the equation (7). In FIG. 6, the value of the emitter area ratio K is set to an integer such as 2, 4, 6 and 8 and that of the constant C is set so that the transconductance is approximately linear.

When C=1, which corresponds to a case that the divider circuit 4' is removed in FIG. 3 and levels of the first and second input signals $V_1$ and $V_2$ are equal to each other, the first input voltage $V_1$ for the differential pair 1 and the second input voltage $V_2$ for the squarer 2 are equal to each other. There are also shown in FIGS. 5 and 6 the characteristics in a case of K=2 and C=1.

With the differential amplifier circuit of the second embodiment, compared with the conventional "Multitanh" technique in which a plurality of balanced or unbalanced differential pairs of transistors are cross-coupled, the input voltage range can be expanded without increase of device or element number.

[Third embodiment]

Figure 7:
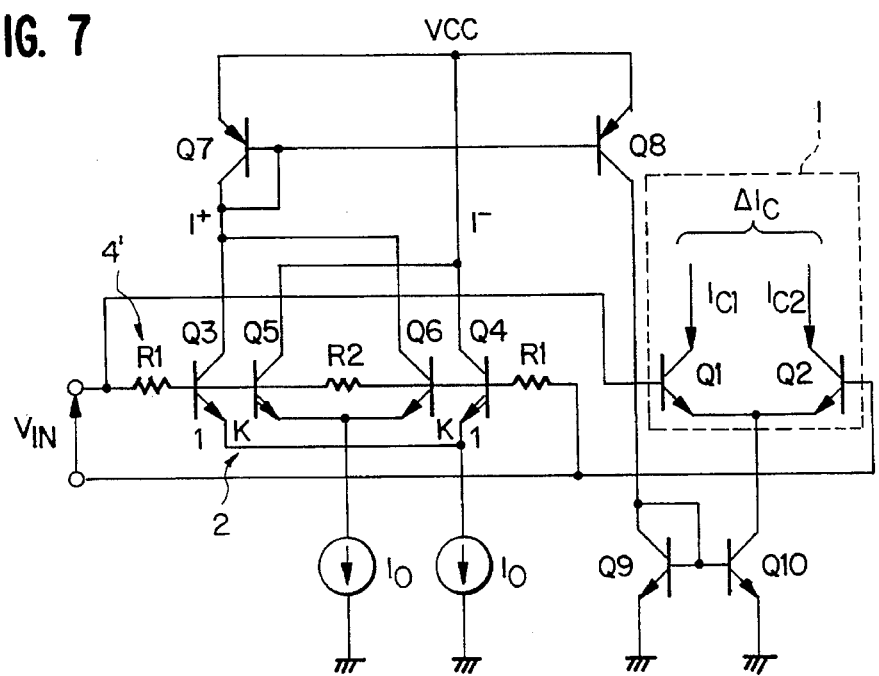
FIG. 7 is a circuit diagram of a differential amplifier circuit according to a third embodiment of the present invention, in which the transistor pair and the squarer are connected in cascade through two current mirror circuits.

FIG. 7 shows a differential amplifier circuit as an OTA of a third embodiment. In this embodiment, a first balanced differential pair 1 and a squarer 2 are connected in cascade to each other through two current mirror circuits, so that there is an additional advantage that the dc voltage level of the input signal can be lowered compared with the second embodiment. This means that a supply voltage for the differential amplifier can be lowered.

In FIG. 7, the first differential pair 1, the squarer 2, a divider circuit 4' and first and second constant current sources (current: $I_0$) for respectively driving second and third unbalanced differential pairs of the squarer 2 are the same in configuration as those of the second embodiment, respectively. PNP bipolar transistors Q7 and Q8 compose a first current mirror circuit and NPN bipolar transistors Q9 and Q10 compose a second current mirror circuit.

Emitters of the transistors Q7 and Q8 are coupled together to be applied with a power source voltage VCC. The collectors coupled together of the transistors Q4 and Q5 are connected in common to the emitters of the transistors Q7 and Q8 to be applied with the power source voltage VCC.

The first differential pair 1 is driven by the output current $I^+$ of the squarer 2 through the first and second current mirror circuits.

The operation of the differential amplifier circuit of the third embodiment is similar to that of the second embodiment excepting that the output current $I^+$ of the squarer 2 is supplied to the first differential pair 1 through the first and second current mirror circuits.

[Fourth embodiment]

Figure 8:
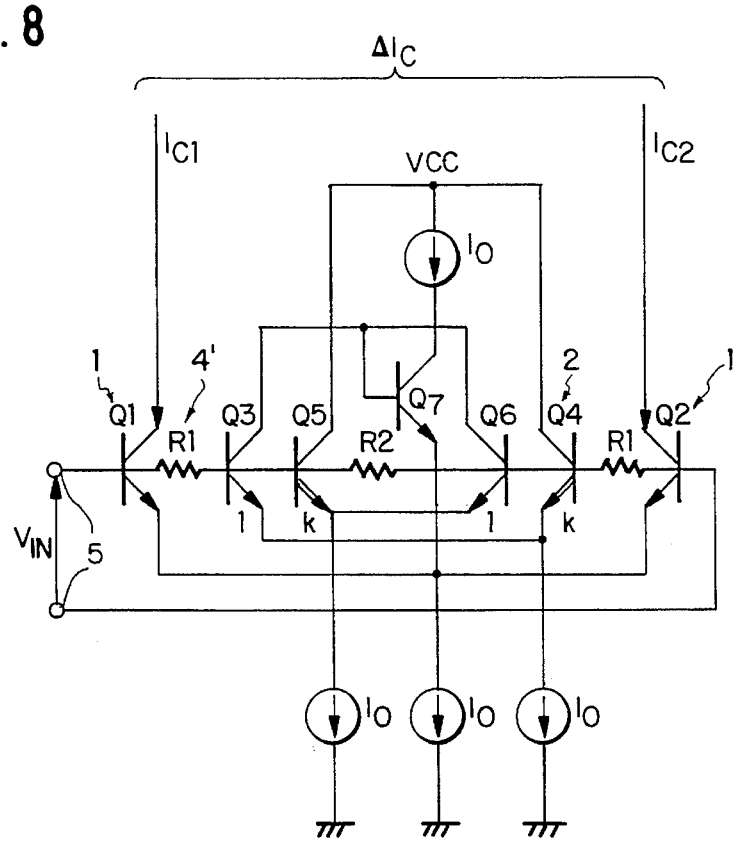
FIG. 8 is a circuit diagram of a differential amplifier circuit according to a fourth embodiment of the present invention, in which the transistor pair is driven by an output current of the squarer through a current shifting circuit.

FIG. 8 shows a differential amplifier circuit as an OTA of a fourth embodiment. In this embodiment, an output current of a squarer 2 is supplied to a first balanced differential pair 1 through a current shifting circuit, so that there is an additional advantage that the input voltage can be reduced compared with the second embodiment, similar to the third embodiment.

In FIG. 8, the first differential pair 1, the squarer 2, a divider circuit 4' and first and second constant current sources (current: $I_0$) for respectively driving second and third unbalanced differential pairs of the squarer 2 are the same in configuration as those of the second embodiment, respectively.

The current shifting circuit is composed of an NPN bipolar transistor Q7 and third and fourth constant current sources (current: $I_0$) therefor. An emitter of the transistor Q7 is connected to emitters of the transistors Q1 and Q2 of the first differential pair 1, and the third constant current sources for driving the transistor Q7 is connected to the connection point of these emitters.

A base and a collector of the transistor Q7 are connected in common to collectors coupled together of the transistors Q3 and Q6 of the squarer 2. The fourth constant current sources (current: $I_0$) for current shift is provided between the collectors of the transistors Q3 and Q6 and the collectors coupled together of the transistors Q4 and Q5. The collectors of the transistors Q4 and Q5 and the constant current source for current shift are applied with a power source voltage VCC.

[Fifth embodiment]

Figure 9:
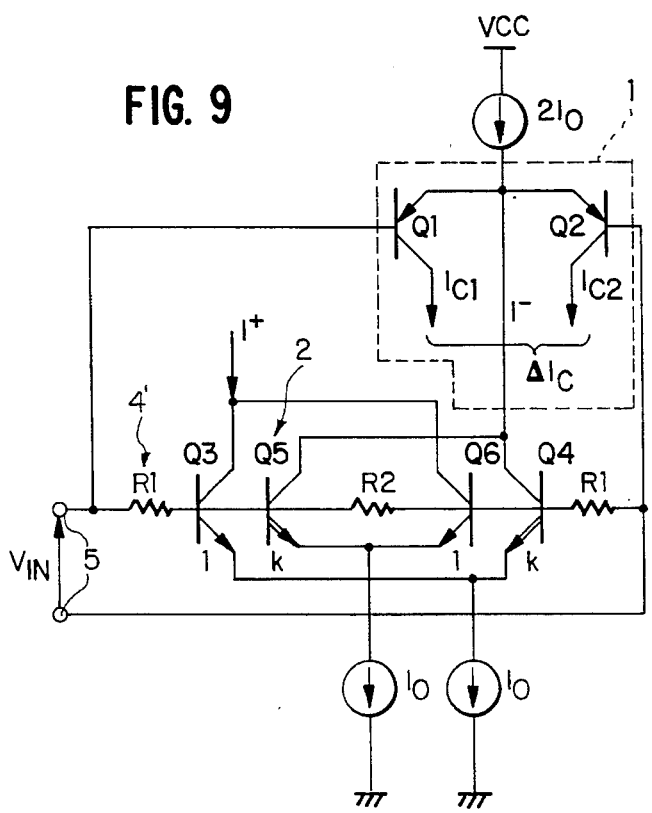
FIG. 9 is a circuit diagram of a folded differential amplifier circuit or a "folded OTA" according to a fifth embodiment of the present invention.

FIG. 9 shows a differential amplifier circuit of a fifth embodiment, which is called as a folded OTA. In this embodiment, a first balanced differential pair 1 is folded by using PNP bipolar transistors Q1 and Q2, different from the second embodiment.

In FIG. 9, the first differential pair 1, a squarer 2, a divider circuit 4', and first and second constant current sources (current: $I_0$) for respectively driving second and third unbalanced differential pairs of the squarer 2 are the same in configuration as those of the second embodiment, respectively.

The first balanced differential pair 1 is driven by an output current $I^-$ of the squarer 2. A third constant current source (current: $2I_0$) for driving the pair 1 is provided between emitters coupled together of the transistors Q1 and Q2 and a power source (voltage: VCC).

The operation of the differential amplifier circuit of the third embodiment is similar to that of the second embodiment excepting that the output current $I^-$ of the squarer 2 drives the first differential pair 1.

In the fifth embodiment, the first balanced differential pair 1 may be formed of NPN bipolar transistors, and in this case, the squarer 2 may be folded by using PNP bipolar transistors, in which the power source and ground are upside down.

In addition, the current value of the current source is set as $2I_0$, however, it may be $aI_0$ where a is a constant other than 2.

[Sixth embodiment]

Figure 10:
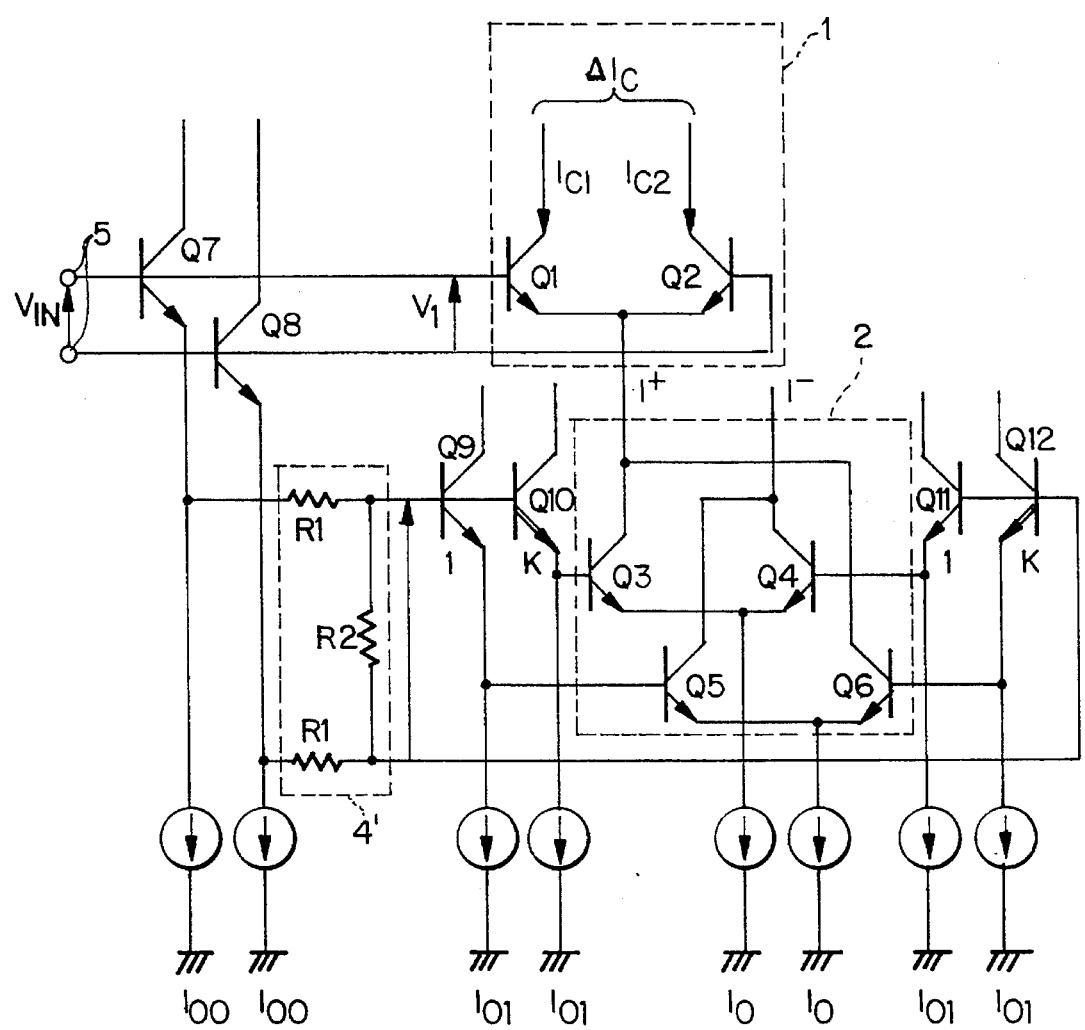
FIG. 10 is a circuit diagram of a differential amplifier circuit according to a sixth embodiment of the present invention.

FIG. 10 shows a differential amplifier circuit as an OTA of a sixth embodiment. This embodiment is the same in configuration as the second embodiment shown in FIG. 3 excepting that a squarer 2 is formed of second and third balanced differential pairs. The second differential pair is formed of NPN bipolar transistors Q3 and Q4 whose emitter areas are equal to each other. The third differential pair is formed of NPN bipolar transistors Q5 and Q6 whose emitter areas are equal to each other.

As shown in FIG. 10, there are provided with NPN bipolar transistors Q9, Q10, Q11 and Q12 for generating offset bias voltages and fifth, sixth, seventh and eighth constant current sources (current: $I_{01}$) for driving the respective transistors Q9, Q10, Q11 and Q12, additionally. The transistor Q10 is K times in emitter area as large as the transistor Q9, and the transistor Q12 is K times in emitter area as large as the transistor Q11.

Bases of the transistors Q9 and Q10 are coupled together and bases of the transistors Q11 and Q12 are coupled together to be applied with a second input voltage $V_2$. Bases of the transistors Q5, Q3, Q4 and Q6 are connected to emitters of the transistors Q9, Q10, Q11 and Q12, respectively.

The bias offset voltages generated by the transistors Q9, Q10, Q11 and Q12 are supplied to the squarer 2, so that equivalent transfer characteristics to those of the second embodiment can be obtained. As a result, the output current $I^+$ of the squarer 2 can be expressed as the above equation (5) and then, the operation of the differential amplifier circuit of the sixth embodiment is similar to that of the second embodiment.

In this embodiment, similar to the second embodiment, the same effects or advantages can be obtained if the divider circuit 4' may be omitted. Also, the input voltage can be reduced by the same ways as shown in FIGS. 7, 8 and 9.

In the second to sixth embodiments, the input voltage range of the differential pair 1 can be expanded by inserting emitter resistors for degeneration. If the emitter degeneration values of the first differential pair 1 and those of the second and third differential pairs of the squarer 2 are set appropriately, there is an advantage that the first and second input signals $V_1$ and $V_2$ can be made equal to each other, which means that no divider circuit is required.

If diodes are inserted in place of the emitter resistors, the input voltage range of the differential pair 1 can be expanded. When one diode is inserted to each of the transistors, the input voltage range can be expanded up to two times as wide as that of the case without diodes. m in number diodes connected in series are provided to each of the transistors, the input voltage range can be expanded up to (m+ 1) times as wide as that of the case without diodes, however, the power source voltage required increases by about (0.7 m) V.

[Seventh embodiment]

Figure 11:
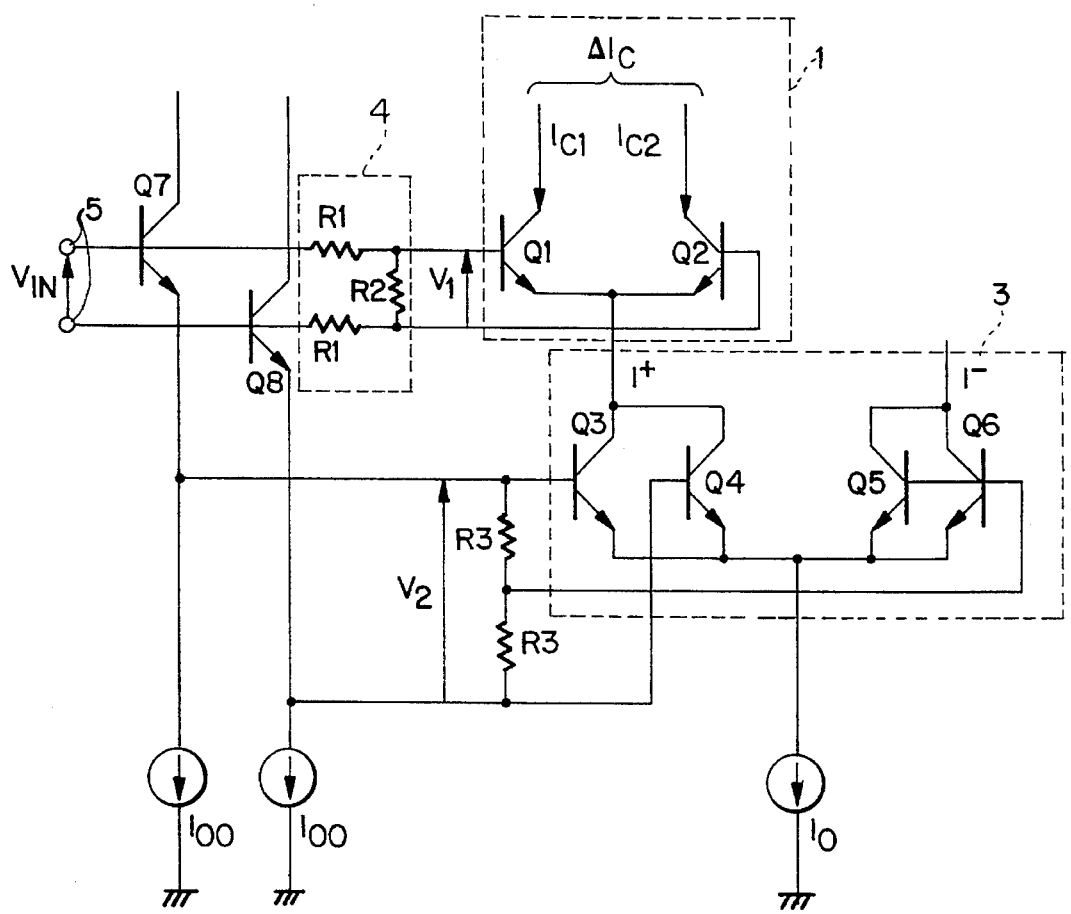
FIG. 11 is a circuit diagram of a differential amplifier circuit according to a seventh embodiment of the present invention.

FIG. 11 shows a differential amplifier circuit as an OTA of a seventh embodiment. This embodiment is the same in configuration as the second embodiment shown in FIG. 3 excepting that a quadritail circuit 3 is provided as a driver circuit in place of a squarer.

As shown in FIG. 11, the quadritail circuit 3 is formed of four NPN bipolar transistors Q3, Q4, Q5 and Q6 driven by one first constant current source (current: $I_0$). The transistors Q3 and Q4 composing a second pair are equal in emitter area to each other and the transistors Q5 and Q6 composing a third pair are also equal in emitter area to each other.

Emitters of the transistors Q3, Q4, Q5 and Q6 are connected in common to the constant current source.

Input ends or bases of the transistors Q3 and Q4 are connected respectively to emitters of NPN bipolar transistors Q7 and Q8 to be applied with a second input signal $V_2$. Two third resistors (resistance: $R_3$) connected in series are provided for generating a bias voltage between the bases of the transistors Q3 and Q4. Output ends or collectors of the transistors Q3 and Q4 are connected in common to emitters of the NPN bipolar transistors Q1 and Q2.

Input ends or bases of the transistors Q5 and Q6 are connected in common to the connection point of the third resistors (resistance: $R_3$) to be applied with a bias voltage equal to the middle point voltage of $V_2$ or $(\frac{1}{2})V_2$. Output ends or collectors of the transistors Q5 and Q6 are coupled together.

In the quadritail circuit 3, the transistors Q5 and Q6 forming the third pail may be replaced by one transistor which is two times in capacity or emitter area as large as the transistor Q5 or Q6 since the emitters, bases and collectors of the transistors Q5 and Q6 are coupled together.

Next, the operation of the differential amplifier circuit of the seventh embodiment is described below.

Collector currents $I_{C3}$, $I_{C4}$, $I_{C5}$ and $I_{C6}$ of the respective transistors Q3, Q4, Q5 and Q6 are expressed as the following equations (8), (9), (10) and (11), respectively.

$$I_{C3}=I_S\exp[\{V_{BES}+(\frac{1}{2})V_1\}/V_t] \tag{8}$$

$$I_{C4}=I_S\exp[\{V_{BES}-(\frac{1}{2})V_1\}/V_T] \tag{9}$$

$$I_{C5}=I_{C6}=I_S\exp(V_{BES}/V_T) \tag{10}$$

In the equations (8), (9) and (10), $V_{BES}$ is the base-emitter voltage of the transistors Q5, $I_S$ is the saturation current, $\pm(\frac{1}{2})V_2$ are differential input voltages of the second pair of the transistors Q3 and Q4.

The tail current of the quadritail circuit 3 is expressed as the following equation (11).

$$I_{C3}+I_{C4}+I_{C5}+I_{C6}=\alpha_F \cdot I_0 \tag{11}$$

From the equations (8), (9), (10) and (11), an output current $I^+$ of the quadritail circuit 3 is expressed as the following equation (12).

$$I^+=I_{C3}+I_{C4}=\alpha_F I_0\{1-[(\frac{1}{2})\cdot sech^2(V_1/4V_T)]\} \tag{12}$$

Figure 12:
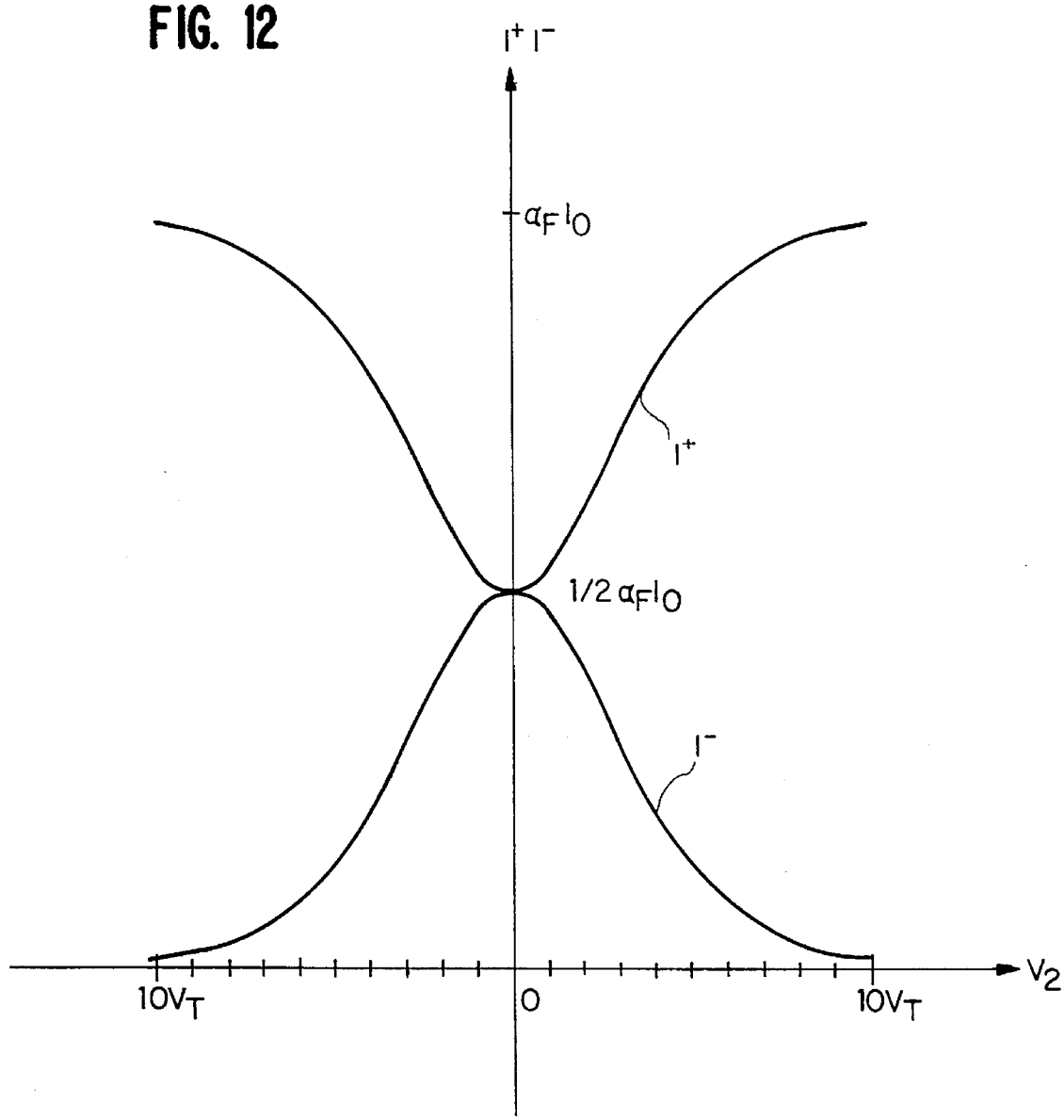
FIG. 12 shows an output current characteristic of the quadritail circuit in the differential amplifier circuit shown in FIG. 11.

The other output current $I^-$ of the quadritail circuit 3 can be obtained in the same way. Then, the output currents $I^+$ and $I^-$ thus obtained are shown in FIG. 12. From FIG. 12, it can be said that the differential output currents $I^+$ and $I^-$ have the square-law characteristics within the input voltage range of $|V_2| \leqq 2V_T$ approximately. This means that the quadritail circuit 3 may be used in place of a squarer.

The first differential pair 1 is driven by the output current $I^+$ of the quadritail circuit 3, so that the differential output current $\Delta I_C$ ($=I_{C1}-I_{C2}$) of the first differential pair 1 can be expressed as the following equation (13).

$$\Delta I_C = \alpha_F^2 I_0 \{1 - [(\tfrac{1}{2}) \operatorname{sech}^2(V_1/4V_T)]\} \cdot \tanh(V_{IN}/2V_T) \tag{13}$$

Figure 13:
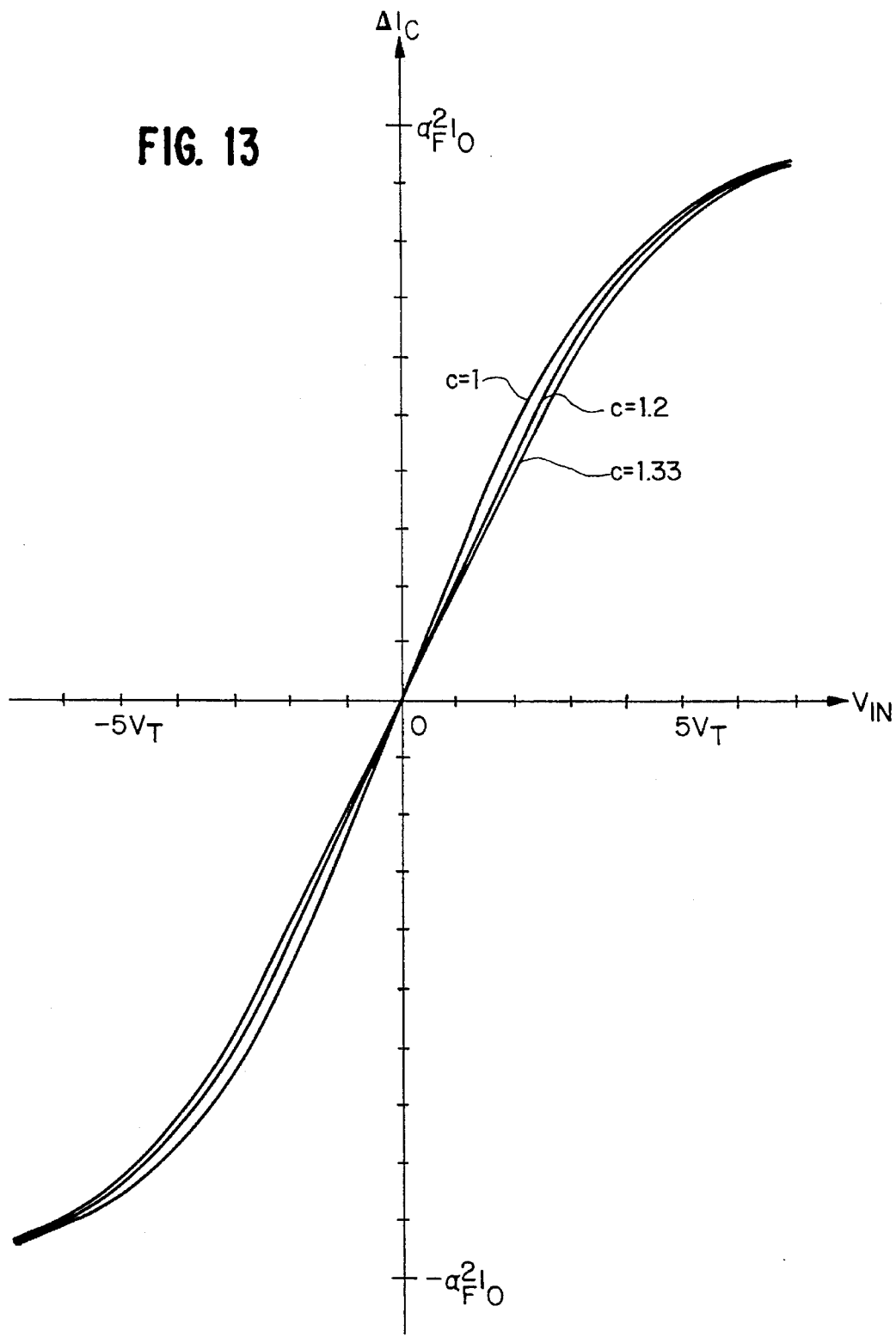
FIG. 13 shows transfer characteristics of the differential amplifier circuit shown in FIG. 11 with the parameter C.

FIG. 13 shows the transfer characteristics of the differential amplifier of the seventh embodiment with the parameter C, which is obtained from the equation (13).

The transconductance of the differential amplifier can be given by differentiating the differential output current $\Delta I_C$ by the input voltage $V_{IN}$ as the following equation (14).

$$[d(\Delta I_C)/dV_{IN}][(\alpha_F^2 I_0)/(4V_T)] \cdot \tag{14}$$

$$\{\operatorname{sech}^2(V_{IN}/2V_T) - \operatorname{sech}^2(V_{IN}/2V_T) \cdot \operatorname{sech}^2(V_{IN}/4C \cdot V_T) +$$

$$(1/C) \cdot \tanh(V_{IN}/2V_T) \cdot \tanh(V_{IN}/4C \cdot V_T) \cdot \operatorname{sech}2(V_{IN}/4C \cdot V_T)\}$$

In the equation (14), $V_1 = (1/C)V_{IN}$ and $V_2 = V_{IN}$.

Figure 14:
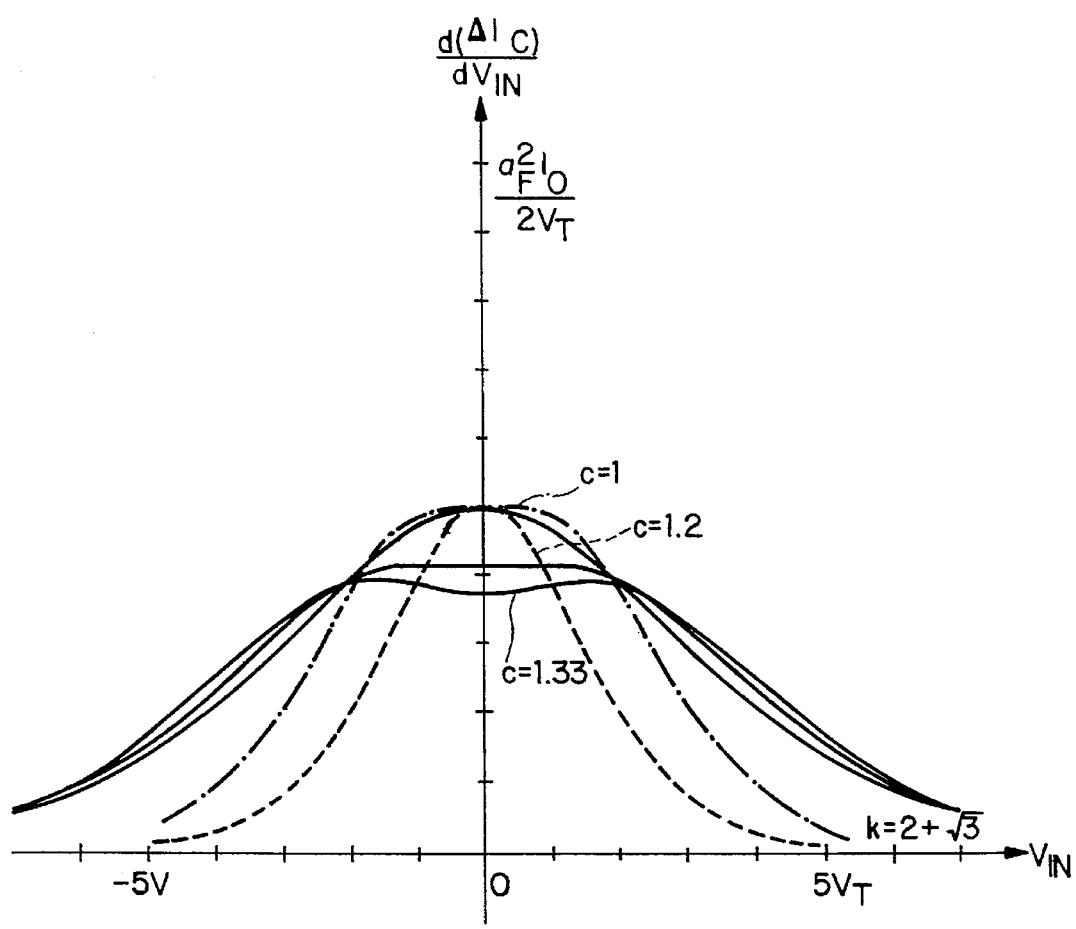
FIG. 14 shows transconductance characteristics of the differential amplifier circuit shown in FIG. 11 with the parameter C.

FIG. 14 shows the transconductance characteristic of the differential amplifier of this embodiment where the first differential pair 1 is driven by a constant current $(\tfrac{1}{2})I_0$ and C is 1, 1.2 and 1.33, which is obtained from the equation (14).

In FIG. 14, the transconductance characteristic of the conventional OTA by Schmook (the Multitanh technique) is also shown for comparison. In this conventional OTA, two unbalanced differential pairs are driven by a constant current $(\tfrac{3}{4})I_0$ respectively, and the relative emitter area ratio K of the differential pairs are both $(2\pm 3^{1/2})$ in which the transconductance characteristics are maximally flat. In addition, it is supposed that the dc common-base current gain factor $\alpha_F$ is approximately equal to 1.

It is seen from FIG. 14 that the seventh embodiment correspond in transconductance characteristic to the conventional OTA by Schmook containing four transistor pairs when the constant C is approximately equal to 1.21. When C=1, the first input signal voltage $V_1$ for the differential pair 1 and the second input signal voltage $V_2$ for the quadritail circuit 3 are equal to each other to be $V_{IN}$.

In the seventh embodiment, similar to the second to sixth embodiments, the input voltage range of the differential pair 1 can be expanded by inserting emitter resistors or diodes for degeneration. Especially, if an emitter diode is inserted to the emitter of each transistor forming the first differential pair 1, there arises an additional advantage that the second input signal voltage $V_2$ for the quadritail circuit 3 can be smaller than the first input signal voltage $V_1$ for the differential pair 1, which means that the second input signal voltage $V_2$ can be produced by the divider circuit 4' formed of the resistors from the signal $V_{IN}$ to be amplified.

[Eighth embodiment]

Figure 15:
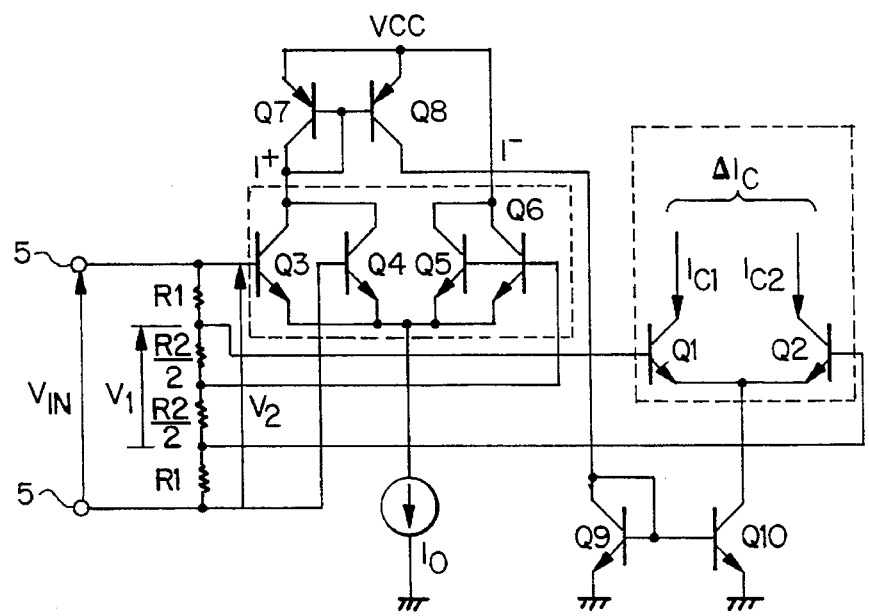
FIG. 15 is a circuit diagram of a differential amplifier circuit according to a eighth embodiment of the present invention, in which the transistor pair and the squarer are connected in cascade through two current mirror circuits.

FIG. 15 shows a differential amplifier circuit as an OTA of an eighth embodiment. In this embodiment, similar to the third embodiment shown in FIG. 7, a first balanced differential pair 1 and a quadritail circuit 3 are connected in cascade to each other through two current mirror circuits, so that there is an additional advantage that the dc voltage level of the input voltage can be reduced compared with the seventh embodiment shown in FIG. 11.

As shown in FIG. 15, the first balanced differential pair 1 is formed of NPN bipolar transistors Q1 and Q2 whose emitters are coupled together, and the quadritail circuit 3 is formed of second balanced pair of transistors Q3 and Q4 and third balanced pair of transistors Q5 and Q6. Emitters of the transistors Q3, Q4, Q5 and Q6 are connected in common to a first constant current source (current: $I_0$) for driving them.

A divider circuit 4 for supplying a first input signal $V_1$ to the first differential pair 1 is formed of two first resistors (resistance: R1) and two second resistors (resistance: ($\tfrac{1}{2}$)R2) connected in series, which are provided between bases of the transistors Q3 and Q4 or between a pair of input terminals 5. The transistors Q5 and Q6 have bases coupled together to be applied with a bias voltage equal to the middle point voltage of $V_1$ or $V_2$.

PNP bipolar transistors Q7 and Q8 compose a first current mirror circuit and NPN bipolar transistors Q9 and Q10 compose a second current mirror circuit.

Emitters of the transistors Q7 and Q8 are coupled together to be applied with a power source voltage VCC, and further connected to collectors of the transistors Q5 and Q6. The collectors coupled together of the transistors Q3 and Q4 are connected in common to the collector of the transistor Q7. Bases of the transistors Q7 and Q8 are coupled together to be connected to the collector of the transistor Q7.

A collector of the transistor Q8 is connected to collector of the transistor Q9. Bases of the transistors Q9 and Q10 are coupled together to be connected to the collector of the transistor Q9. A collector of the transistor Q10 is connected to emitters coupled together of the transistors Q1 and Q2 of the first differential pair 1.

The first differential pair 1 is driven by the output current $I^+$ of the quadritail circuit 3 through the first and second current mirror circuits.

The operation of the differential amplifier circuit of the eighth embodiment is similar to that of the seventh embodiment shown in FIG. 11 excepting that the output current $I^+$ of the quadritail circuit 3 is supplied to the first differential pair 1 through the first and second current mirror circuits.

[Ninth embodiment]

Figure 16:
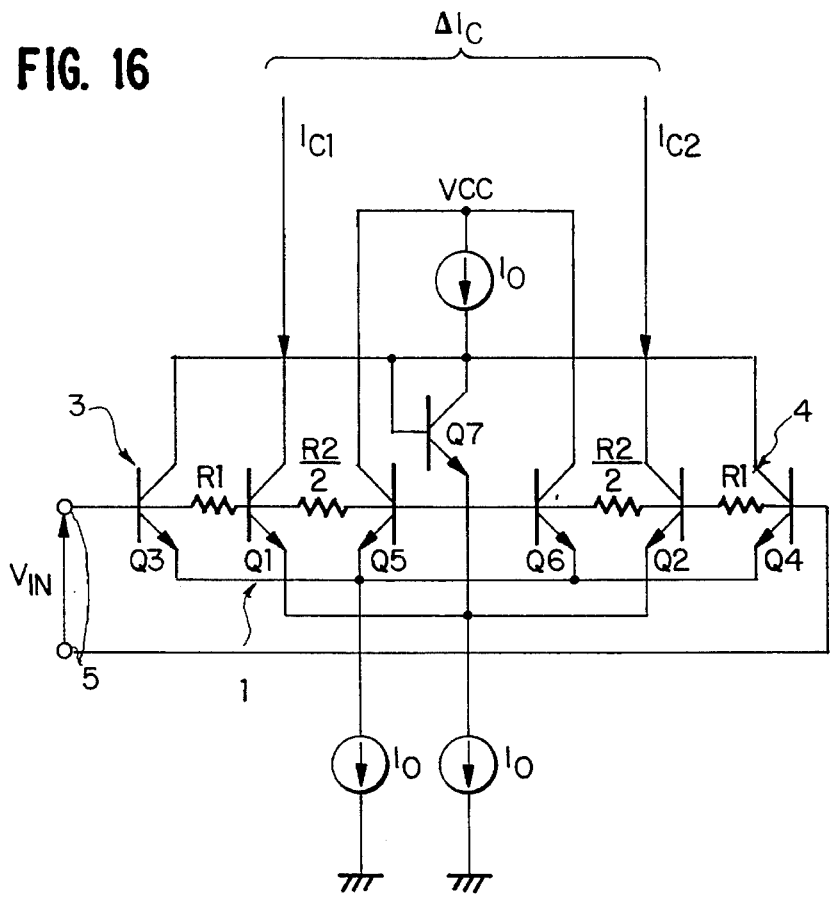
FIG. 16 is a circuit diagram of a differential amplifier circuit according to a ninth embodiment of the present invention, in which the transistor pair is driven by an output current of the squarer through a current shifting circuit.

FIG. 16 shows a differential amplifier circuit as an OTA of a ninth embodiment. In this embodiment, an output current of a quadritail circuit 3 is supplied to a first balanced differential pair 1 through a current shifting circuit in place of cascaded current mirror circuits, so that there is an additional advantage that the dc voltage level of the input signal can be reduced compared with the second embodiment, similar to the eighth embodiment.

In FIG. 16, the first differential pair 1, the quadritail circuit 3, a divider circuit 4 for the first differential pair 1, and a first constant current source (current: $I_0$) for driving second and third balanced pairs of the quadritail circuit 3 are the same in configuration as those of the eighth embodiment, respectively.

The current shifting circuit is composed of an NPN bipolar transistor Q7 and second and third constant current sources (current: $I_0$) therefor. An emitter of the transistor Q7 is connected to emitters coupled together of the transistors Q1 and Q2 of the first differential pair 1, and the second constant current source (current: $I_0$) for driving the transistor Q7 is connected to the connection point of these emitters.

A base and a collector of the transistor Q7 are connected in common to collectors coupled together of the transistors Q3 and Q4 of the quadritail circuit 3. The third constant current source (current: $I_0$) for current shift is provided between the collectors coupled together of the transistors Q5 and Q6 and the collectors coupled together of the transistors Q3 and Q4. The collectors of the transistors Q5 and Q6 are applied with a power source voltage VCC.

[Tenth embodiment]

Figure 17:
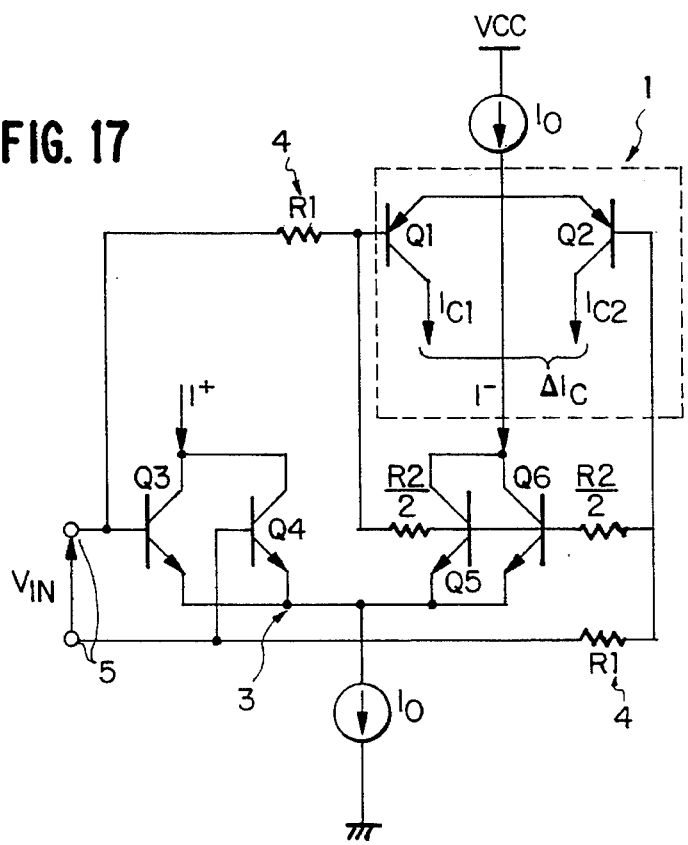
FIG. 17 is a circuit diagram of a folded differential amplifier circuit or a "folded OTA" according to a tenth embodiment of the present invention.

FIG. 17 shows a folded differential amplifier circuit of a tenth embodiment, which is called as a folded OTA. In this embodiment, a first balanced differential pair 1 is formed of PNP bipolar transistors Q1 and Q2.

In FIG. 17, the first differential pair 1, a quadritail circuit 3, a divider circuit 4, and a first constant current source (current: $I_0$) for driving second and third balanced pairs of the quadritail circuit 3 are the same in configuration as those of the eighth embodiment shown in FIG. 15, respectively.

The first balanced differential pair 1 is driven by an output current $I^-$ of the quadritail circuit 3. A second constant current source (current: $I_0$) for driving the pair 1 is provided between emitters coupled together of the transistors Q1 and Q2 and a power source (voltage: VCC).

The operation of the differential amplifier circuit of the tenth embodiment is similar to that of the eighth embodiment excepting that the output current $I^-$ of the quadritail circuit 3 drives the first differential pair 1.

In the tenth embodiment, the first balanced differential pair 1 may be formed of NPN bipolar transistors, and in this case, the quadritail circuit 3 may be folded by using PNP bipolar transistors, in which the power source and ground are upside down.

[Eleventh embodiment]

Figure 18:
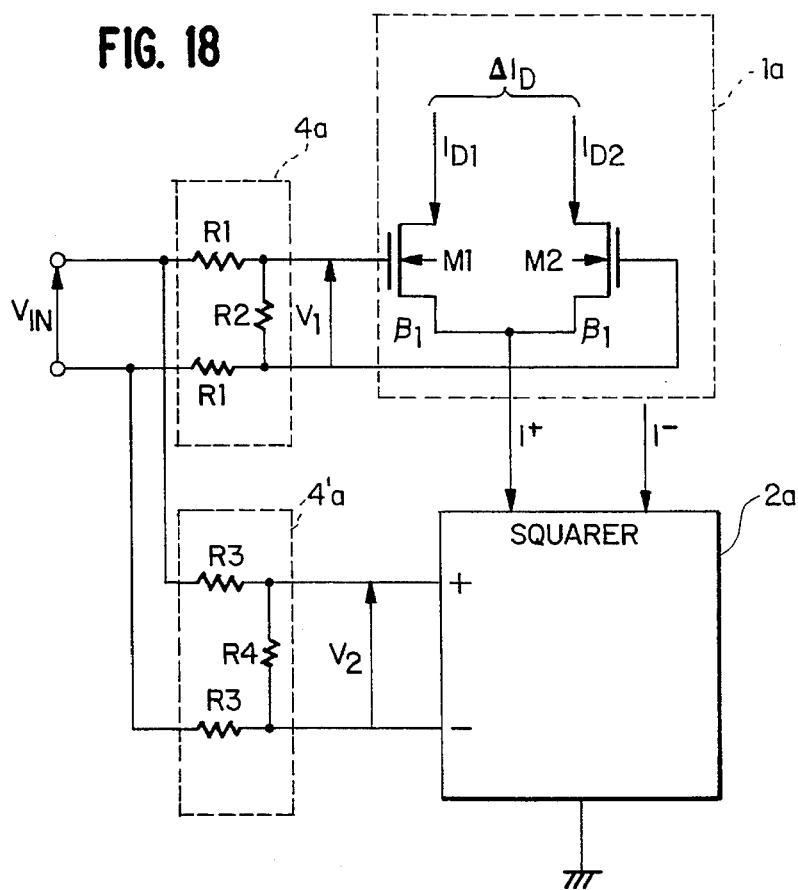
FIG. 18 is a circuit diagram of a differential amplifier circuit according to a eleventh embodiment of the present invention, in which MOS transistors are employed.

FIG. 18 shows a differential amplifier circuit as an OTA of an eleventh embodiment. In FIG. 18, a balanced differential pair 1a formed of first and second MOS transistors M1 and M2 whose gate-width to gate-length ratios (W/L) are equal to each other, and a squarer 2a as a driver circuit for driving the differential pair 1a by its output current. In the first differential pair 1a, a first input signal (voltage: $V_1$) is applied to input ends or gates of the N-channel transistors M1 and M2. In the squarer 2a, a second input signal (voltage: $V_2$) is applied to input ends thereof. Sources of the transistors M1 and M2 are connected in common to one of output ends of the squarer 2a. The differential pair 1a is driven by an output current $I^+$ of the squarer 2a. An output current $I^-$ thereof is not used therefor.

The differential pair 1a and the squarer 2a contain divider circuits 4a and 4a', respectively. The divider circuit 4a is composed of two first resistors (resistance: R1) connected respectively to the gates of the transistors M1 and M2 and a second resistor (resistance: R2) connected between the gates of the transistors M1 and M2. The first resistors are connected to a pair of input terminals 5a, respectively.

Similarly, the divider circuit 4a' is composed of two third resistors (resistance: R3) connected respectively to the input ends of the squarer 2a and a fourth resistor (resistance: R4) connected between the input ends thereof. The third resistors are connected to the pair of the input terminals 5a, respectively.

An input signal (voltage: $V_{IN}$) to be amplified is applied to the pair of the input terminals 5a. The first input signal $V_1$ is generated by voltage division from the input signal $V_{IN}$ through the divider circuit 4 to be applied to the gates of the transistors M1 and M2 of the differential pair 1a. The second input signal $V_2$ is generated by voltage division from the input signal $V_{IN}$ through the divider circuit 4a' to be applied to the input ends of the squarer 2a.

Next, the operation of the differential amplifier circuit of the eleventh embodiment is described below.

The transconductance of the differential pair 1a formed of the transistors M1 and M2 can be obtained as follows:

We suppose that the characteristics of the transistors M1 and M2 are matched with each other, the body effect and the channel-length modulation can be ignored, the transistors M1 and M2 are operating in the saturation regions, and the differential pair 1a which is applied with the first input signal $V_1$ is driven by a constant current $I_{SS}$. Then, a differential output current $\Delta I_D$ of the differential pair 1a can be given as the following equations (15a) and (15b). The differential output current $\Delta I_C$ is expressed as $\Delta I_C = I_{C1} - I_{C2}$ where $I_{C1}$ and $I_{C2}$ are collector currents of the transistors Q1 and Q2, respectively.

$$\Delta I_D = \beta_1 V_1 \times \sqrt{[(2I_{SS}/\beta_1) - V_1^2]} \quad (|V_1| \leq \sqrt{(I_0/\beta_1)}) \quad (15a)$$

$$\Delta I_D = I_{SS} \times \text{sgn}(V_1) \, (|V_1| \geq \sqrt{(I_0/\beta_1)}) \quad (15b)$$

In the equations (15a) and (15b), $\beta_1$ is the transconductance parameter of the transistor M1 and M2 which is defined as $\beta_1 = \mu(C_{OX}/2)(W/L)_1$, where $\mu$ is the effective mobility of the carrier, $C_{OX}$ is the gate oxide capacitance per unit area, W is a gate width and L is a gate length.

The transconductance of the differential amplifier of the eleventh embodiment can be obtained by differentiating the equations (15a) and (15b) by the input voltage $V_1$ as the following equations (16a) and (16b).

$$[d(\Delta I_D)/dV_1] = \beta_1 \sqrt{[(2I_{SS}/\beta_1) - V_1^2]} - \quad (16a)$$

$$\{(\beta_1 \times V_1^2)/\sqrt{[(2I_{SS}/\beta_1) - V_1^2]}\} \, (|V_1| \leq \sqrt{(I_0/\beta_1)})$$

$$[d(\Delta I_D)/dV_1] = 0 \, (|V_1| \geq \sqrt{(I_0/\beta_1)}) \quad (16b)$$

Figure 19:
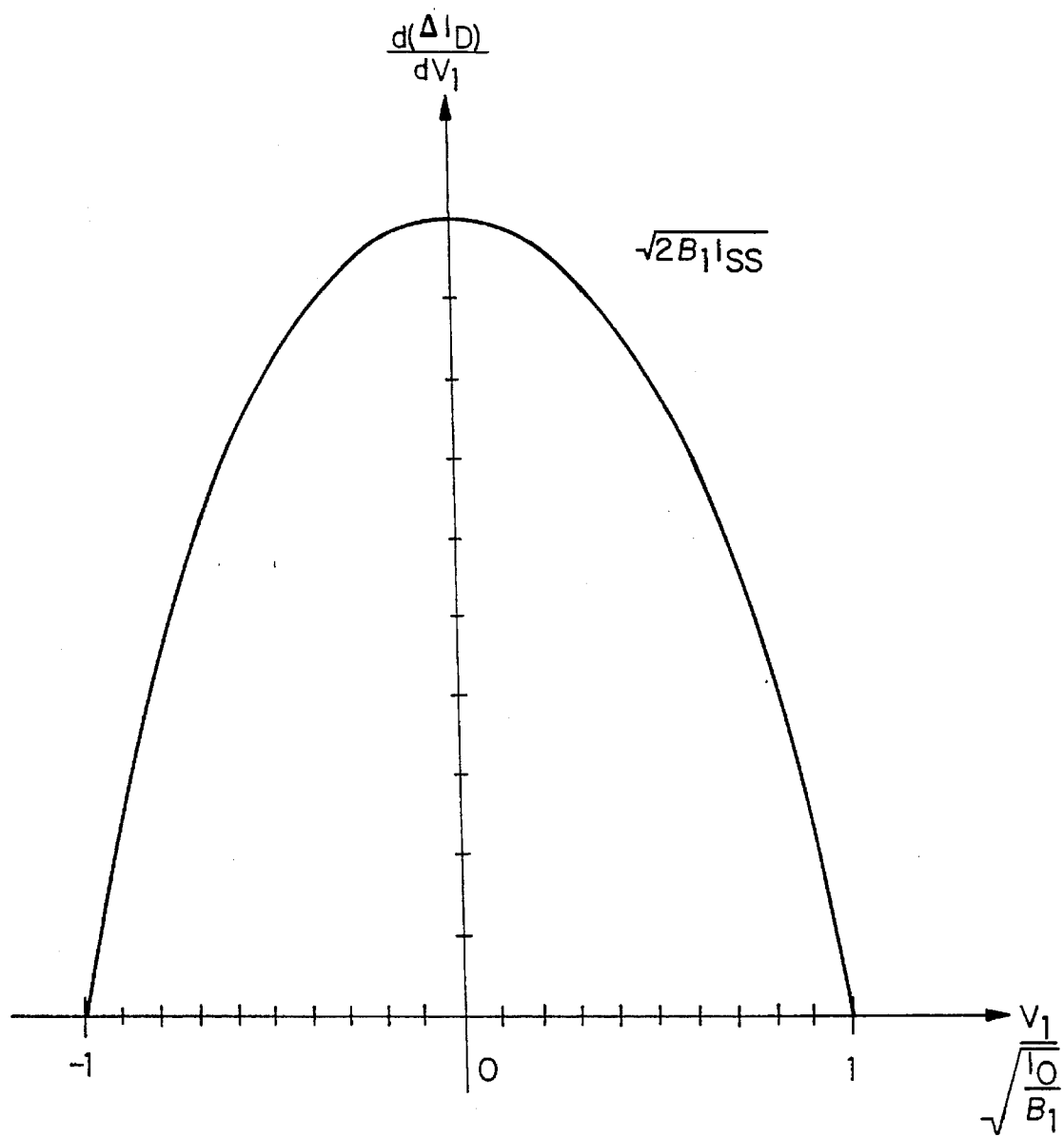
FIG. 19 shows a transconductance characteristic of the MOS transistor pair in the differential amplifier circuit indicated in FIG. 18.

FIG. 19 shows the transconductance characteristic of the differential pair 1a, which is obtained from the equations (16a) and (16b). It is seen from FIG. 19 that the curve of the transconductance characteristic is approximately a parabola in shape, which means that it has the square-law characteristic.

It can be seen that the term of $V_1^2$ in the square root in the equation (15a) can be removed if a current whose characteristic is in proportion to the square of the input voltage $V_1$ or $V_1^2$ is added to the driving current $I_{SS}$, or the driving current $I_{SS}$ includes a component of $V_1^2$. As seen from the equation (16a), the transconductance of the differential pair 1a is in proportion to the square root of the driving current $I_{SS}$, or $I_{SS}^{1/2}$.

With the differential amplifier circuit of the eleventh embodiment, the differential pair 1a is driven by the output current $I^+$ of the squarer 2a, so that it can be compensated in transconductance linearity. In addition, the input voltage range can be expanded without increase of device or element number.

[Twelfth Embodiment]

Figure 20:
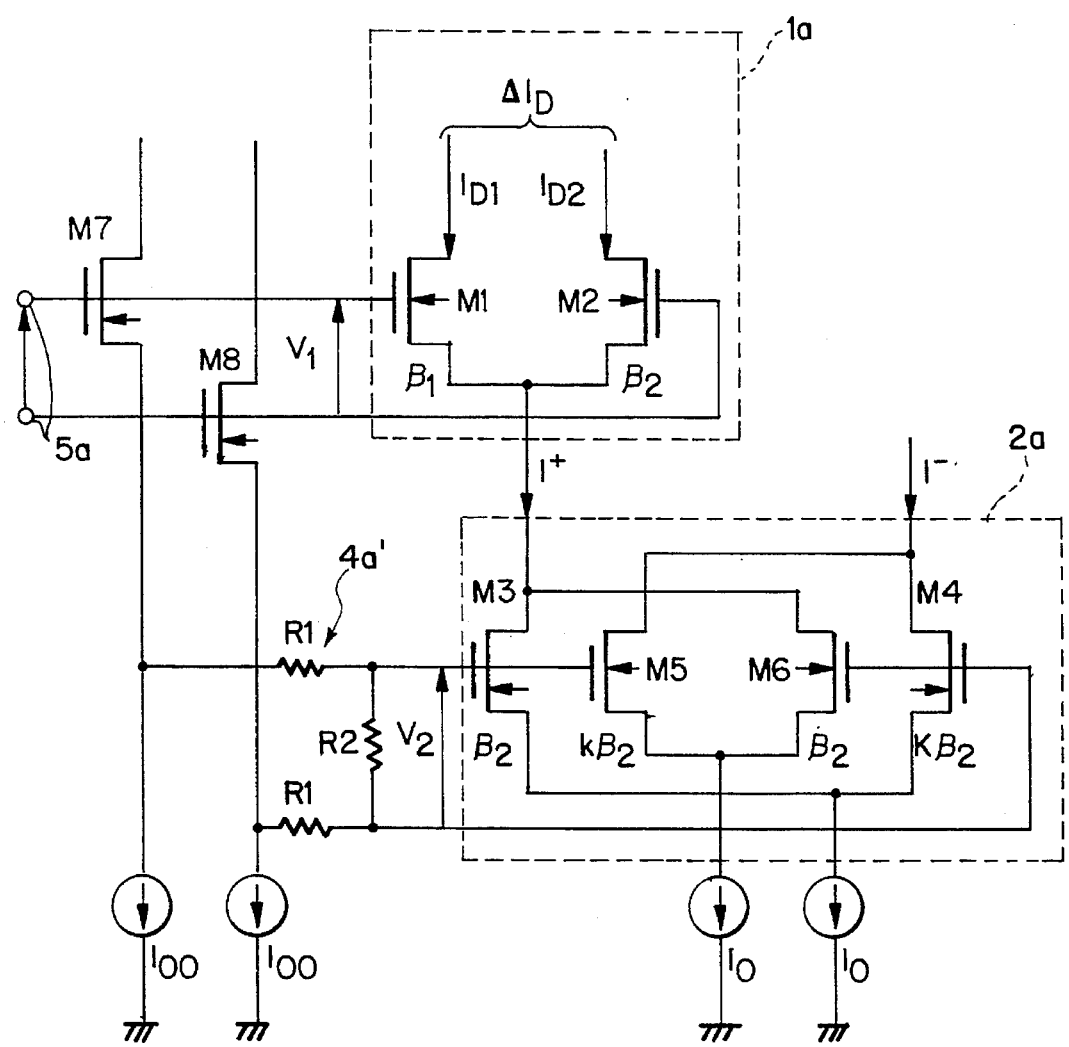
FIG. 20 is a circuit diagram of a differential amplifier circuit according to a twelfth embodiment of the present invention.

FIG. 20 shows a differential amplifier circuit as an OTA of a twelfth embodiment. In FIG. 20, a first balanced differential pair 1a is formed of N-channel MOS transistors M1 and M2 similar to that of the eleventh embodiment. A divider circuit 4a' for a squarer 2a is formed of two first resistors (resistance: R1) and a second resistor (resistance: R2). No divider circuit for the differential pair 1a is provided. Therefore, a first input signal voltage $V_1$ for the differential pair 1a is equal to a signal voltage $V_{IN}$ to be amplified, and a second input signal voltage $V_2$ for the squarer 2a is generated by dividing the voltage $V_{IN}$ through the divider circuit 4a'.

The squarer 2a is comprised of a second unbalanced differential pair of N-channel MOS transistors M3 and M4 whose capacities or gate-width to gate-length ratios are different from each other, and a third unbalanced differential pair of N-channel MOS transistors M5 and M6 whose capacities or gate-width to gate-length ratios are different from each other.

The transistor M4 is K times in gate-width to gate-length ratio as large as the transistor M3, and the transistor M5 is K times in gate-width to gate-length ratio as large as the transistor M6, where K≠1. Therefore, when the transconductance parameter of the transistor M3 is $\beta_2$, that of the transistor M4 is $K\beta_2$. Similarly, when the transconductance parameter of the transistor M6 is $\beta_2$, that of the transistor M5 is $K\beta_2$.

The transconductance parameters of the transistors M1 and M2 are both $\beta_1$.

Sources of the transistors M3 and M4 of the second differential pair are connected in common to a first constant current source (current: $I_0$) for driving them, and sources of the transistors M5 and M6 of the third differential pair are connected in common to a second constant current source (current: $I_0$) for driving them.

Gates of the transistors M3 and M5 are connected in common and those of the transistors M4 and M6 are connected in common.

Drains of the transistors M3 and M6 are connected in common to form one of output ends of the squarer 2a, from which an output current $I^+$ is derived. The drains thus common-connected are connected to sources of the transistors M1 and M2 of the differential pair 1a to drive the pair 1a by the current $I^+$. The drains of the transistors M4 and M5 are connected in common to form the other of the output ends thereof, from which an output current $I^-$ is derived.

In other words, input ends or the gates of the second and third differential pairs are cross-coupled and output ends or the drains thereof are parallel-coupled.

There are provided with N-channel MOS transistors M7 and M8. Gates of the transistors M7 and M8 are respectively connected to input terminals 5 to be applied with the signal $V_{IN}$ to be amplified. Sources of the transistors M7 and M8 are respectively connected to third and fourth constant current sources (current: $I_{00}$) for driving them, respectively.

One of the first resistors (resistance: R1) of the division circuit 4a' is connected between the common-connected gates of the transistors M3 and M5 and the source of the transistor M7. The other of the first resistors (resistance: R1) thereof is connected between the common-connected gates of the transistors M4 and M6 and the source of the transistor M8. The second resistor (resistance: R2) of the division circuit 4a' is connected between the common-connected gates of the transistors M3 and M5 and those of the transistors M4 and M6.

Next, the operation of the differential amplifier circuit of the twelfth embodiment is described below.

The output current $I_+$ of the squarer 2a is expressed as the following equation (17).

$$I^+ = [(2I_0)/(K+1)] + \{[2K(K-1) \cdot \beta_2]/(K+1)^2 \cdot V_1^2\}(|V_2| \leq \sqrt{[I_0/(K \times \beta_2)]}). \quad (17)$$

It is seen from the equation (17) that the output current $I^+$ has the ideal square-law characteristic within the limited input voltage range. This circuit analysis is disclosed in detail by the inventor K. kimura in IEEE Transactions, CAS-I, Vol. 39, No. 9, PP. 771–777, September, 1992.

When the input voltage range increases in amplitude, the current $I^+$ does not show the ideal square-law characteristic gradually. Further, when the input voltage becomes to be equal to or larger than $(I_0/\beta)^{1/2}$, the circuit does not operate due to saturation.

Figure 21:
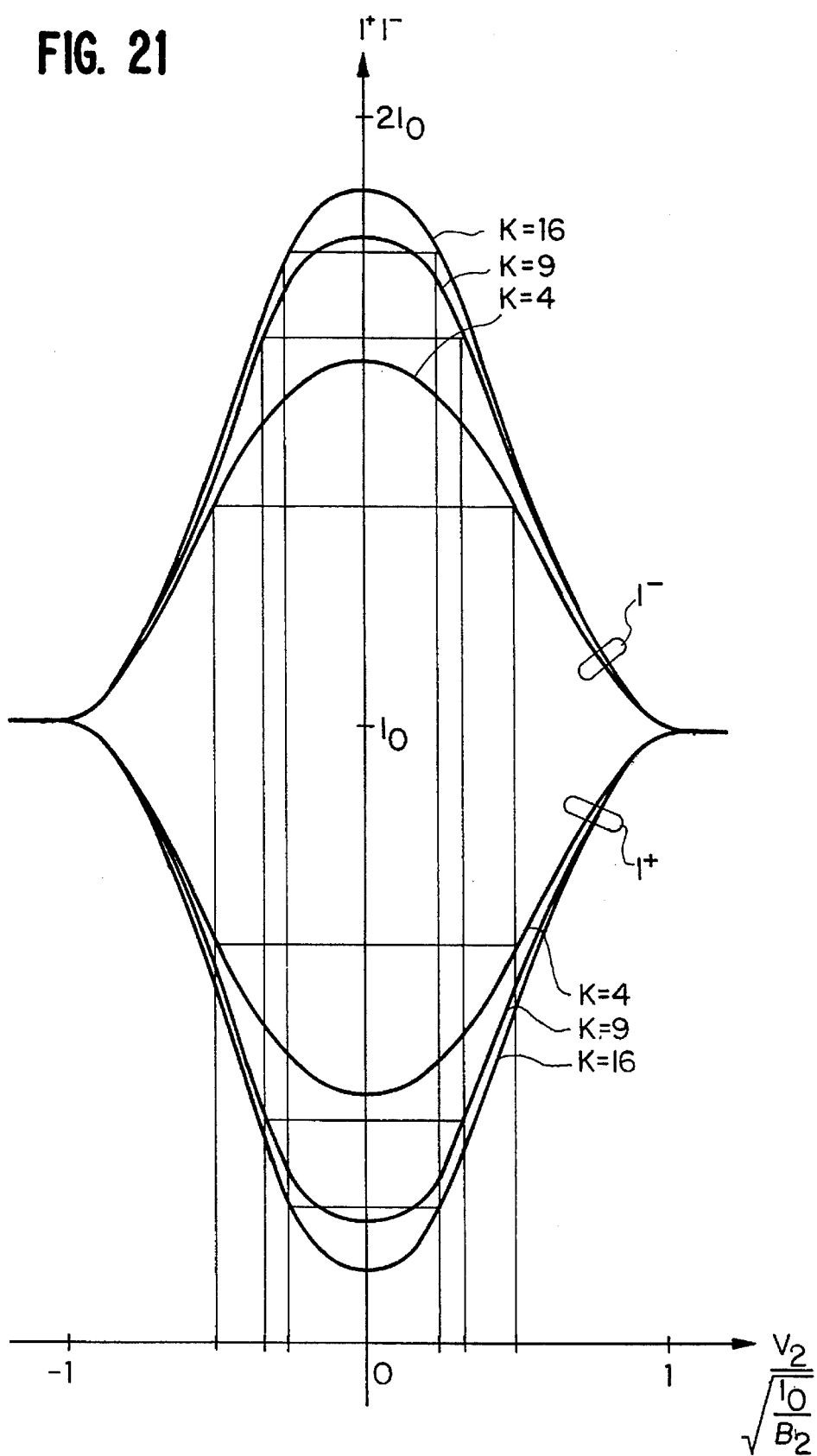
FIG. 21 shows output current characteristics of the squarer in the differential amplifier circuit shown in FIG. 20 with the parameter K.

The output current characteristics of the squarer 2a is shown in FIG. 21, which is obtained from the equation (8).

In the differential amplifier circuit of the twelfth embodiment, the first differential pair 1a is driven by the output current $I^+$ of the squarer 2a. Then, the following equation (18) can be obtained by replacing the current $I_{SS}$ with the current $I^+$ in the equation (15a).

$$\Delta I_D = \beta_1 \times \frac{V_{IN}}{C} \times \sqrt{\left\{ \frac{4}{(K+1)} \times \frac{I_0}{\beta_1} + \frac{4K(K-1) \times \beta_2}{(K+1)^2 \times \beta_1} - \frac{1}{C^2} \right\} \times V_{IN}^2} \quad (|V_{IN}| \leq \sqrt{[I_0/(K \times \beta_2)]}) \quad (18)$$

where $V_1 = V_{IN}/C$ and $V_2 = V_{IN}$.

To make the transconductance of the differential pair 1a shown in the equation (9) linear, the following equation (19) is required to be established.

$$\frac{(K+1)^2 \times \beta_1}{4K \times (K-1) \times \beta_2} = C^2 \quad (19)$$

When C=1 and $\beta_1 = \beta_2$ in the equation (19), the first and second input signals $V_1$ and $V_2$ are equal in value to each other, which is equivalent to the conventional OTA disclosed by Nedungadi and Viswanathan. At this time, $K=1+\frac{2}{3}^{1/2} \approx 2.1547$ if K is larger than 1. The value 2.1547 is approximately equal to the value 2.155 shown by Nedungadi and Viswanathan.

Nedungadi and Viswanathan carried out the SPICE simulation (MODEL. 2) in which the parameter K was set as 2, 2.1, 2.155, 2.2 and 2.3, and they reported from the simulation result that nonlinearity of the transconductance was limited to 0.1% or less.

The circuit model used in the SPICE simulation (MODEL. 2) is not in accordance with the square-law characteristic as shown in the equation (18) but is obtained by modifying the Shockley's equation. In the twelfth embodiment, however, the theoretical value of the parameter K is only rounded or approximate by about 0.014%, so that it can be said that the approximation using the squarer 2a is sufficiently effective.

Figure 22:
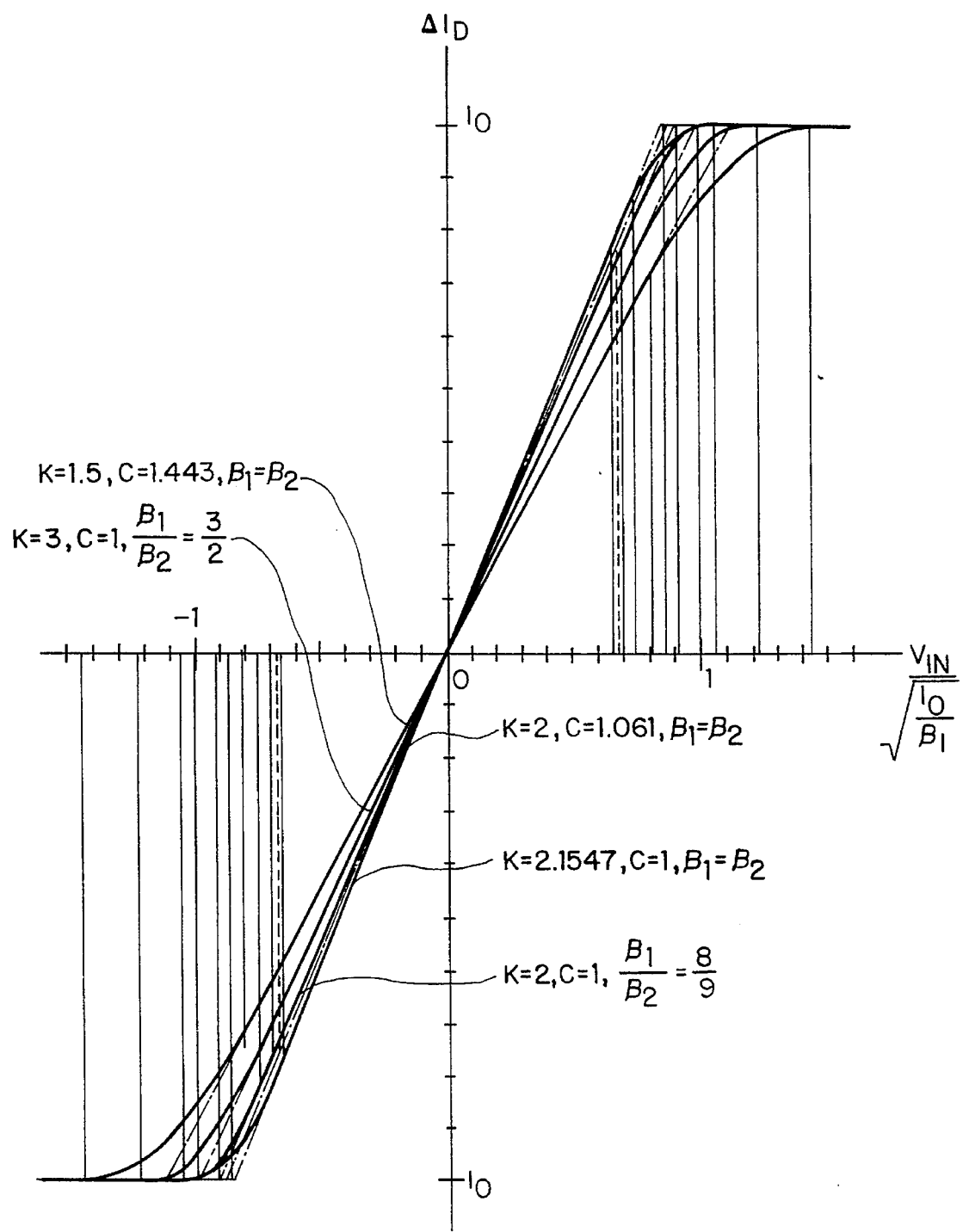
FIG. 22 shows transfer characteristics of the differential amplifier circuit shown in FIG. 20 with the parameters K, C, $\beta_1$ and $\beta_2$.

FIG. 22 shows the transfer characteristics of the differential amplifier circuit of the twelfth embodiment, which is obtained from the equation (18).

In the squarer 2a, the input voltage range having the ideal square-law characteristic varies inversely proportional to $(K\beta_2/\beta_1)^{1/2}$, so that the range becomes wider as the parameter K decreases in value. For example, in the case of K=2 and $\beta_1 = \beta_2$, C=0.9428, and in the case of K=1.5 (or 2:3) and $\beta_1 = \beta_2$, C=0.69282. In these cases, the input voltage range in which the transconductance is 0.1% or less in nonlinearity can be expanded by 3.8% and 19.9% compared with the conventional OTA disclosed by Nedungadi and Viswanathan, respectively.

Figure 23:
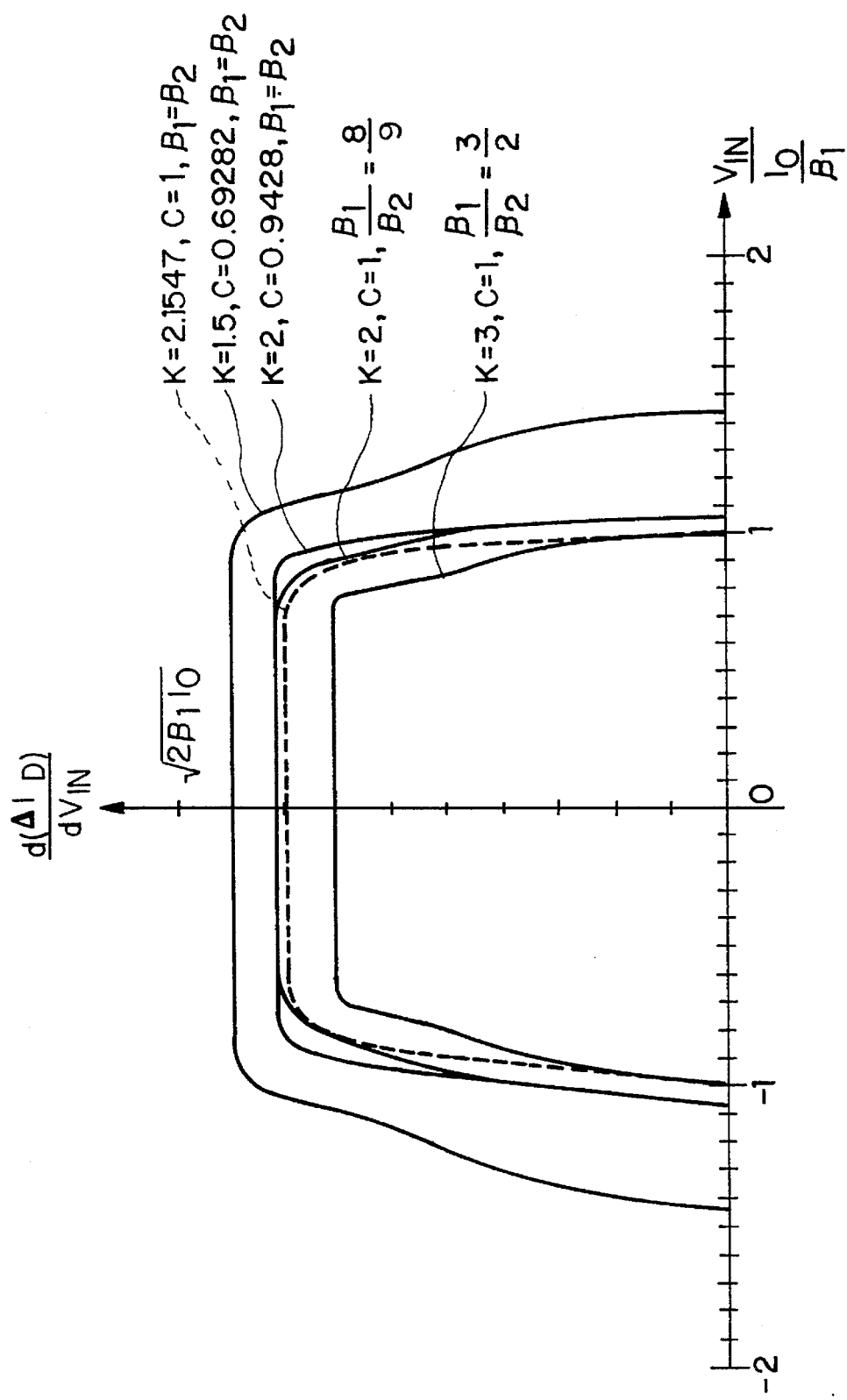
FIG. 23 shows transconductance characteristics of the differential amplifier circuit shown in FIG. 20 with the parameters K, C, $\beta_1$ and $\beta_2$.

FIG. 23 shows the transconductance characteristics of the differential amplifier circuit of the twelfth embodiment, which is obtained through calculation using the theoretical values. In FIG. 23, there are shown curves where K=2, $\beta_1=\beta_2$ and C= 0.9428, and K=1.5 (or 2:3), $\beta_1=\beta_2$ and C=0.69282. It is seen from FIG. 23 that the transconductance becomes exactly linear within the limited input voltage range in theory.

In FIG. 23, there is also shown for reference the transconductance characteristic of the conventional OTA disclosed by Nedungadi and Viswanathan, where K=2.1547, $\beta_1=\beta_2$ and C=1.

As seen from the above description in the twelfth embodiment, in general, the differential amplifier circuit or OTA formed of MOS transistors is better in transconductance linearity than that formed of bipolar transistors by about one digit or figure.

When C=1, the transconductance parameters $\beta_1$ and $\beta_2$ may be set to satisfy the relationship of $$(K+1)^2 \cdot \beta_1 = 4K \cdot (K-1)^2 \cdot \beta_2$$

Concretely, the gate-width to gate-length ratio $(W/L)_1$ of the transistors M1 and M2 forming the first differential pair 1a and that $(W/L)_2$ of the transistors M3, M4, M5 and M6 forming the squarer 2a satisfy the relationship of $$(K+1)^2 \cdot (W/L)_1 = 4K \cdot (K-1)^2 \cdot (W/L)_2$$

This relationship is easy to be realized. For example, K= 2 and $(\beta_1/\beta_2)$=8/9 or K=3 and $(\beta_1/\beta_2)$=3/2 satisfies the relationship. However, the input voltage range in which the transconductance linearity is 0.1% or less is reduced by 2.1% and 21.1% compared with the conventional OTA disclosed by Nedungadi and Viswanathan, respectively. On the other hand, there arises an additional advantage that no divider circuit of resistors is required for both of the first differential pair 1a and the squarer 2a and that the first differential pair 1a and the squarer 2a can be formed of only MOS transistors. This means that all of the MOS transistors can be composed of only basic unit transistors and as a result, the differential amplifier circuit can be composed of CMOS transistor arrays such as CMOS gate arrays.

[Thirteenth embodiment]

Figure 24:
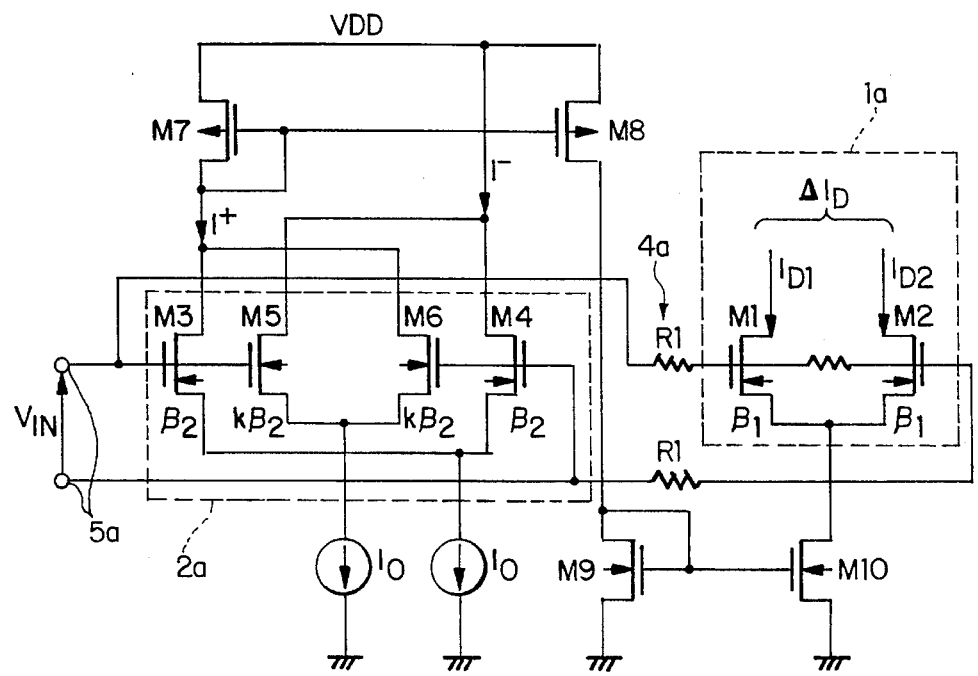
FIG. 24 is a circuit diagram of a differential amplifier circuit according to a thirteenth embodiment of the present invention, in which the transistor pair and the squarer are connected in cascade through two current mirror circuits.

FIG. 24 shows a differential amplifier circuit as an OTA of a thirteenth embodiment. In this embodiment, a first balanced differential pair 1a and a squarer 2a are connected in cascade to each other through two current mirror circuits, so that there is an additional advantage that the dc voltage level of the input voltage can be reduced compared with the twelfth embodiment.

In FIG. 24, the first differential pair 1, the squarer 2a and first and second constant current sources (current: $I_0$) for respectively driving second and third unbalanced differential pairs of the squarer 2a are the same in configuration as those of the twelfth embodiment, respectively. Different from the twelfth embodiment, no divider circuit 4a' for the squarer 2a is provided and a divider circuit 4a for the differential pair 1a is provided instead. The divider circuit 4a is formed of two first resistors (resistance: $R_1$) which are connected respectively to gates of the N-channel MOS transistors M1 and M2 of the first differential pair 1a and a second resistor (resistance: $R_2$) which is connected between gates of the transistors M1 and M2.

P-channel MOS transistors M7 and M8 compose a first current mirror circuit and P-channel MOS transistors M9 and M10 compose a second current mirror circuit. The first current mirror circuit is driven by the output current $I^+$ of the squarer 2a, and the second current mirror circuit is driven by the output current of the first current mirror circuit.

Sources of the transistors M7 and M8 are coupled together to be applied with a power source voltage VDD. The drains coupled together of the transistors M3 and M6 are connected in common to the drain of the transistor M7. The drains coupled together of the transistors M4 and M5 are connected in common to the sources of the transistors M7 and M8 to be applied with the power source voltage VDD.

The first differential pair 1a is driven by the output current $I^+$ of the squarer 2a through the first and second current mirror circuits.

The operation of the differential amplifier circuit of the thirteenth embodiment is similar to that of the twelfth embodiment excepting that the output current $I^+$ of the squarer 2a is supplied to the first differential pair 1a through the first and second current mirror circuits and that the first and second input signals $V_1$ and $V_2$ are different in value due to the divider circuit 4a.

[Fourteenth embodiment]

Figure 25:
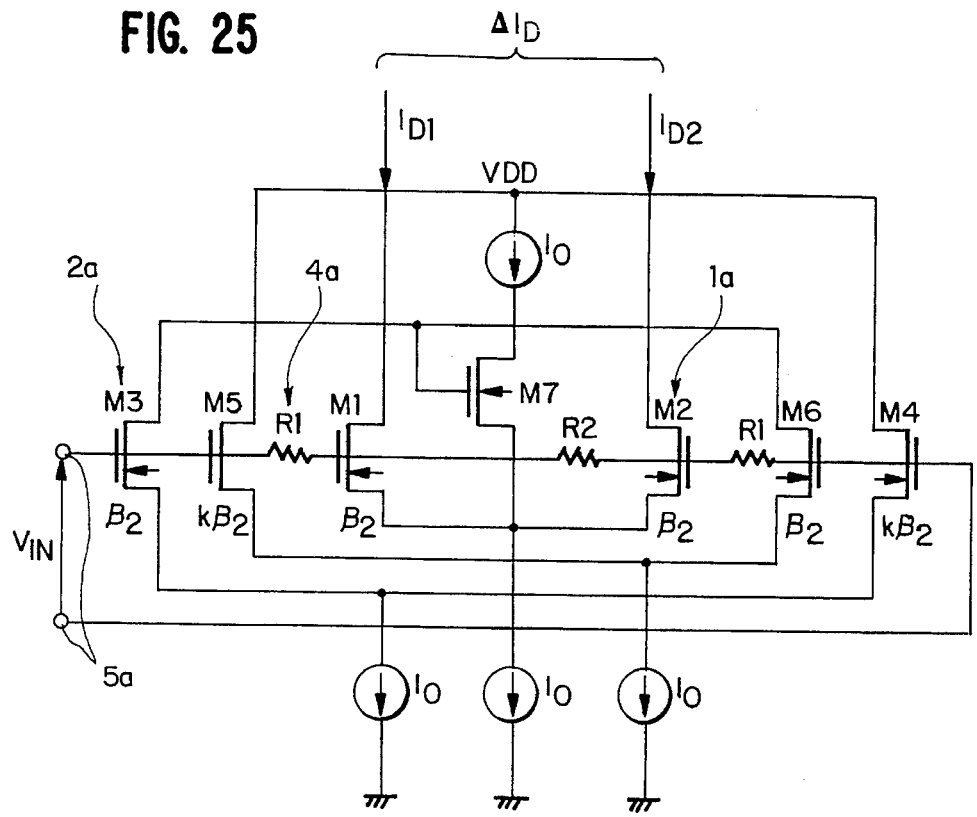
FIG. 25 is a circuit diagram of a differential amplifier circuit according to a fourteenth embodiment of the present invention, in which the transistor pair is driven by an output current of the squarer through a current shifting circuit.

FIG. 25 shows a differential amplifier circuit as an OTA of a fourteenth embodiment. In this embodiment, an output current of a squarer 2a is supplied to a first balanced differential pair 1a through a current shifting circuit, so that there is an additional advantage that the dc voltage level of the input voltage can be reduced compared with the twelfth embodiment, similar to the thirteenth embodiment.

In FIG. 25, the first differential pair 1a, the squarer 2a, a divider circuit 4a, and first and second constant current sources (current: $I_0$) for respectively driving second and third unbalanced differential pairs of the squarer 2a are the same in configuration as those of the thirteenth embodiment, respectively.

The current shifting circuit is composed of an N-channel MOS transistor M7 and third and fourth constant current sources (current: $I_0$) therefor. A source of the transistor M7 is connected to sources of the transistors M1 and M2 of the first balanced differential pair 1a, and the third constant current source for driving the transistor M7 is connected to the connection point of these sources.

A gate and a drain of the transistor M7 are connected in common to drains coupled together of the transistors M3 and M6 of the squarer 2a. The fourth constant current source (current: $I_0$) for current shift is provided between the drains of the transistors M3 and M6 and the drains coupled together of the transistors M4 and M5. The drains of the transistors M4 and M5 and the fourth constant current source for current shift are applied with a power source voltage VDD.

[Fifteenth embodiment]

Figure 26:
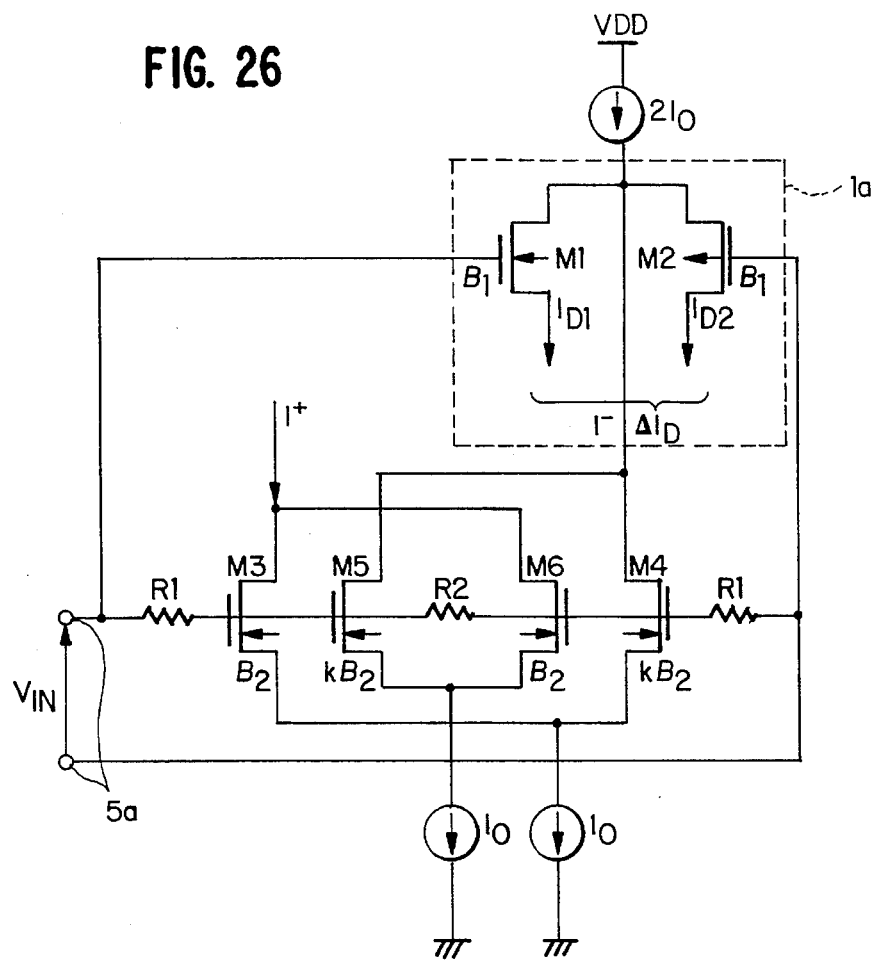
FIG. 26 is a circuit diagram of a folded differential amplifier circuit or a "folded OTA" according to a fifteenth embodiment of the present invention.

FIG. 26 shows a folded differential amplifier circuit of a fifteenth embodiment, which is called as a folded OTA. In this embodiment, a first balanced differential pair 1a is folded by using P-channel MOS transistors M1 and M2, different from the twelfth embodiment in FIG. 20.

In FIG. 26, a squarer 2a, a divider circuit 4a', and first and second constant current sources (current: $I_0$) for respectively driving second and third unbalanced differential pairs of the squarer 2a are the same in configuration as those of the twelfth embodiment, respectively.

The first balanced differential pair 1a is driven by an output current $I^-$ of the squarer 2a. A third constant current source (current: $2I_0$) for driving the pair 1a is provided between sources coupled together of the transistors M1 and M2 and a power source (voltage: VDD).

The operation of the differential amplifier circuit of the thirteenth embodiment is similar to that of the twelfth embodiment excepting that the output current $I^-$ of the squarer $2a$ drives the first differential pair $1a$.

In the fifteenth embodiment, the first balanced differential pair $1a$ may be formed of N-channel MOS transistors, and in this case, the squarer $2a$ may be folded by using P-channel MOS transistors, in which the power source and ground are upside down.

In addition, the current value of the current source is set as $2I_0$, however, it may be $aI_0$ where a is a constant other than 2.

[ Sixteenth embodiment ]

Figure 27:
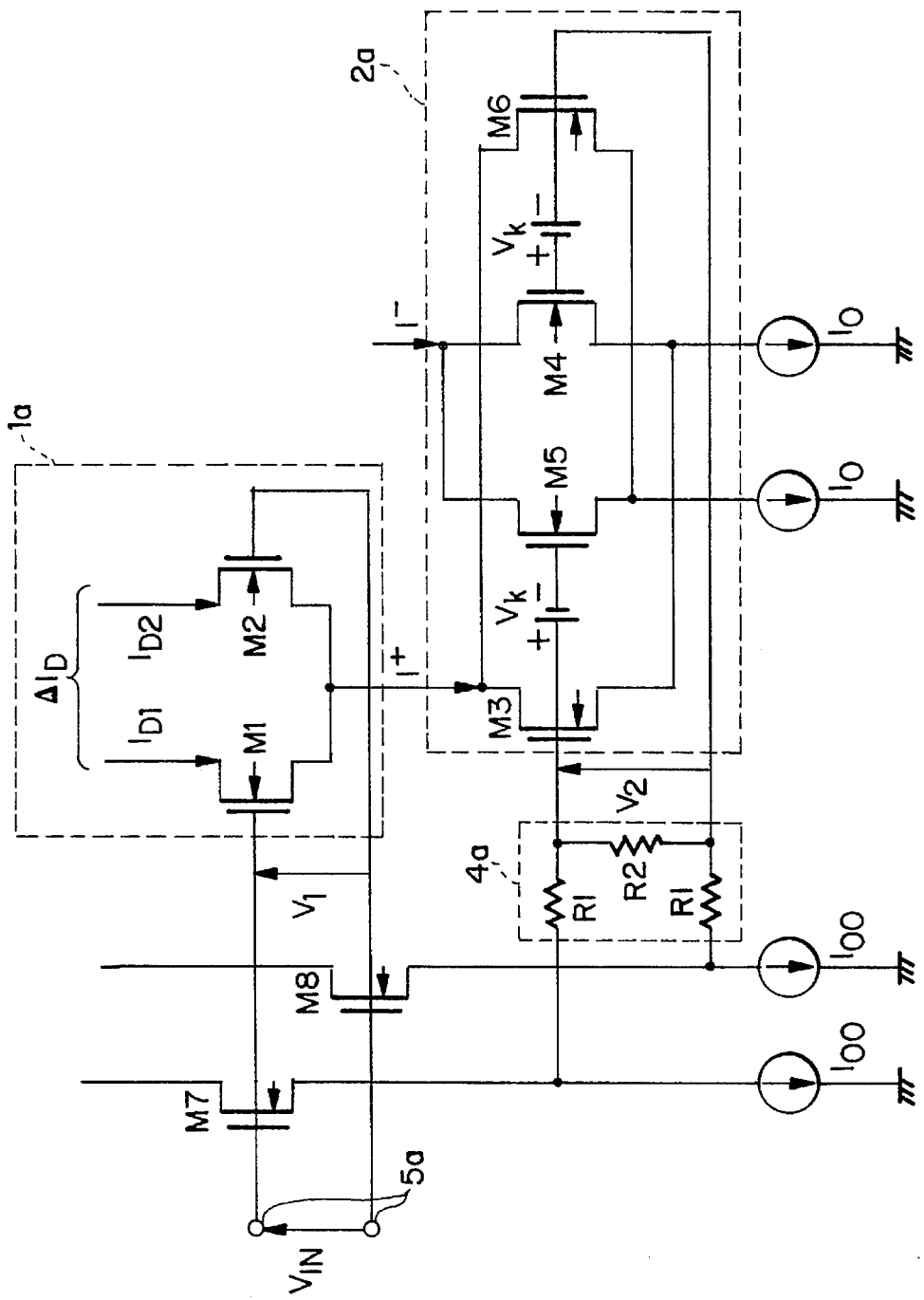
FIG. 27 is a circuit diagram of a differential amplifier circuit according to a sixteenth embodiment of the present invention.

FIG. 27 shows a differential amplifier circuit as an OTA of a sixteenth embodiment. This embodiment is the same in configuration as the twelfth embodiment shown in FIG. 20 excepting that a squarer $2a$ is formed of second and third balanced differential pairs. The second differential pair is formed of N-channel MOS transistors M3 and M4 whose gate-width to gate-length ratios are equal to each other. The third differential pair is formed of N-channel MOS transistors M5 and M6 whose gate-width to gate-length ratios are equal to each other.

As shown in FIG. 27, there are provided with first and second dc voltage sources (voltage: $V_K$) for generating offset bias voltages, additionally. The first voltage source is connected between gates of the transistors M3 and M5 and the second voltage source is connected between gates of the transistors M4 and M6. The positive ends of the first and second voltage sources are connected to the gates of the transistors M3 and M6, respectively.

The bias offset voltages generated by the first and second voltage sources are supplied to the second and third differential pairs of the squarer $2a$, respectively. As a result, the output current $I^+$ of the squarer $2a$ can be expressed as the following equation (20) in the limited input voltage range.

$$I^+ = I_0 + \left\{ \left(\frac{\beta_2}{2}\right) \times (V_2 - V_K) \times \sqrt{\left(\frac{2I_0}{\beta_2}\right) - (V_2 - V_K)^2} - \left(\frac{\beta_2}{2}\right) \times (V_2 + V_K) \times \sqrt{\left(\frac{2I_0}{\beta_2}\right) - (V_2 + V_K)^2} \right\} \quad \left(|V_2 \pm V_K| \leq \sqrt{\left(\frac{I_0}{\beta_2}\right)}\right) \quad (20)$$

Figure 28:
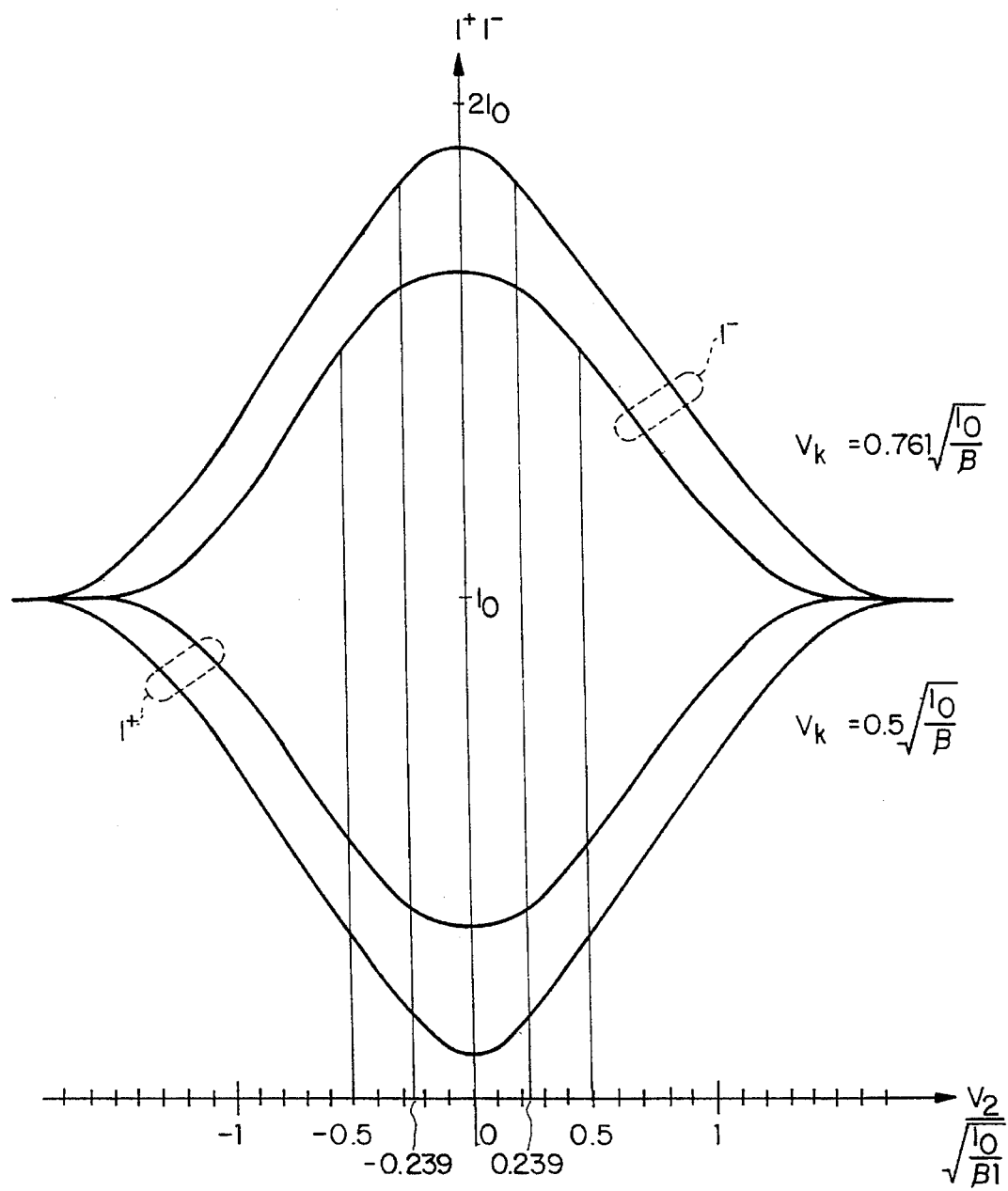
FIG. 28 shows output current characteristics of the squarer in the differential amplifier circuit shown in FIG. 27 with the parameters $V_k$.

FIG. 28 shows the output current characteristics of the squarer $2a$ which is obtained from the equation (20).

The equation (20) can be approximated as the following equation (21).

$$I^+ \approx I_0 - \sqrt{(2\beta_2 \times I_0)} \times \quad (21)$$

$$\left\{ V_K - \left(1 - \frac{1}{\sqrt{2}}\right) \times \left(\frac{I_0}{\beta_2}\right) \times V_K^3 - 3\left(1 - \frac{1}{\sqrt{2}}\right) \times \left(\frac{I_0}{\beta_2}\right) \times V_K \times V_2^2 \right\} \quad \left(|V_2| \leq V_K + \sqrt{\left(\frac{I_0}{\beta_2}\right)}\right)$$

Accordingly, it is seen from the equation (21) that the squarer $2a$ shown in FIG. 27 approximately has the square-law characteristic in the limited input voltage range of $|V_2| \leq (I_0/\beta_2)^{1/2}$.

The equation (21) is within an error of 3% or less, and this error is substantially equal to that between the square-law characteristic and the Shockley's equation. This means that the equation (21) is a superior approximated one.

Figure 29:
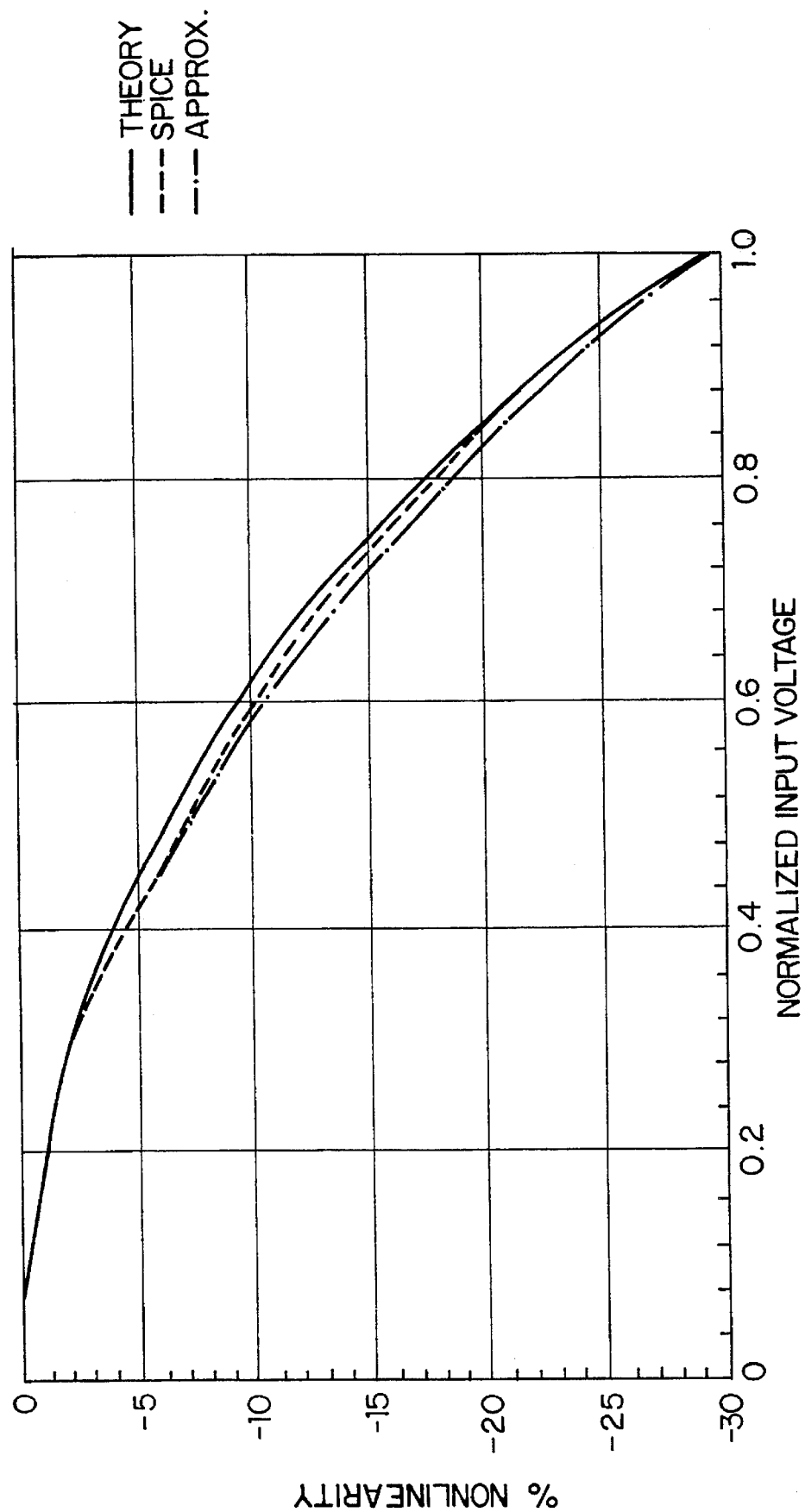
FIG. 29 shows a relationship between nonlinearity and an input voltage of the differential pair in the differential amplifier circuit shown in FIG. 27 or 18.

For reference, the result which is obtained by substituting the equation (21) into the equation (15a) is shown in FIG. 29. The graph in FIG. 29 is originally disclosed in "Analogue IC Design: the current-mode approach", Peter Peregrinus Ltd., London, 1990, PP. 186 and the result is added thereto.

From FIG. 29, it is seen that there is an extremely small error between the approximated equation (21) and the transconductance nonlinearity. This small error is due to the fact that the differential pair $1a$ is compensated in characteristic by the squarer $2a$, so that the shift in characteristic of the squarer $2a$ from the square-law characteristic is compressed by a square root which results in error reduction to half.

In the sixteenth embodiment, the first differential pair $1a$ is driven by the output current $I^+$ of the squarer $2a$, so that if $I_{SS}$ is replaced with $I^+$ in the equation (15a), the following equation (22) is obtained.

$$\Delta I_D \approx \beta_1 \times \left(\frac{V_{IN}}{C}\right) \times \frac{\sqrt{\left\{\left(\frac{2I_0}{\beta_1}\right) - 2\sqrt{\frac{(2\beta_2 \times I_0)}{\beta_1}} \times \left[V_K - \left(1 - \frac{1}{\sqrt{2}}\right) \times \left(\frac{\beta_2}{I_0}\right) \times V_K^3 - 3\left(1 - \left(\frac{1}{\sqrt{2}}\right)\right) \times \left(\frac{\beta_2}{I_0}\right) \times V_K \times V_e^2\right] - \left(\frac{1}{C^2}\right) \times V_{IN}^2\right\}}}{} \quad \left(|V_{IN}| \leq \sqrt{\left(\frac{I_0}{\beta_2}\right) - V_K}\right) \quad (22)$$

where $V_1 = V_{IN}/C$ and $V_2 = V_{IN}$.

To make the transconductance of the differential pair $1a$ shown in the equation (22) linear, the following equation (23) is required to be established evidently.

$$\left[1 - \left(\frac{1}{\sqrt{2}}\right)\right] \times \left(\frac{V_K}{C^2}\right) = \left(\frac{1}{6}\right) \times \sqrt{\frac{I_0 \times \beta_1}{2\beta_2}} \quad (23)$$

Accordingly, if the transconductance parameters $\beta_1$ and $\beta_2$ are set so that the equation (14) is satisfied, or concretely, the ratios $(W/L)_1$ of the MOS transistors M1 and M2 forming the first differential pair $1a$ and those $(W/L)_2$ of the MOS transistors M3, M4, M5 and M6 forming the squarer $2a$ are appropriately set in value, and then the bias offset voltages $V_K$ and the divide ratio C are set similarly, the transconductance of the differential pair $1a$ can be made linear.

In addition, it is seen that there exists a value of the bias offset voltages $V_K$ which satisfy the equation (23) even if C=1. This case is equivalent to a case where no divider circuit is provided.

Figure 30:
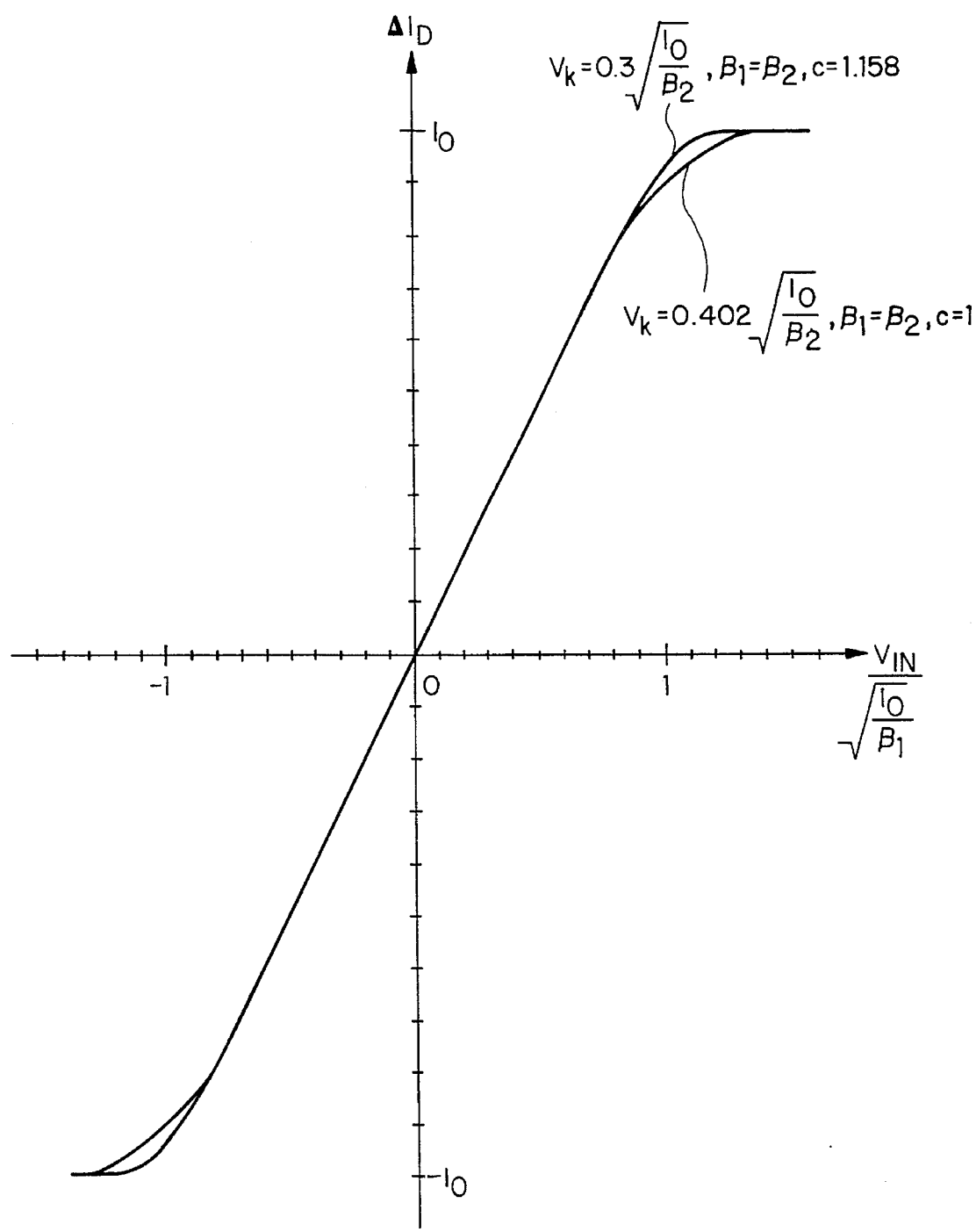
FIG. 30 shows transfer characteristics of the differential amplifier circuit shown in FIG. 27 with the parameters $V_k$, C, $\beta_1$ and $\beta_2$.
Figure 31:
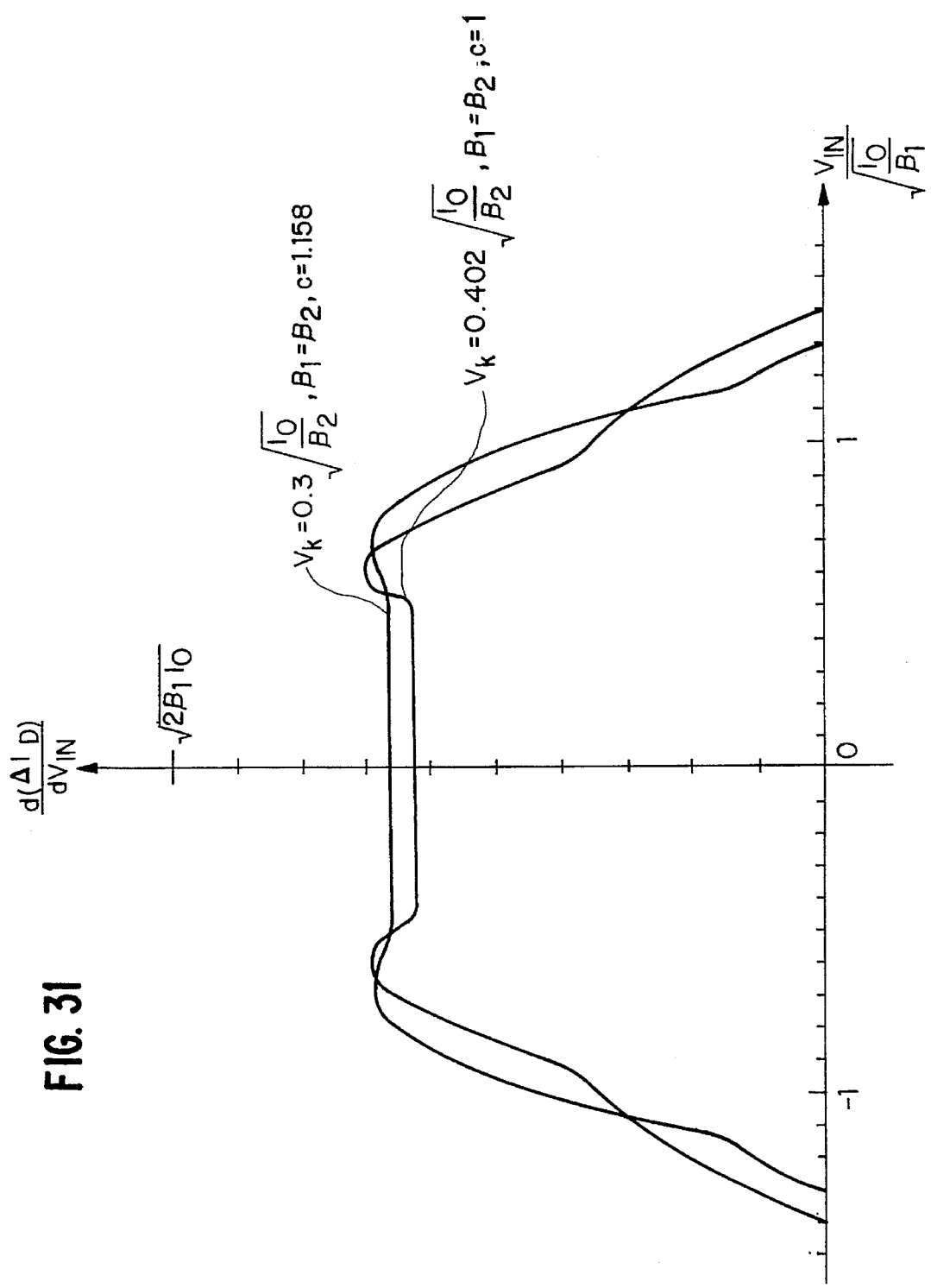
FIG. 31 shows transconductance characteristics of the differential amplifier circuit shown in FIG. 27 with the parameters $V_k$, C, $\beta_1$ and $\beta_2$.

The transfer characteristics and the transconductance characteristics of the sixteenth embodiment are shown in FIGS. 30 and 31, respectively.

[Seventeenth embodiment]

Figure 32:
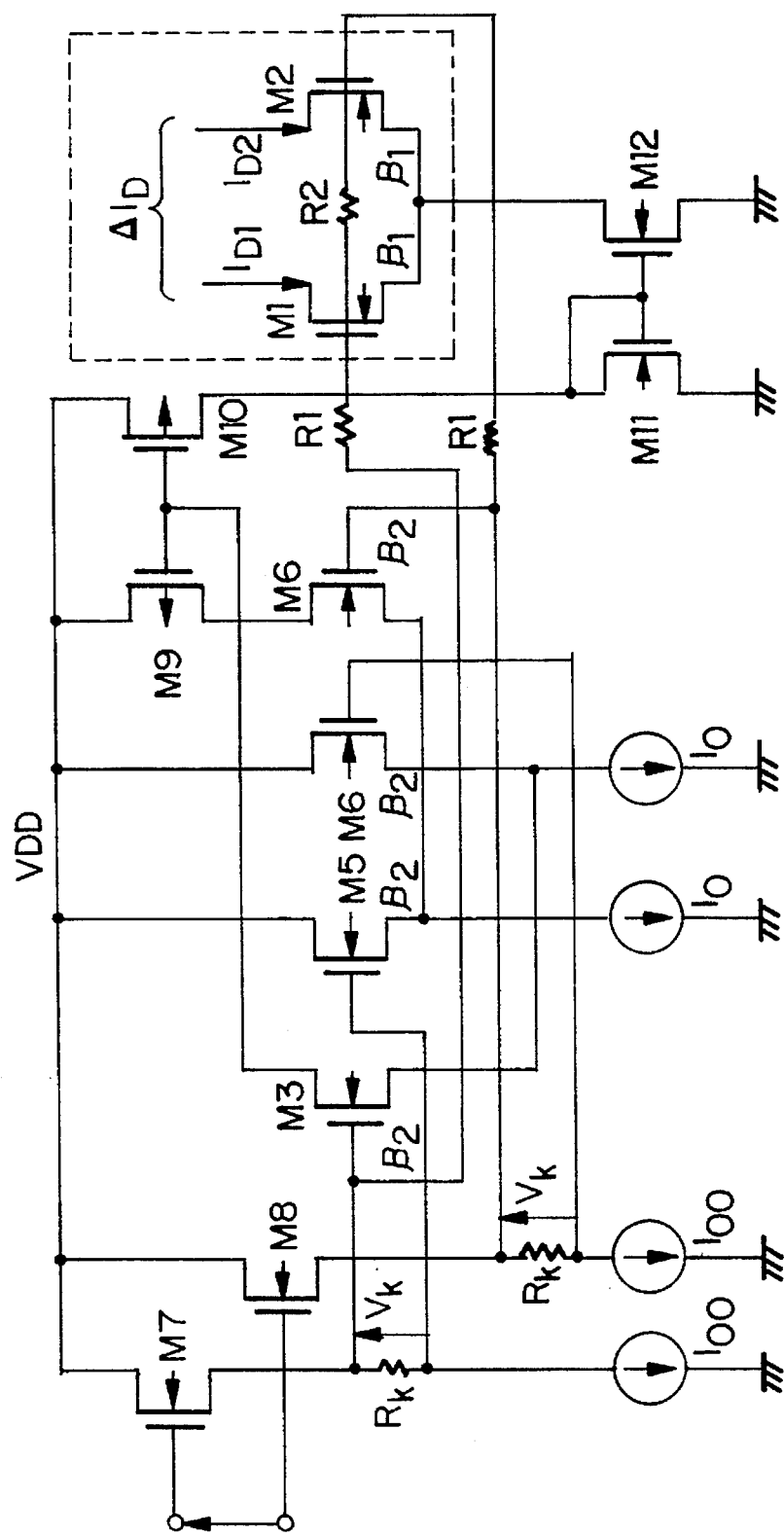
FIG. 32 is a circuit diagram of a differential amplifier circuit according to a seventeenth embodiment of the present invention, in which the transistor pair and the squarer are connected in cascade through two current mirror circuits.

FIG. 32 shows a differential amplifier circuit as an OTA of a seventeenth embodiment. In this embodiment, a first balanced differential pair 1a and a squarer 2a are connected in cascade to each other through two current mirror circuits, so that there is an additional advantage that the dc voltage level of the input signal can be reduced compared with the sixteenth embodiment.

In FIG. 32, the first differential pair 1a, a divider circuit 4a for the pair 1a, the squarer 2a and first and second constant current sources (current: $I_0$) for respectively driving second and third unbalanced differential pairs of the squarer 2a are the same in configuration as those of the sixteenth embodiment, respectively. A first offset voltage source (voltage: $V_K$) is composed of a resistor (resistance: $R_K$) connected between gates of the N-channel MOS transistors M3 and M5. A second offset voltage source (voltage: $V_K$) is composed of a resistor (resistance: $R_K$) connected between gates of the N-channel MOS transistors M4 and M6. In other words, this configuration is called as the "source follower".

P-channel MOS transistors M9 and M10 compose a first current mirror circuit and N-channel MOS transistors M11 and M12 compose a second current mirror circuit. The first current mirror circuit is driven by the output current $I^+$ of the squarer 2a, and the second current mirror circuit is driven by the output current of the first current mirror circuit.

Sources of the transistors M4, M5, M7, M8, M9 and M10 are coupled together to be applied with a power source voltage VDD. The drains coupled together of the transistors M3 and M6 are connected in common to the drain of the transistor M9.

The first differential pair 1a is driven by the output current $I^+$ of the squarer 2a through the first and second current mirror circuits.

The operation of the differential amplifier circuit of the seventeenth embodiment is similar to that of the sixteenth embodiment excepting that the output current $I^+$ of the squarer 2a is supplied to the first differential pair 1a through the first and second current mirror circuits.

[Eighteenth embodiment]

Figure 33:
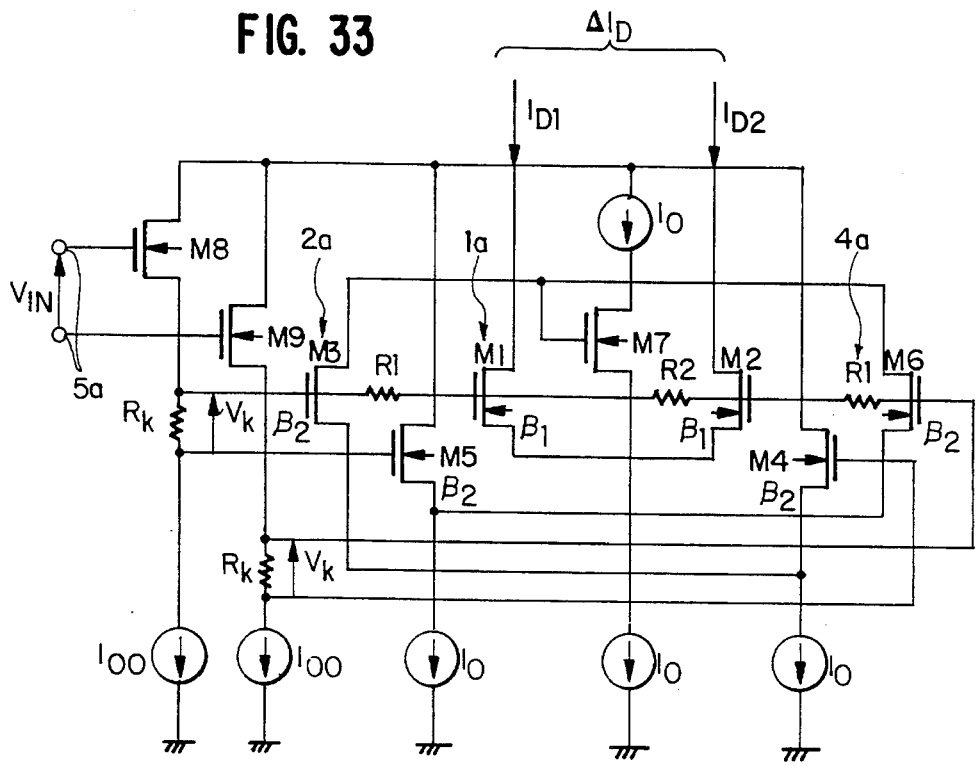
FIG. 33 is a circuit diagram of a differential amplifier circuit according to a eighteenth embodiment of the present invention, in which the transistor pair is driven by an output current of the squarer through a current shifting circuit.

FIG. 33 shows a differential amplifier circuit as an OTA of a eighteenth embodiment. In this embodiment, an output current of a squarer 2a is supplied to a first balanced differential pair 1a through a current shifting circuit, so that there is an additional advantage that the dc voltage level of the input voltage can be reduced compared with the twelfth embodiment, similar to the seventeenth embodiment.

In FIG. 33, the first differential pair 1a, the squarer 2a, a divider circuit 4a for the pair 1a, and first and second constant current sources (current: $I_0$) for respectively driving second and third unbalanced differential pairs of the squarer 2a are the same in configuration as those of the sixteenth embodiment, respectively. First and second offset voltage sources (voltage: $V_K$) are the same in configuration as those of the seventeenth embodiment.

The current shifting circuit is composed of an N-channel MOS transistor M7 and third and fourth constant current sources (current: $I_0$) therefor. A source of the transistor M7 is connected to sources of the transistors M1 and M2 of the first balanced differential pair 1a, and the third constant current source for driving the transistor M7 is connected to the connection point of these sources.

A gate and a drain of the transistor M7 are connected in common to drains coupled together of the transistors M3 and M6 of the squarer 2a. The fourth constant current source (current: $I_0$) for current shift is provided between the drains of the transistors M3 and M6 and the drains coupled together of the transistors M4 and M5. The drains of the transistors M4 and M5 and the fourth constant current source for current shift are applied with a power source voltage VDD.

[Nineteenth embodiment]

Figure 34:
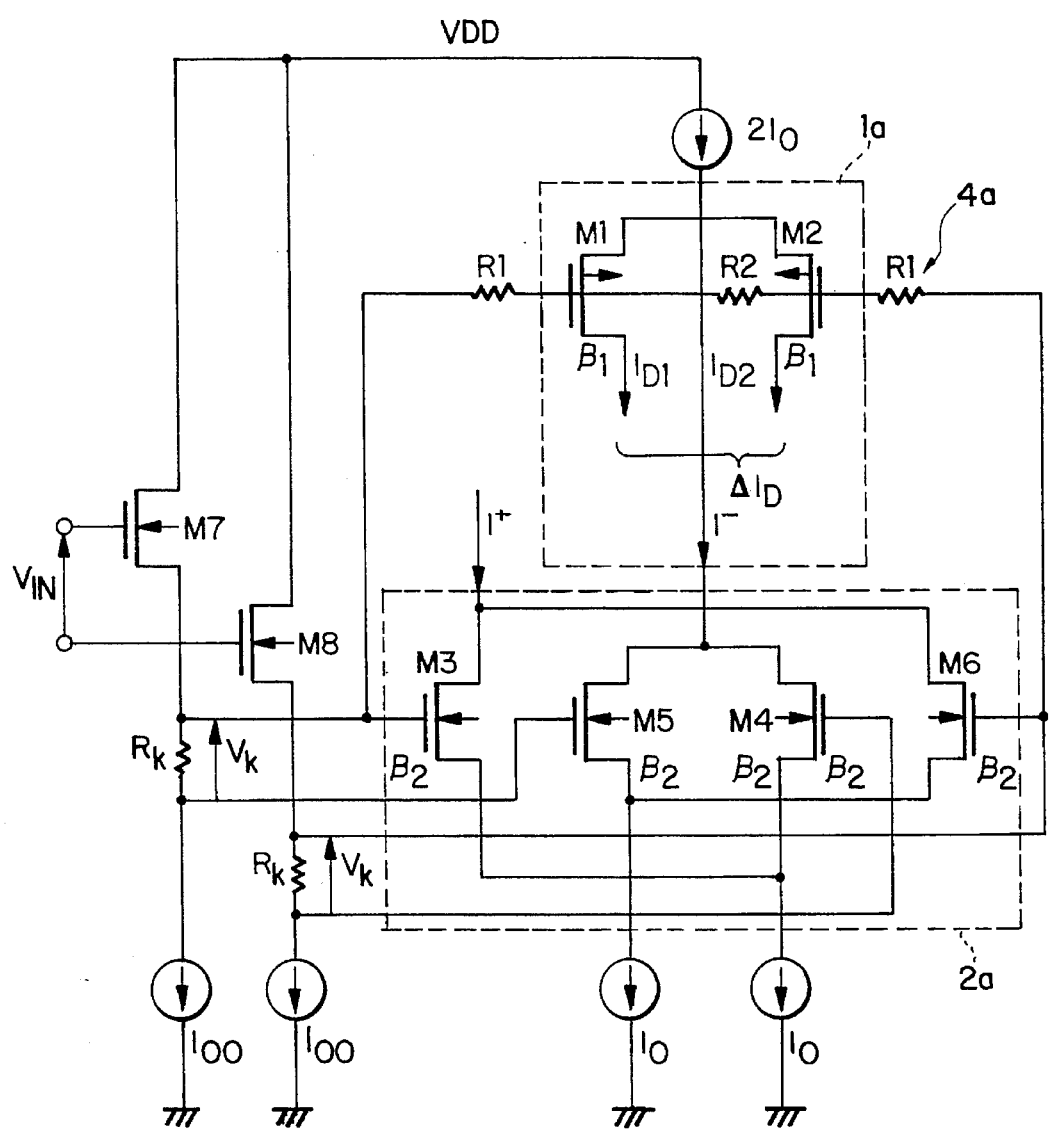
FIG. 34 is a circuit diagram of a folded differential amplifier circuit or a "folded OTA" according to a nineteenth embodiment of the present invention.

FIG. 34 shows a differential amplifier circuit of a nineteenth embodiment, which is called as a folded OTA. In this embodiment, a first balanced differential pair 1a is folded by using P-channel MOS transistors M1 and M2, different from the sixteenth embodiment in FIG. 27.

In FIG. 34, a squarer 2a, offset voltage sources (voltage: $V_K$) and first and second constant current sources (current: $I_0$) for respectively driving second and third unbalanced differential pairs of the squarer 2a are the same in configuration as those of the seventeenth embodiment in FIG. 32, respectively.

The first balanced differential pair 1a is driven by an output current $I^-$ of the squarer 2a. A third constant current source (current: $2I_0$) for driving the pair 1a is provided between sources coupled together of the transistors M1 and M2 and a power source (voltage: VDD).

The operation of the differential amplifier circuit of the nineteenth embodiment is similar to that of the sixteenth embodiment excepting that the output current $I^-$ of the squarer 2a drives the first differential pair 1a.

In the nineteenth embodiment, the first balanced differential pair 1a may be folded by using N-channel MOS transistors, and in this case, the squarer 2a may be formed of P-channel MOS transistors, in which the power source and ground are upside down.

In addition, the current value of the current source is set as $2I_0$, however, it may be $aI_0$ where a is a constant other than 2.

[Twentieth embodiment]

Figure 35:
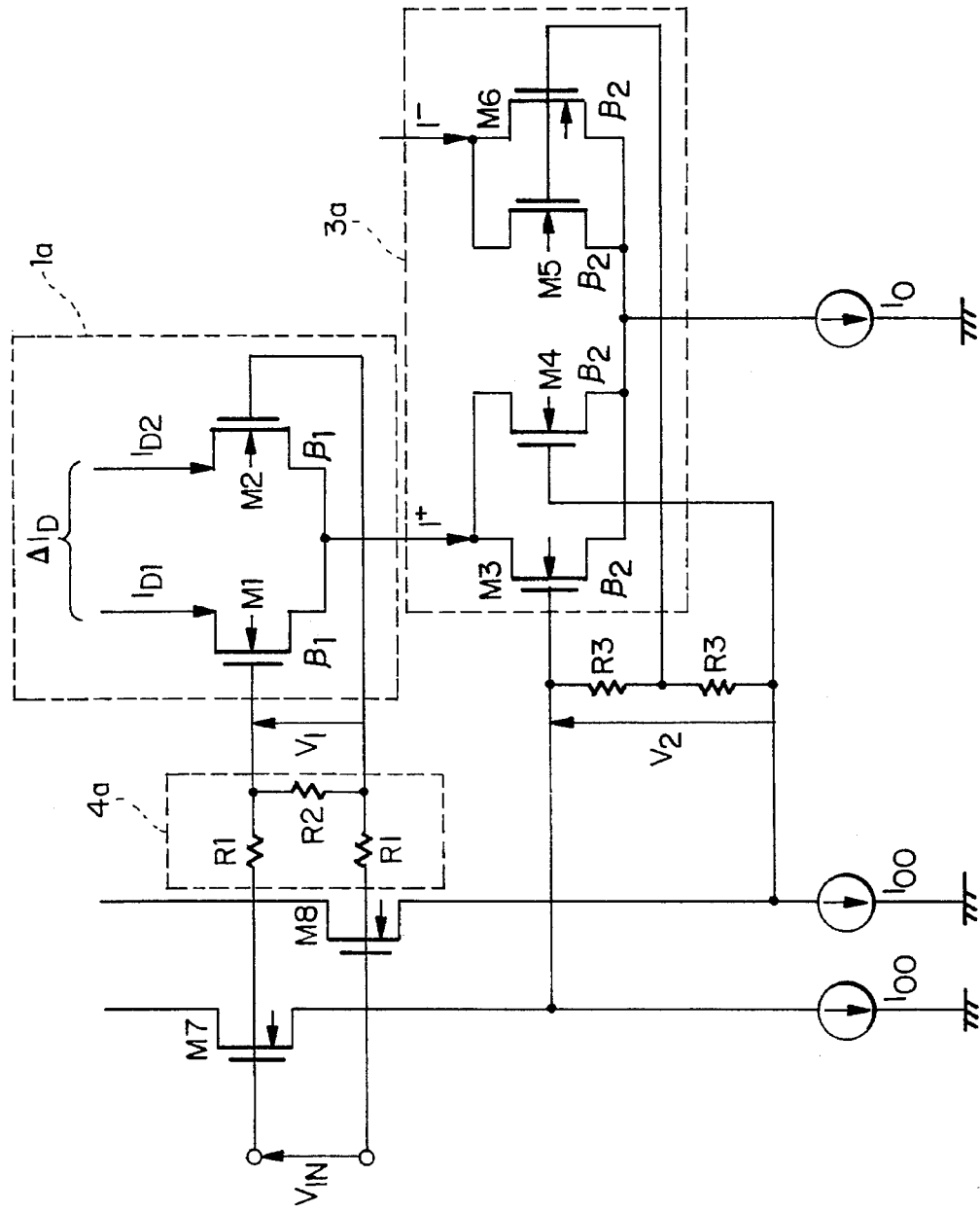
FIG. 35 is a circuit diagram of a differential amplifier circuit according to a twentieth embodiment of the present invention.

FIG. 35 shows a differential amplifier circuit as an OTA of a twentieth embodiment. This embodiment is the same in configuration as the twelfth embodiment shown in FIG. 20 excepting that a quadritail circuit 3a is provided as a driver circuit in place of a squarer and that a divider circuit 4a for differential pair 1a is provided in place of a divider circuit 4a' for the squarer.

As shown in FIG. 35, the quadritail circuit 3a is formed of four N-channel MOS transistors M3, M4, M5 and M6 driven by one first constant current source (current: $I_0$). The transistors M3 and M4 composing a second pair are equal in gate-width to gate-length ratio to each other and the transistors M5 and M6 composing a third pair are also equal in gate-width to gate-length ratio to each other.

Sources of the transistors M3, M4, M5 and M6 are connected in common to the constant current source.

Gates of the transistors M3 and M4 are connected respectively to sources of N-channel MOS transistors M7 and M8 to be applied with a first input signal $V_1$. Two third resistors (resistance: $R_3$) connected in series are provided for generating a bias voltage between the gates of the transistors M3 and M4. Drains of the transistors M3 and M4 are connected in common to sources of the N-channel MOS transistors M1 and M2.

Gates of the transistors M5 and M6 are connected in common to the connection point of the third resistors (resistance: $R_3$) to be applied with a bias voltage equal to the middle point voltage of $V_2$ or $(\frac{1}{2})V_2$. Collectors of the transistors M5 and M6 are coupled together.

In the quadritail circuit 3a, the transistors M5 and M6 forming the third pair may be replaced by one transistor which is two times in capacity or gate-width to gate-length ratio as large as the transistor M5 or M6 since the sources, gates and drains of the transistors M5 and M6 are coupled together.

Next, the operation of the differential amplifier circuit of the twentieth embodiment is described below.

The output current $I^+$ of the quadritail circuit $3a$ can be expressed as the following equation (24).

$$I^+ = I_{D3} + I_{D4} = \left(\frac{I_0}{2}\right) + \left(\frac{\beta_2}{4} \times V_1^2\right) \left(|V_2| \leq \sqrt{\frac{2I_0}{3\beta_2}}\right) \quad (24)$$

where $I_{D3}$ and $I_{D4}$ are drain currents of the respective transistors M3 and M4.

This circuit analysis is disclosed in detail by the inventor K. Kimura in IEICE Transactions on FUNDAMENTALS, Vol. E75-A, No. 12, PP. 1714–1716, December 1992.

Figure 36:
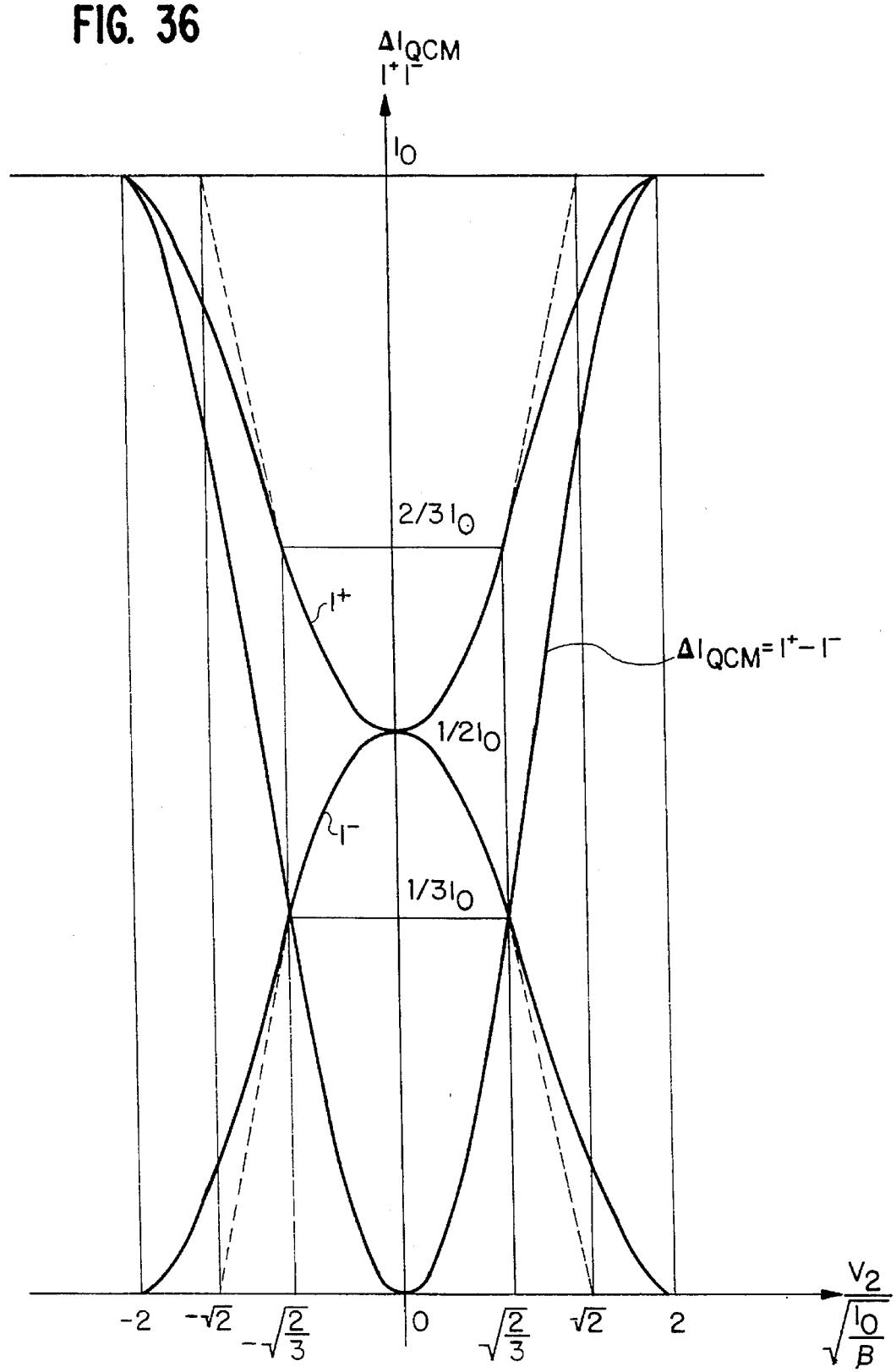
FIG. 36 shows an output current characteristic of the quadritail circuit in the differential amplifier circuit shown in FIG. 35.

FIG. 36 shows the output current characteristics of the quadritail circuit $3a$. As seen from the equation (22) and FIG. 36, it can be said that the output currents $I^+$ and $I^-$ have the square-law characteristics within the input voltage range of $|V_2| \leq (2I_0/3\beta_2)$. This means that the quadritail circuit $3a$ may be used in place of a squarer.

The first differential pair $1a$ is driven by the output current $I^+$ of the quadritail circuit $3a$, so that the differential output current $\Delta I_D$ of the first differential pair $1a$ can be expressed as the following equation (13) by replacing $I_{SS}$ with $I^+$ in the equation (15a), where the current $\Delta I_D$ is defined as $\Delta I_D = I_{D1} - I_{D2}$.

$$\Delta I_D = \beta_1 \times \left(\frac{V_{IN}}{C}\right) \sqrt{\left\{\left(\frac{I_0}{\beta_1}\right) + \left[\left(\frac{\beta_2}{2\beta_1}\right) - \left(\frac{1}{C^2}\right)\right] \times V_{IN}^2\right\}} \left(|V_1| \leq \sqrt{\left(\frac{2I_0}{3\beta_2}\right)}\right) \quad (25)$$

In the equation (25), $V_1 = V_{IN}/C$ and $V_2 = V_{IN}$ are established.

To make the transconductance of the differential pair $1a$ shown in the equation (25) linear, the following relationship (26) is required to be satisfied.

$$2\beta_1 = C^2\beta_2 \quad (26)$$

Figure 37:
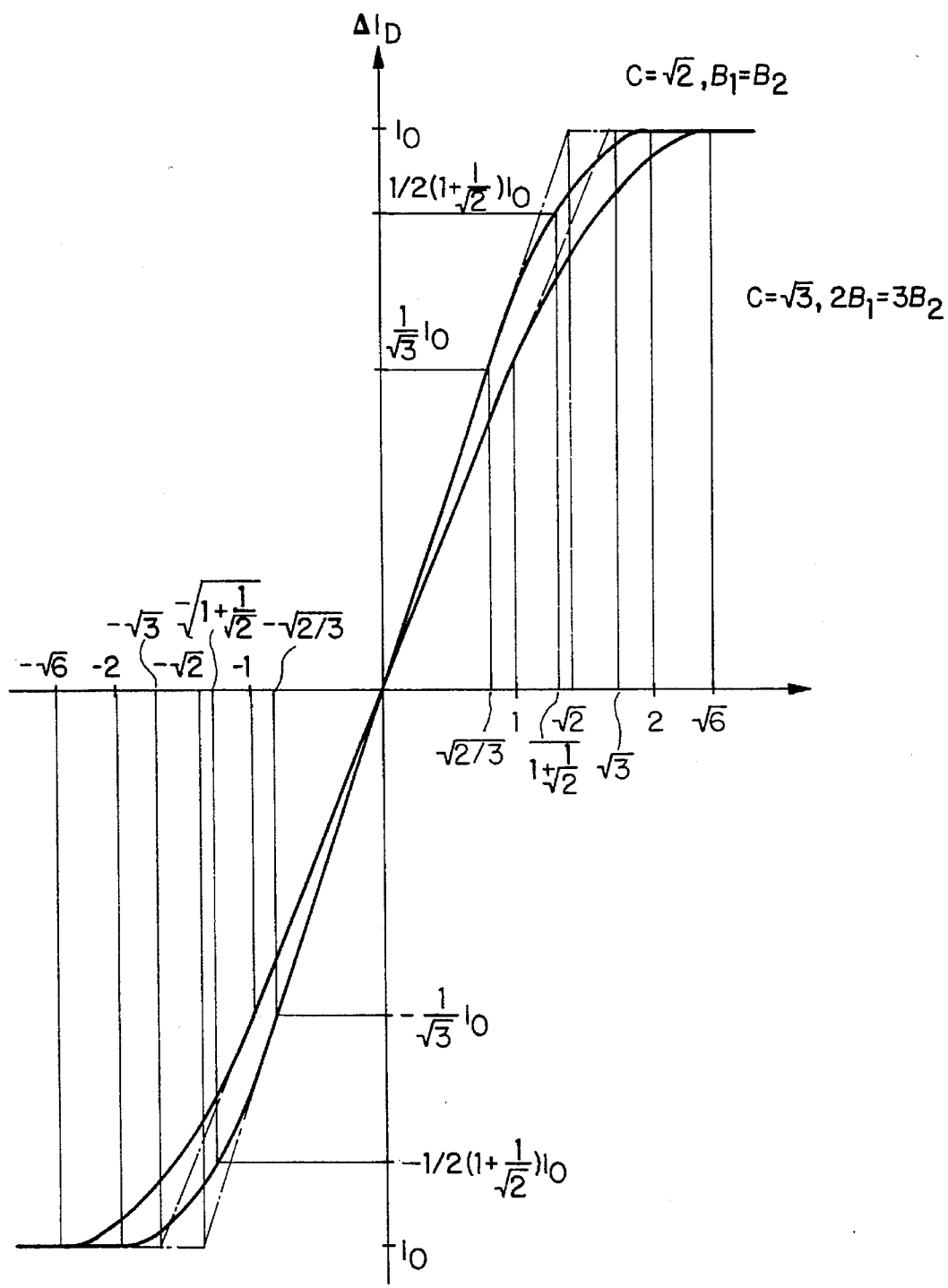
FIG. 37 shows transfer characteristics of the differential amplifier circuit shown in FIG. 35 with the parameters C, $\beta_1$ and $\beta_2$.
Figure 38:
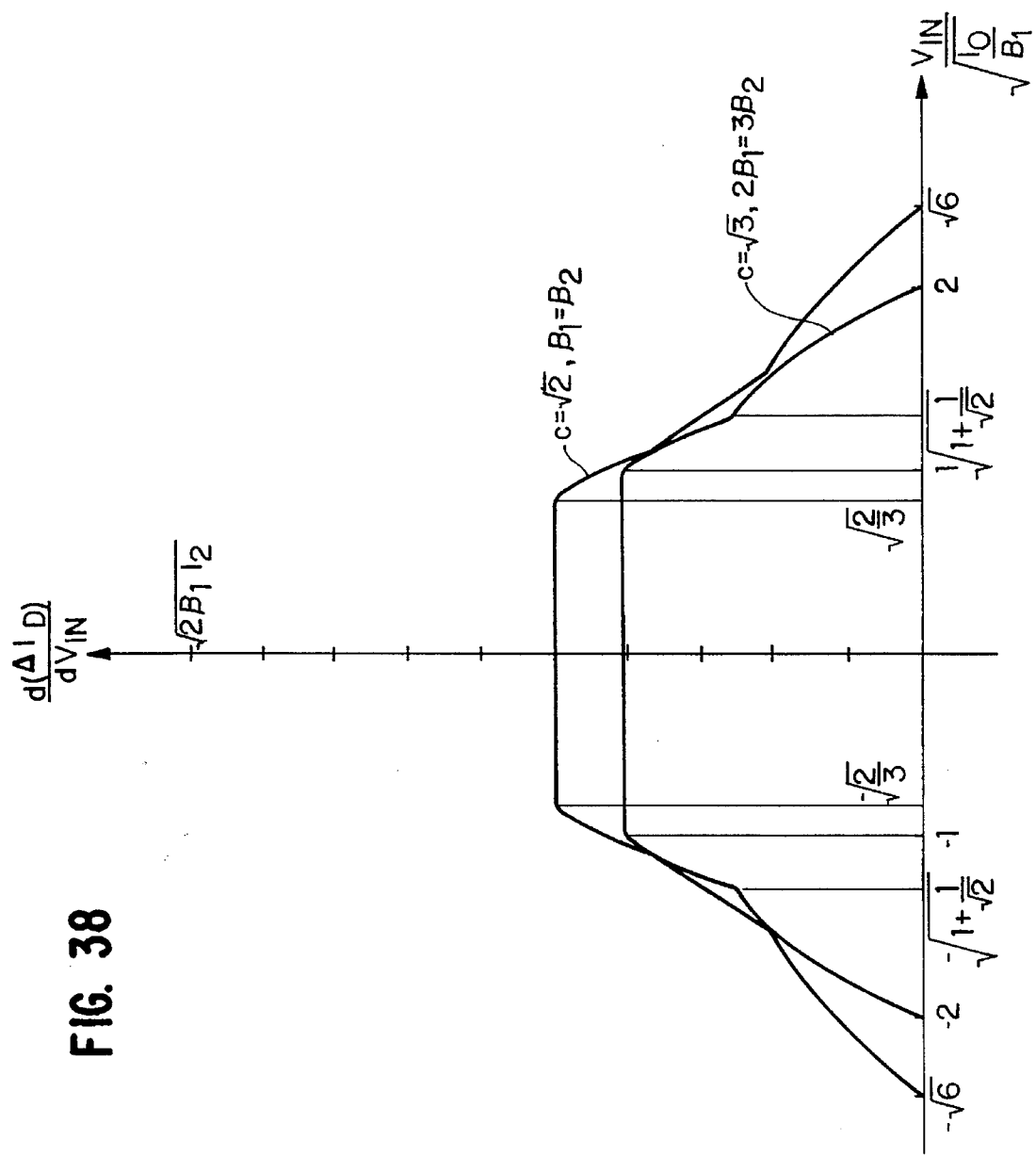
FIG. 38 shows transconductance characteristics of the differential amplifier circuit shown in FIG. 35 with the parameters C, $\beta_1$ and $\beta_2$.

FIGS. 37 and 38 show the transfer curves and the transconductance characteristics of the twentieth embodiment which are obtained using the equation (25). $C = (2\beta_1/\beta_2)^{1/2}$ is expressed from the equation (26), so that C can be made to be 1 or C=1 if $2\beta_1 = \beta_2$ is satisfied. In this case, the first and second input signal voltages $V_1$ and $V_2$ can be equal in value to each other.

[Twenty-first embodiment]

Figure 39:
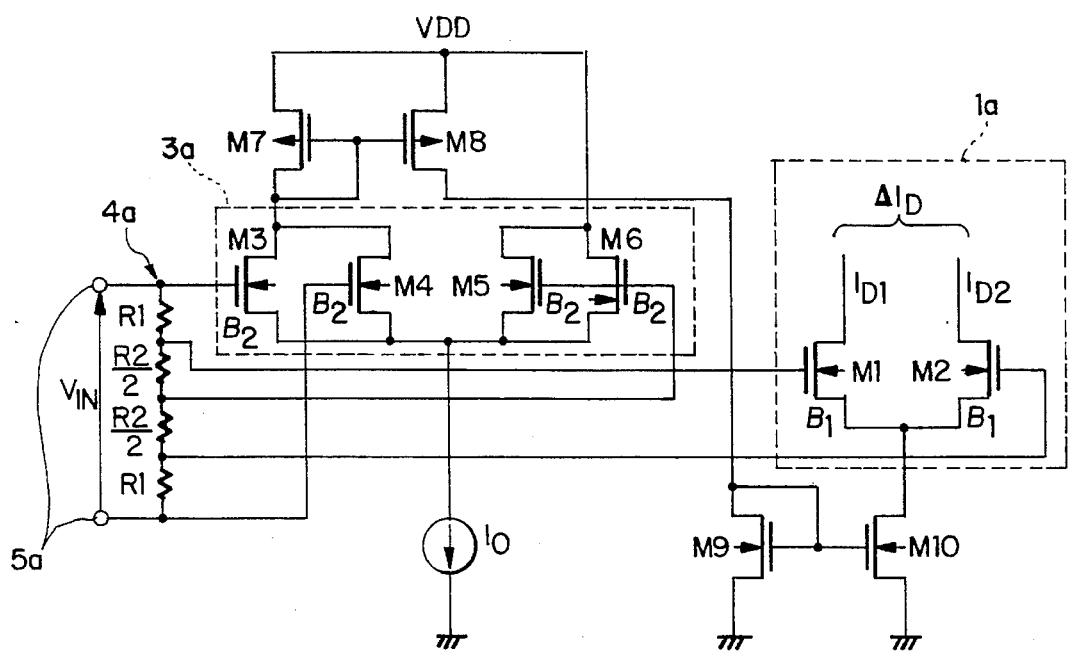
FIG. 39 is a circuit diagram of a differential amplifier circuit according to a twenty-first embodiment of the present invention, in which the transistor pair and the squarer are connected in cascade through two current mirror circuits.

FIG. 39 shows a differential amplifier circuit as an OTA of a twenty-first embodiment. In this embodiment, a first balanced differential pair $1a$ and a quadritail circuit $3a$ are connected in cascade to each other through two current mirror circuits, so that there is an additional advantage that the dc voltage level of the input voltage can be reduced compared with the twentieth embodiment.

In FIG. 39, the first differential pair 1, the quadritail circuit $3a$ and a constant current source (current: $I_0$) for driving the quadritail circuit $3a$ are the same in configuration as those of the twelfth embodiment, respectively. Different from the twentieth embodiment, no divider circuit $4a'$ for the quadritail circuit $3a$ is provided and a divider circuit $4a$ for the differential pair $1a$ is provided instead. The divider circuit $4a$ is formed of two first resistors (resistance: $R_1$) and a second resistor (resistance: $R_2/2$) connected in series. The first resistors are connected respectively to gates of the N-channel MOS transistors M3 and M4 of the quadritail circuit $3a$. The second resistors act for generating the middle point voltage of the voltage $V_1$ or $V_{IN}$ to supply it to gates coupled together of the N-channel MOS transistors M5 and M6.

P-channel MOS transistors M7 and M8 compose a first current mirror circuit and N-channel MOS transistors M9 and M10 compose a second current mirror circuit. The first current mirror circuit is driven by the output current $I^+$ of the quadritail circuit $3a$, and the second current mirror circuit is driven by the output current of the first current mirror circuit.

Sources of the transistors M7 and M8 are coupled together to be applied with a power source voltage VDD. The drains coupled together of the transistors M3 and M4 are connected in common to the drain of the transistor M7. The drains coupled together of the transistors M5 and M6 are connected in common to be applied with the power source voltage VDD.

The first differential pair $1a$ is driven by the output current $I^+$ of the quadritail circuit $3a$ through the first and second current mirror circuits.

The operation of the differential amplifier circuit of the twenty-first embodiment is similar to that of the twentieth embodiment excepting that the output current $I^+$ of the squarer $2a$ is supplied to the first differential pair $1a$ through the first and second current mirror circuits.

[Twenty-second embodiment]

Figure 40:
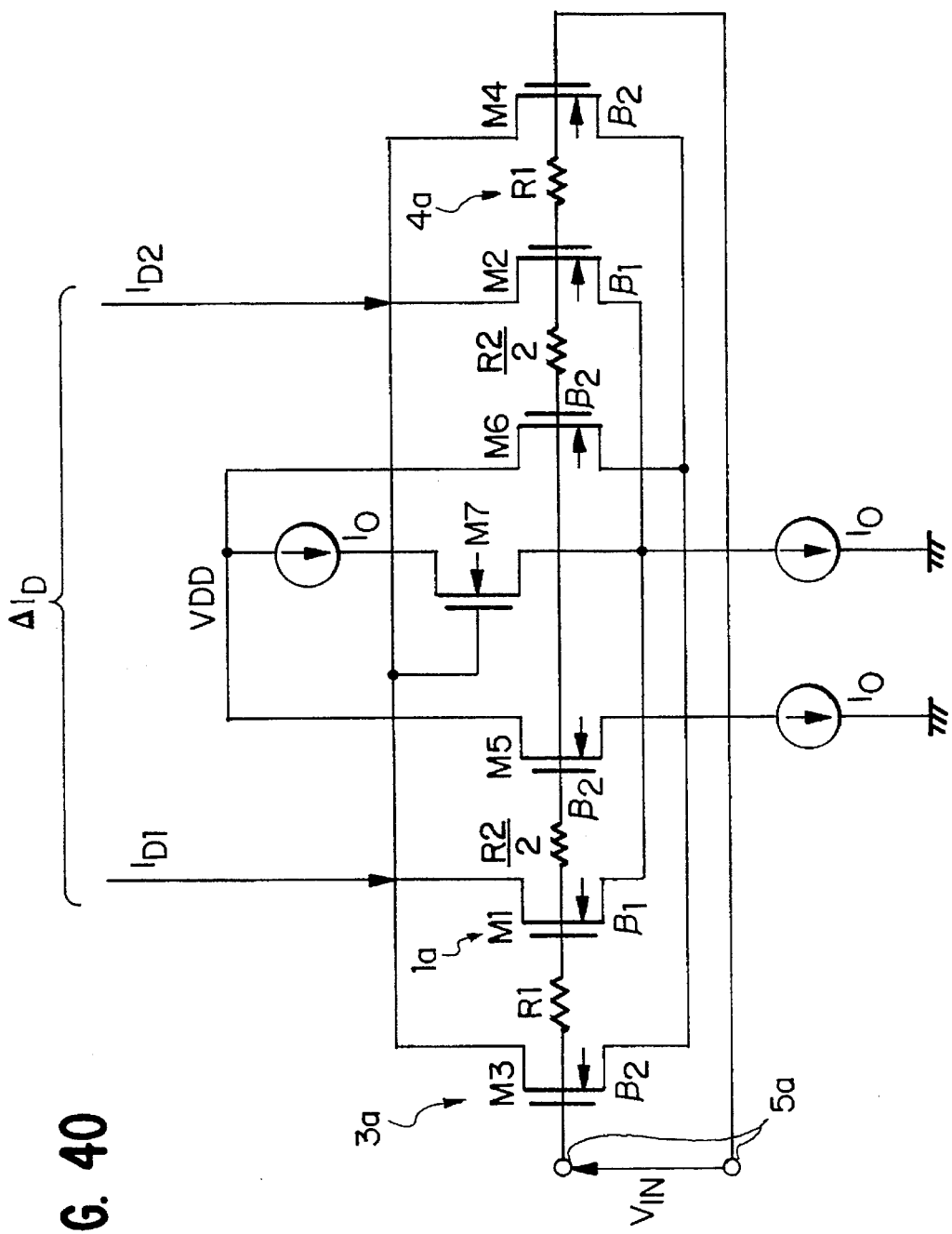
FIG. 40 is a circuit diagram of a differential amplifier circuit according to a twenty-second embodiment of the present invention, in which the transistor pair is driven by an output current of the squarer through a current shifting circuit.

FIG. 40 shows a differential amplifier circuit as an OTA of a twenty-second embodiment. In this embodiment, an output current of a quadritail circuit $3a$ is supplied to a first balanced differential pair $1a$ through a current shifting circuit, so that there is an additional advantage that the dc voltage level of the input voltage can be reduced compared with the twentieth embodiment in FIG. 35, similar to the twenty-first embodiment.

In FIG. 40, the first differential pair $1a$, the quadritail circuit $3a$, a divider circuit $4a$, and first and second constant current sources (current: $I_0$) for respectively driving second and third unbalanced differential pairs of the quadritail circuit $3a$ are the same in configuration as those of the twenty-first embodiment, respectively.

The current shifting circuit is composed of an N-channel MOS transistor M7 and third and fourth constant current sources (current: $I_0$) therefor. A source of the transistor M7 is connected to sources of the transistors M1 and M2 of the first balanced differential pair $1a$, and the third constant current source for driving the transistor M7 is connected to the connection point of these sources.

A gate and a drain of the transistor M7 are connected in common to drains coupled together of the transistors M3 and M4 of the quadritail circuit $3a$. The fourth constant current source (current: $I_0$) for current shift is provided between the drains of the transistors M5 and M6 and the drains coupled together of the transistors M3 and M4. The drains of the transistors M5 and M6 and the fourth constant current source for current shift are applied with a power source voltage VDD.

[Twenty-third embodiment]

Figure 41:
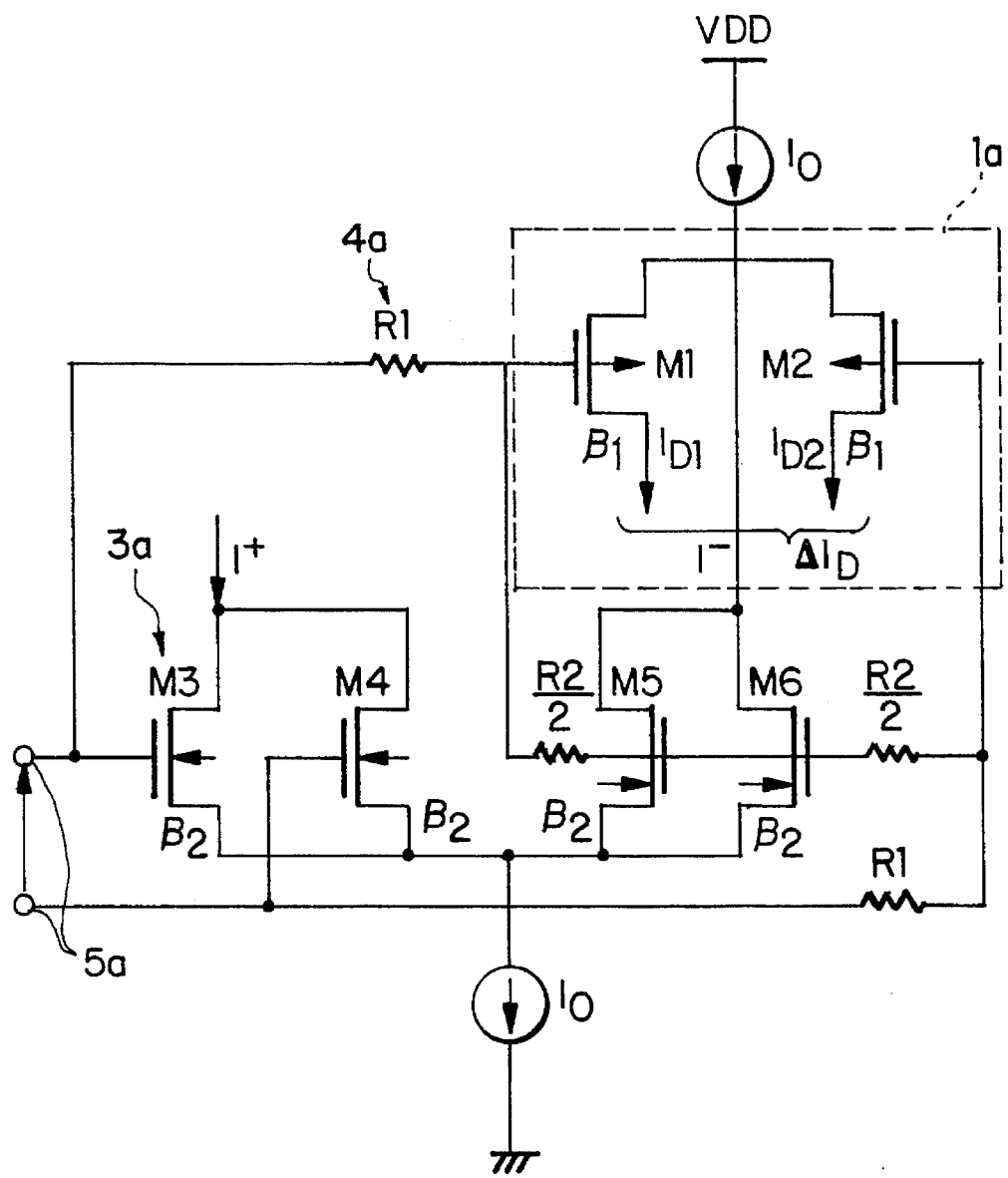
FIG. 41 is a circuit diagram of a folded differential amplifier circuit or a "folded OTA" according to a twenty-third embodiment of the present invention.

FIG. 41 shows a differential amplifier circuit of a twenty-third embodiment, which is called as a folded OTA. In this embodiment, a first balanced differential pair 1a is folded by using P-channel MOS transistors M1 and M2, different from the twentieth embodiment in FIG. 35.

In FIG. 41, a quadritail circuit 3a, a divider circuit 4a, and a first constant current source (current: $I_0$) for driving the quadritail circuit 3a are the same in configuration as those of the twentieth embodiment, respectively.

The first balanced differential pair 1a is driven by an output current $I^-$ of the quadritail circuit 3a. A second constant current source (current: $I_0$) for driving the pair 1a is provided between sources coupled together of the transistors M1 and M2 and a power source (voltage: VDD).

The operation of the differential amplifier circuit of the twenty-third embodiment is similar to that of the twentieth embodiment excepting that the output current $I^-$ of the quadritail circuit 3a drives the first differential pair 1a.

In the twenty-third embodiment, the first balanced differential pair 1a may be formed of N-channel MOS transistors, and in this case, the quadritail circuit 3a may be folded by using P-channel MOS transistors, in which the power source and ground are upside down.

[Squarer used in the invention]

FIGS. 42A, 42B, 42C and 42D show variations of a squarer and FIGS. 43, 44, 45 and 46 show their input-output characteristics, respectively.

In the present invention, the exact square-law characteristic is not necessarily provided to compensate the transconductance linearity of the bipolar transistor pair. As shown in FIGS. 43, 44, 45 and 46, it is known through the SPICE simulation that these circuits shown in FIGS. 42A, 42B, 42C and 42D have each the square-law characteristics, so that any one of them can be used as the squarer in the first to tenth embodiments. Since a transistor pair with resistors at their respective emitters cannot be analyzed in hand-calculation, the input-output characteristics are valuated by the SPICE simulation in general.

Figure 42A:
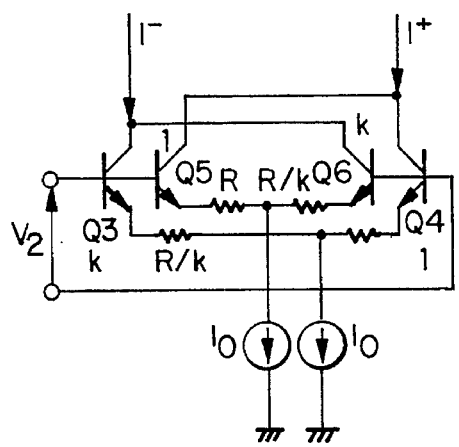
FIGS. 42A, 42B, 42C and 42D are circuit diagrams of squarers, respectively, which can be applied for the present invention.

The squarer shown in FIG. 42A contains a pair of bipolar transistors Q3 and Q4, and a pair of bipolar transistors Q5 and Q6. The transistor Q3 is K times in emitter area as large as the transistors Q4, and the transistor Q6 is K times in emitter area as large as the transistors Q5. First emitter resistors (resistance: R) are connected respectively to the transistor Q4 and Q5 whose relative emitter area ratios are 1 at their emitters, and second emitter resistors (resistance: R/K) are connected respectively to the transistors Q3 and Q6 whose relative emitter area ratios are K at their emitters.

In other words, the relative resistance ratio of the pair of the transistors Q3 and Q4 is inversely proportional to the relative emitter area ratio thereof.

Figure 42B:
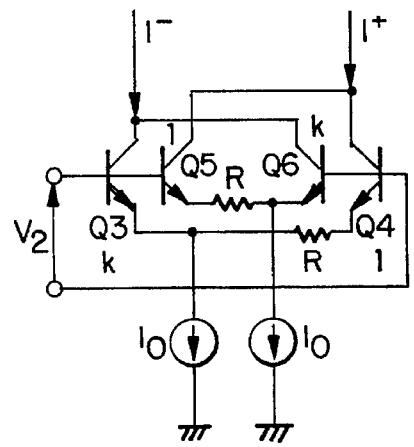

In the squarer shown in FIG. 42B, similar to that shown in FIG. 42A, a transistor Q3 is K times in emitter area as large as a transistors Q4, and a transistor Q6 is K times in emitter area as large as a transistors Q5. Emitter resistors (resistance: R) are connected respectively to the transistor Q4 and Q5 whose relative emitter area ratios are 1 at their emitters. No emitter resistors are connected respectively to the transistors Q3 and Q6 whose relative emitter area ratios are K at their emitters.

Figure 42C:
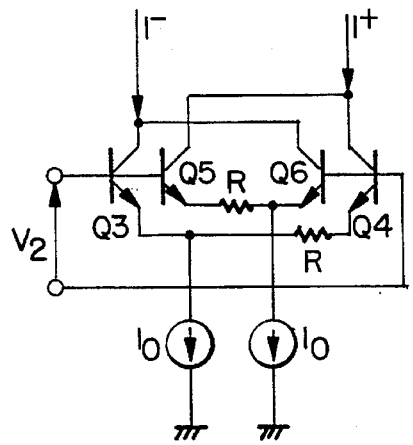

In the squarer shown in FIG. 42C, different from that shown in FIG. 42A, transistor Q3 and Q4 are equal in emitter area to each other, and transistor Q5 and Q6 are also equal in emitter area to each other. Emitter resistors (resistance: R) are connected respectively to the transistor Q4 and Q5 at their emitters. No emitter resistors are connected respectively to the transistors Q3 and Q6 at their emitters.

Figure 42D:
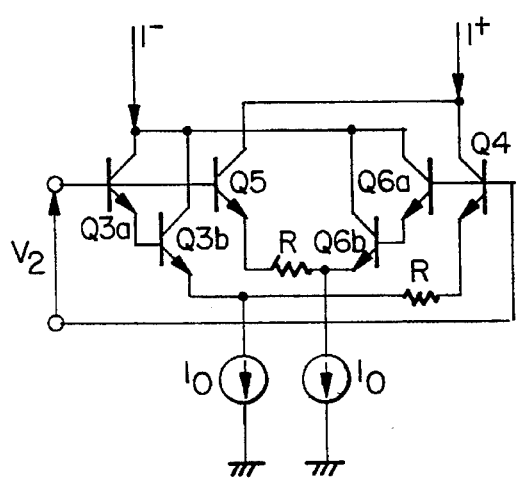
Figure 43:
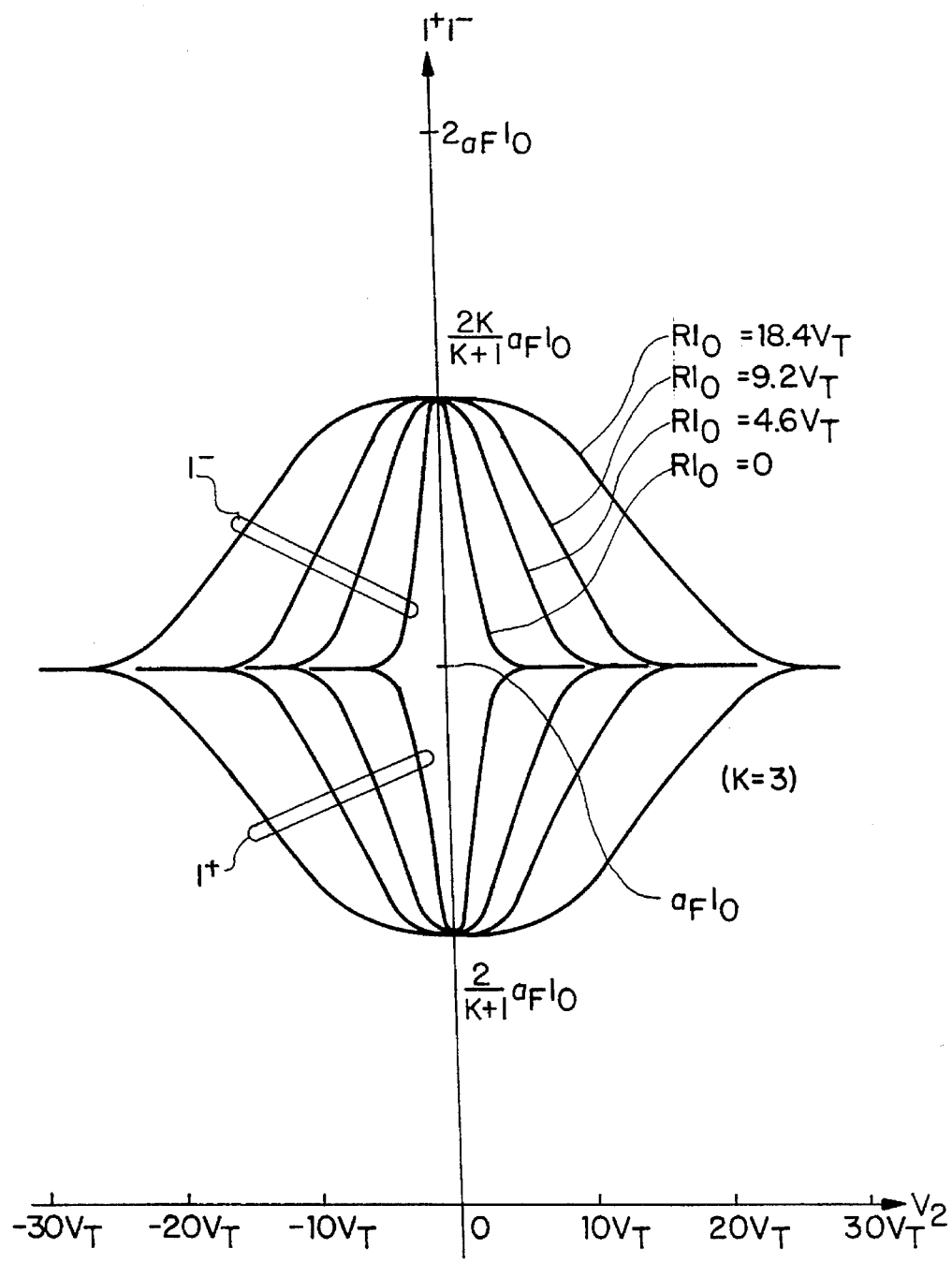
FIG. 43 is input-output characteristics of the squarer shown in FIG. 42A with the parameter of degeneration value $RI_0$.
Figure 44:
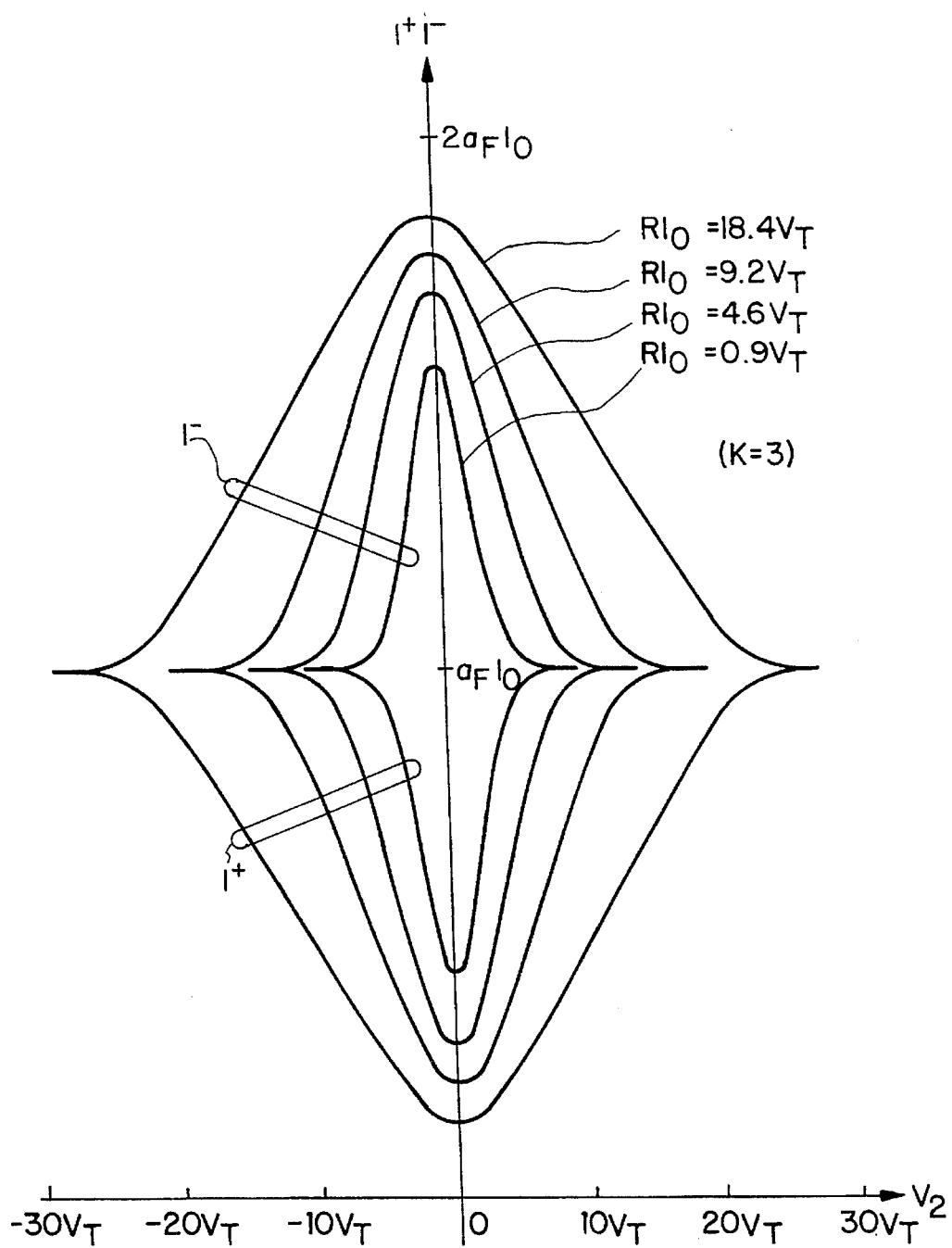
FIG. 44 is input-output characteristics of the squarer shown in FIG. 42B with the parameter of degeneration value $RI_0$.
Figure 45:
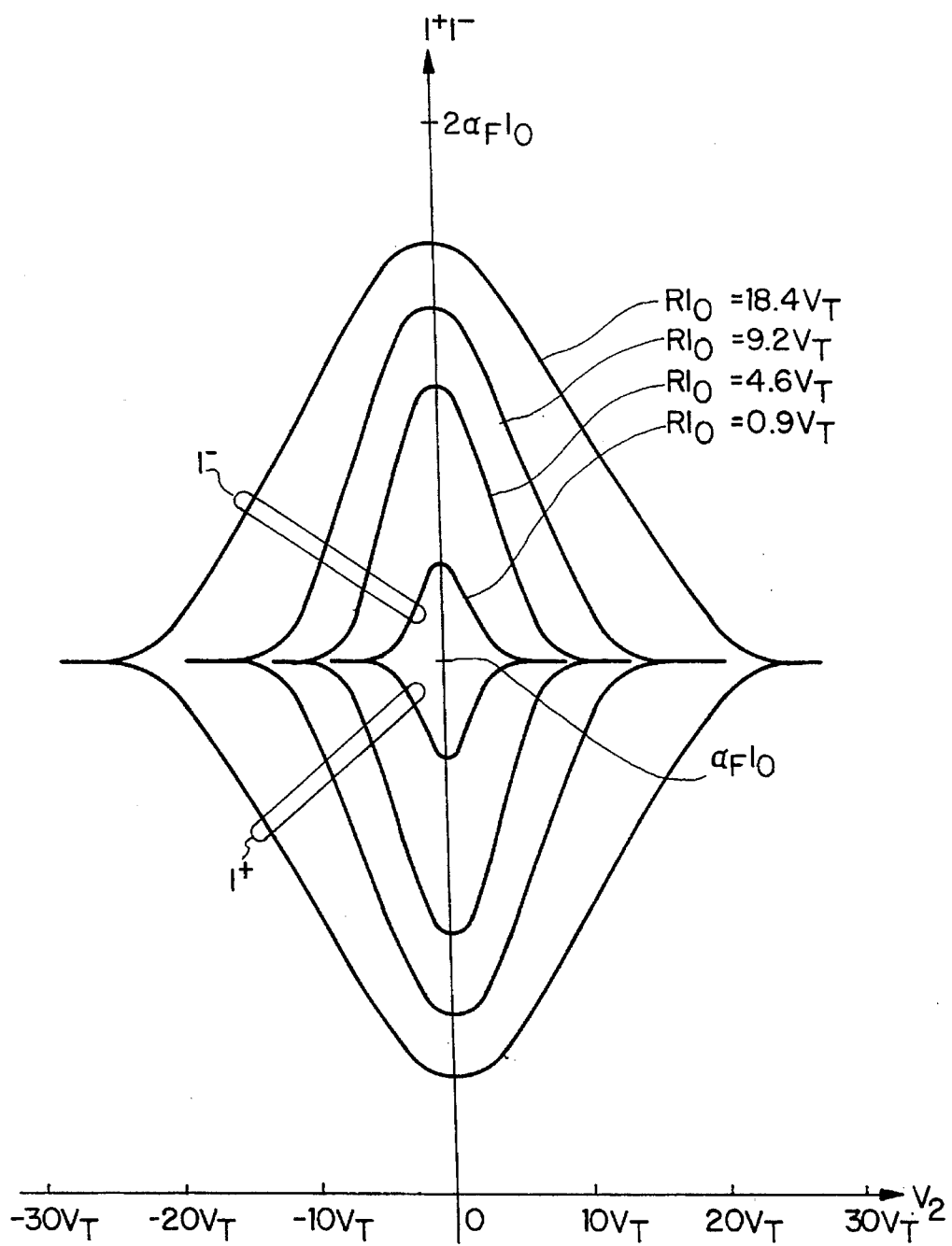
FIG. 45 is input-output characteristics of the squarer shown in FIG. 42C with the parameter of degeneration value $RI_0$.
Figure 46:
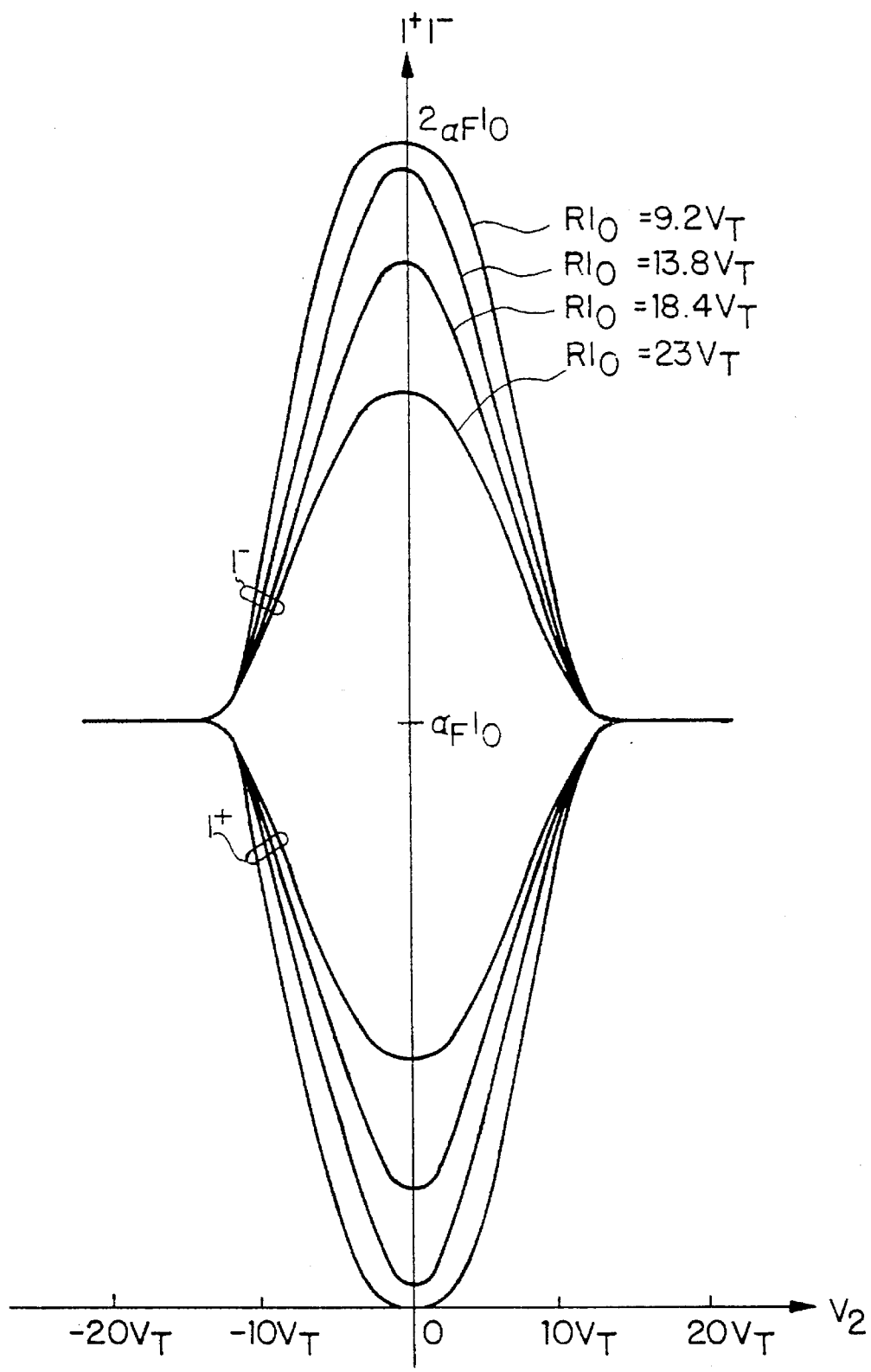
FIG. 46 is input-output characteristics of the squarer shown in FIG. 42D with the parameter of degeneration value $RI_0$.

In the squarer shown in FIG. 42D, transistors Q3a, Q3b and Q4 compose a pair and transistors Q5, Q6a and Q6b compose another pair. The transistors Q3a and Q3b are in Darlington connection, and the transistors Q6a and Q6b are also in Darlington connection. In other words, only one of the transistors of each pair is in Darlington connection.

The transistor Q4 and Q5 which are not in Darlington connection have resistors (resistance: R) at their emitters, respectively. No resistors are connected respectively to the transistors Q3a, Q3b, Q6a and Q6b at their emitters.

With the squarers shown in FIGS. 42A, 42B, 42C and 42D, it can be said that input ends are cross-coupled and output ends are parallel-coupled. In these squarers, since the input voltage range is expanded, the transconductance can be improved in linearity by inserting dividing resistors to the input ends of the transistors pair 1 or by driving the pair 1 using one of the differential output currents $I^+$ and $I^-$.

Similar to the above embodiments, in case of using any one of the squarers shown in FIGS. 42A, 42B, 42C and 42D, the dc voltage level of the input signal can be reduced by connecting in cascade the squarer 2 and the differential pair 1 through two current mirror circuits. In addition, a current shifting circuit may be provided and a folded structure may be employed to make the dc voltage level of the input signal lower.

As described above, with the differential amplifier circuits of the first to twenty-third embodiments, superior transconductance linearity can be ensured within a wider input voltage range than the conventional ones without increase in circuit scale.

What is claimed is:

1. A differential amplifier circuit comprising:

a pair of input terminals to which a signal to be amplified is applied;

a first divider circuit which receives said signal to be amplified and produces as an output a first input signal, said first input signal being different in amplitude from said signal to be amplified;

a second divider circuit which receives said signal to be amplified and produces as an output a second input signal, said second input signal being different in amplitude from said signal to be amplified;

a first differential pair formed of first and second transistors;

input ends of said first differential pair being applied with said first input signal, said first input signal being proportional in amplitude to said signal to be amplified;

a driver circuit for driving said first differential pair by an output current of said driver circuit, said output current having a square-law characteristic; and input ends of said driver circuit being applied with said second input signal, said second input signal being proportional in amplitude to said signal to be amplified;

wherein a transconductance of said first differential pair is compensated in nonlinearity by said output current of said driver circuit.

2. A differential amplifier circuit as claimed in claim 1, wherein at least one of said first and second input signals is produced by dividing in voltage said signal to be amplified.

3. A differential amplifier circuit as claimed in claim 1, wherein said driver circuit is a squarer formed of a second differential pair of third and fourth transistors and a third differential pair of fifth and sixth transistors;

said third and fourth transistors being different in capacity from each other;

input ends of said second differential pair and input ends of said third differential pair being cross-coupled, respectively;

said fifth and sixth transistors being different in capacity from each other; and output ends of said third differential pair and output ends of said second differential pair being parallel-coupled respectively.

4. A differential amplifier circuit as claimed in claim 1, wherein said driver circuit is a squarer formed of a second differential pair of third and fourth transistors and a third differential pair of fifth and sixth transistors;

said third and fourth transistors being equal in capacity to each other;

said fifth and sixth transistors being equal in capacity to each other;

input ends of said second differential pair being applied with a first offset voltage;

input ends of said third differential pair being applied with a second offset voltage;

said second offset voltage being equal in amplitude to said first offset voltage.

5. A differential amplifier circuit as claimed in claim 1, wherein said driver circuit is a quadritail circuit formed of a second pair of third and fourth transistors and a third pair of fifth and sixth transistors;

said second and third pairs being driven by one constant current source;

said third and fourth transistors being equal in capacity to each other, and said fifth and sixth transistors being equal in capacity to each other;

said second input signal being applied across input ends of said second pair;

input ends of said third pair being coupled together to be applied with a middle point voltage of said second input signal;

output ends of said second pair being coupled together to form one of output ends of said quadritail circuit; and output ends of said third pair being coupled together to form the other of said output ends of said quadritail circuit.

6. A differential amplifier circuit as claimed in claim 1, wherein said first differential pair and said driver circuit are connected in parallel through a current mirror circuit to reduce an input voltage range of said differential amplifier circuit.

7. A differential amplifier circuit as claimed in claim 1, wherein said first differential pair and said driver circuit are connected in parallel through a current shifting circuit to make a dc voltage level of an input voltage range of said differential amplifier circuit.

8. A differential amplifier circuit as claimed in claim 1, wherein said first differential pair is formed of transistors of a first conductive type and said driver circuit is formed of transistors of a second conductive type;

said second conductive type being opposite to said first conductive type.

9. A differential amplifier circuit comprising:

a pair of input terminals to which a signal to be amplified is applied;

a first differential pair formed of first and second transistors;

input ends of said first differential pair being applied with a first input signal, said first input signal being proportional in amplitude to said signal to be amplified;

a driver circuit for driving said first differential pair by an output current of said driver circuit, said output current having a square-law characteristic; and input ends of said driver circuit being applied with a second input signal, said second input signal being proportional in amplitude to said signal to be amplified;

wherein a transconductance of said first differential pair is compensated in nonlinearity by said output current of said driver circuit, and wherein said drive circuit is comprised of a second differential pair of third and fourth bipolar transistors and a third differential pair of fifth and sixth bipolar transistors;

said third and fourth transistors being different in emitter area from each other, and said fifth and sixth transistors being different in emitter area from each other;

said third, fourth, fifth and sixth transistors having emitter resistors whose resistances are inversely proportional to relative emitter area ratios of said second and third differential pairs, respectively;

input ends of said second and third differential pairs being cross-coupled; and output ends of said second and third differential pairs being parallel-coupled.

10. A differential amplifier circuit comprising:

a pair of input terminals to which a signal to be amplified is applied;

a first differential pair formed of first and second transistors;

input ends of said first differential pair being applied with a first input signal, said first input signal being proportional in amplitude to said signal to be amplified;

a driver circuit for driving said first differential pair by an output current of said driver circuit, said output current having square-law characteristic; and input ends of said driver circuit being applied with a second input signal, said second input signal being proportional in amplitude to said signal to be amplified;

wherein a transconductance of said first differential pair is compensated in nonlinearity by said output current of said driver circuit, and wherein said driver circuit is comprised of a second differential pair of third and fourth bipolar transistors and a third differential pair of fifth and sixth bipolar transistors;

said third transistor being larger in emitter area than said fourth transistor, and said sixth transistor being larger in emitter area than said fifth transistor;

said fourth and fifth transistors having emitter resistors, respectively;

input ends of said second and third differential pairs being cross-coupled; and output ends of said second and third differential pairs being parallel-coupled.

11. A differential amplifier circuit comprising:

a pair of input terminals to which a signal to be amplified is applied;

a first differential pair formed of first and second transistors:

input ends of said first differential pair being applied with a first input signal, said first input signal being proportional in amplitude to said signal to be amplified;

a driver circuit for driving said first differential pair by an output current of said driver circuit, said output current having a square-law characteristic; and input ends of said driver circuit being applied with a second input signal, said second input signal being proportional in amplitude to said signal to be amplified;

wherein a transconductance of said first differential pair is compensated in nonlinearity by said output current of said driver circuit, and wherein said driver circuit is comprised of a second differential pair of third and fourth bipolar transistors and a third differential pair of fifth and sixth bipolar transistors;

said third and fourth transistors being equal in emitter area to each other, and said fifth and sixth transistors being equal in emitter area to each other;

one of said third and fourth transistors having an emitter resistor, and one of said fifth and sixth transistors having an emitter resistor;

input end of said second and third differential pairs being cross-coupled; and output ends of said second and third differential pairs being parallel-coupled.

12. A differential amplifier circuit comprising:

a pair of input terminals to which a signal to be amplified is applied;

a first differential pair formed of first and second transistors;

input ends of said first differential pair being applied with a first input signal, said first input signal being proportional in amplitude to said signal to be amplified;

a driver circuit for driving said first differential pair by an output current of said driver circuit, said output current having a square-law characteristic; and input ends of said driver circuit being_applied with a second input signal, said second input signal being proportional in amplitude to said signal to be amplified;

wherein a transconductance of said first differential pair is compensated in nonlinearity by said output current of said driver circuit, and wherein said driver circuit is comprised of a second differential pair of third, fourth and fifth bipolar transistors and a third differential pair of sixth, seventh and eighth bipolar transistors;

said third, fourth and fifth transistors being equal in emitter area to each other, and said sixth, seventh and eighth transistors being equal in emitter area to each other;

said third and fourth transistors being in a Darlington connection and said seventh and eighth transistors being in a Darlington connection;

said fifth and sixth transistors having emitter resistors, respectively;

input ends of said second and third differential pairs being cross-coupled; and output ends of said second and third differential pairs being parallel-coupled.

13. A differential amplifier circuit comprising:

a pair of input terminals to which a signal to be amplified is applied;

a first differential pair formed of first and second bipolar transistors, said first and second bipolar transistors being equal in emitter area to each other;

bases of said first and second bipolar transistors of said first differential pair being applied with a first input signal, said first input signal being proportional in amplitude to said signal to be amplified;

a squarer for driving said first differential pair by an output current of said squarer;

said squarer being formed of a second differential pair of third and fourth bipolar transistors and a third differential pair of fifth and sixth bipolar transistors;

said third and fourth bipolar transistors being different in emitter area from each other and said fifth and sixth bipolar transistors being different in emitter area from each other;

bases of said third and fifth bipolar transistors and bases of said fourth and sixth bipolar transistors being coupled together to be applied with a second input signal;

said second input signal being proportional in amplitude to said signal to be amplified;

collectors of said third and sixth bipolar transistors being coupled together and collectors of said fourth and fifth bipolar transistors being coupled together; and said output current of said squarer being derived from one of said collectors coupled of said third and sixth bipolar transistors and said collectors coupled of said fourth and fifth bipolar transistors;

wherein a transconductance of said first differential pair is compensated in nonlinearity by said output current of said squarer.

14. A differential amplifier circuit comprising:

a pair of input terminals to which a signal to be amplified is applied;

a first differential pair formed of first and second bipolar transistors, said first and second bipolar transistors being equal in emitter area to each other;

bases of said first and second bipolar transistors of said first differential pair being applied with a first input signal, said first input signal being proportional in amplitude to said signal to be amplified;

a squarer for driving said first differential pair by an output current of said squarer;

said squarer being formed of a second differential pair of third and fourth bipolar transistors and a third differential pair of fifth and sixth bipolar transistors;

said third and fourth bipolar transistors being equal in emitter area to each other and said fifth and sixth bipolar transistors being equal in emitter area to each other;

bases of said third and fourth bipolar transistors being applied with a second input signal together with a first offset voltage;

bases of said fifth and sixth bipolar transistors being applied with said second input signal together with a second offset voltage;

said second input signal being proportional in amplitude to said signal to be amplified;

collectors of said third and sixth bipolar transistors being coupled together and collectors of said fourth and fifth bipolar transistors being coupled together; and said output current of said squarer being derived from one of said collectors coupled of said third and sixth bipolar transistors and said collectors coupled of said fourth and fifth bipolar transistors;

wherein a transconductance of said first differential pair is compensated in nonlinearity by said output current of said squarer.

15. A differential amplifier circuit comprising:

a pair of input terminals to which a signal to be amplified is applied;

a first differential pair formed of first and second bipolar transistors, said first and second bipolar transistors being equal in emitter area to each other;

bases of said first and second bipolar transistors of said first differential pair being applied with a first input signal, said first input signal being proportional in amplitude to said signal to be amplified;

a quadritail circuit for driving said first differential pair by an output current of said quadritail circuit;

said quadritail circuit being formed of a second differential pair of third and fourth bipolar transistors and a third differential pair of fifth and sixth bipolar transistors;

said third and fourth bipolar transistors being equal in emitter area to each other and said fifth and sixth bipolar transistors being equal in emitter area to each other;

bases of said third and fourth bipolar transistors being applied with a second input signal, said second input signal being proportional in amplitude to said signal to be amplified;

bases of said fifth and sixth bipolar transistors being applied with a middle point voltage of said second input signal;

collectors of said third and fourth bipolar transistors being coupled together and collectors of said fifth and sixth bipolar transistors being coupled together; and said output current of said quadritail circuit being derived from one of said collectors coupled of said third and fourth bipolar transistors and said collectors coupled of said fifth and sixth bipolar transistors;

wherein a transconductance of said first differential pair is compensated in nonlinearity by said output current of said quadritail circuit.

16. A differential amplifier circuit comprising:

a pair of input terminals to which a signal to be amplified is applied;

a first differential pair formed of first and second MOS transistors, said first and second MOS transistors being equal in gate-width to gate-length ratio to each other;

gates of said first and second MOS transistors of said first differential pair being applied with a first input signal, said first input signal being proportional in amplitude to said signal to be amplified;

a divider circuit which receives said signal to be amplified and produces a second input signal which is different in amplitude from said signal to be amplified;

a squarer for driving said first differential pair by an output current of said squarer;

said squarer being formed of a second differential pair of third and fourth MOS transistors and a third differential pair of fifth and sixth MOS transistors;

said third and fourth MOS transistors being different in gate-width to gate-length ratio from each other and said fifth and sixth MOS transistors being different in gate-width to gate-length ratio from each other;

gates of said third and fifth MOS transistors and gates of said fourth and sixth MOS transistors being coupled together to be applied with said second input signal;

said second input signal being proportional in amplitude to said signal to be amplified;

drains of said third and sixth MOS transistors being coupled together and drains of said fourth and fifth MOS transistors being coupled together; and said output current of said squarer being derived from one of said drains coupled of said third and sixth MOS transistors and said drains coupled of said fourth and fifth MOS transistors; wherein a transconductance of said first differential pair is compensated in nonlinearity by said output current of said squarer.

17. A differential amplifier circuit comprising:

a pair of input terminals to which a signal to be amplified is applied;

a first differential pair formed of first and second MOS transistors, said first and second MOS transistors being equal in gate-width to gate-length ratio to each other;

gates of said first and second MOS transistors of said first differential pair being applied with a first input signal, said first input signal being proportional in amplitude to said signal to be amplified;

a divider circuit which receives said signal to be amplified and produces a second input signal which is different in amplitude from said signal to be amplified;

a squarer for driving said first differential pair by an output current of said squarer;

said squarer being formed of a second differential pair of third and fourth MOS transistors and a third differential pair of fifth and sixth MOS transistors;

said third and fourth MOS transistors being equal in gate-width to gate-length ratio to each other and said fifth and sixth MOS transistors being equal in gate-width to gate-length ratio to each other;

gates of said third and sixth MOS transistors being applied with said second input signal, said second input signal being proportional in amplitude to said signal to be amplified;

a gate of said fourth MOS transistor being applied with said second input signal together with a first offset voltage and a gate of said fifth MOS transistor being applied with said second input signal together with a second offset voltage;

drains of said third and sixth MOS transistors being coupled together and drains of said fourth and fifth MOS transistors being coupled together; and said output current of said squarer being derived from one of said drains coupled of said third and sixth MOS transistors and said drains coupled of said fourth and fifth MOS transistors;

wherein a transconductance of said first differential pair is compensated in nonlinearity by said output current of said squarer.

18. A differential amplifier circuit comprising:

a pair of input terminals to which a signal to be amplified is applied;

a divider circuit which receives said signal to be amplified and produces a first input signal which is different in amplitude from said signal to be amplified;

a first differential pair formed of first and second MOS transistors, said first and second MOS transistors being equal in gate-width to gate-length ratio to each other;

gates of said first and second MOS transistors of said first differential pair being applied with said first input signal, said first input signal being proportional in amplitude to said signal to be amplified;

a quadritail circuit for driving said first differential pair by an output current of said quadritail circuit;

said quadritail circuit being formed of a second differential pair of third and fourth MOS transistors and a third differential pair of fifth an sixth MOS transistors;

said third and fourth MOS transistors being equal in gate-width to gate-length ratio to each other and said fifth and sixth MOS transistors being equal in gate-width to gate-length ratio to each other;

gates of said third and fourth MOS transistors being applied with a second input signal, said second input signal being proportional in amplitude to said signal to be amplified;

gates of said fifth and sixth MOS transistors being applied with a middle point voltage of said second input signal;

drains of said third and fourth MOS transistors being coupled together and drains of said fifth and sixth MOS transistors being coupled together; and said output current of said quadritail circuit being derived from one of said drains coupled of said third and fourth MOS transistors and said drains coupled of said fifth and sixth MOS transistors;

wherein a transconductance of said first differential pair is compensated in nonlinearity by said output current of said quadritail circuit.

19. A differential amplifier circuit comprising:

a pair of input terminals to which a signal to be amplified is applied;

a divider circuit which receives said signal to be amplified and produces a first input signal which is different in amplitude from said signal to be amplified;

a first differential pair formed of first and second MOS transistors, said first and second MOS transistors being equal in gate-width to gate-length ratio to each other;

gates of said first and second MOS transistors of said first differential pair being applied with said first input signal, said first input signal being proportional in amplitude to said signal to be amplified;

a squarer for driving said first differential pair by an output current of said squarer;

said squarer being formed of a second differential pair of third and fourth MOS transistors and a third differential pair of fifth and sixth MOS transistors;

said third and fourth MOS transistors being different in gate-width to gate-length ratio from each other and said fifth and sixth MOS transistors being different in gate-width to gate-length ratio from each other;

gates of said third and fifth MOS transistors and gates of said fourth and sixth MOS transistors being coupled together to be applied with a second input signal, said second input signal being proportional in amplitude to said signal to be amplified;

drains of said third and sixth MOS transistors being coupled together and drains of said fourth and fifth MOS transistors being coupled together; and said output current of said squarer being derived from one of said drains coupled of said third and sixth MOS transistors and said drains coupled of said fourth and fifth MOS transistors;

wherein a transconductance of said first differential pair is compensated in nonlinearity by said output current of said squarer.

20. A differential amplifier circuit comprising:

a pair of input terminals to which a signal to be amplified is applied;

a divider circuit which receives said signal to be amplified and produces a first input signal which is different in amplitude from said signal to be amplified;

a first differential pair formed of first and second MOS transistors, said first and second MOS transistors being equal in gate-width to gate-length ratio to each other;

gates of said first and second MOS transistors of said first differential pair being applied with said first input signal, said first input signal being proportional in amplitude to said signal to be amplified;

a squarer for driving said first differential pair by an output current of said squarer;

said squarer being formed of a second differential pair of third and fourth MOS transistors and a third differential pair of fifth and sixth MOS transistors;

said third and fourth MOS transistors being equal in gate-width to gate-length ratio to each other and said fifth and sixth MOS transistors being equal in gate-width to gate-length ratio to each other;

gates of said third and sixth MOS transistors being applied with a second input signal, said second input signal being proportional in amplitude to said signal to be amplified;

a gate of said fourth MOS transistor being applied with said second input signal together with a first offset voltage and a gate of said fifth MOS transistor being applied with said second input signal together with a second offset voltage;

drains of said third and sixth MOS transistors being coupled together and drains of said fourth and fifth MOS transistors being coupled together; and said output current of said squarer being derived from one of said drains coupled of said third and sixth MOS transistors and said drains coupled of said fourth and fifth MOS transistors;

wherein a transconductance of said first differential pair is compensated in nonlinearity by said output current of said squarer.

* * * * *

UNITED STATES PATENT AND TRADEMARK OFFICE
CERTIFICATE OF CORRECTION

PATENT NO.   : 5,481,224
DATED        : January 2, 1996
INVENTOR(S)  : Katsuji KIMURA It is certified that error(s) appears in the above-identified patent and that said Letters Patent is hereby corrected as shown below:

Col. 12, line 39, delete "pail", insert --pair--.

Signed and Sealed this

Ninth Day of July, 1996

Attest:

BRUCE LEHMAN

Attesting Officer        Commissioner of Patents and Trademarks